US012638624B2

(12) United States Patent  
Lim

(10) Patent No.: US 12,638,624 B2  
(45) Date of Patent: May 26, 2026

(54) COLOR CONVERSION SUBSTRATE AND METHOD OF MANUFACTURING DISPLAY DEVICE INCLUDING THE SAME

(71) Applicant: Samsung Display Co., LTD., Yongin-si (KR)

(72) Inventor: Sanghyung Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 348 days.

(21) Appl. No.: 18/362,674

(22) Filed: Jul. 31, 2023

(65) Prior Publication Data

US 2024/0094448 A1 Mar. 21, 2024

(30) Foreign Application Priority Data

Sep. 15, 2022 (KR) ........................ 10-2022-0115990

(51) Int. Cl.  
*G02B 5/20* (2006.01)  
*H10K 59/38* (2023.01)

(52) U.S. Cl.  
CPC ............. *G02B 5/201* (2013.01); *H10K 59/38* (2023.02)

(58) Field of Classification Search  
CPC .. G02B 5/201; H10H 29/142; H10H 20/8514; H10H 20/0361; H10K 50/844; H10K 59/122  
See application file for complete search history.

(56) References Cited

U.S. PATENT DOCUMENTS

| | | | |
|---|---|---|---|
| 2003/0001992 A1 | 1/2003 | Kawase et al. | |
| 2018/0045866 A1* | 2/2018 | Chae | G02F 1/133553 |
| 2020/0089047 A1* | 3/2020 | Baek | G02F 1/133512 |
| 2020/0185638 A1* | 6/2020 | Choi | H10K 59/38 |
| 2020/0217998 A1* | 7/2020 | Jung | H10K 59/38 |
| 2020/0258945 A1* | 8/2020 | Joo | H10D 30/6723 |
| 2020/0273929 A1 | 8/2020 | Kim et al. | |
| 2020/0274089 A1* | 8/2020 | Son | H10K 59/8792 |
| 2020/0303465 A1* | 9/2020 | Joo | H10K 59/38 |
| 2021/0013455 A1* | 1/2021 | Bae | H10K 59/38 |
| 2021/0050388 A1 | 2/2021 | Song | |

(Continued)

FOREIGN PATENT DOCUMENTS

| | | | | | |
|---|---|---|---|---|---|
| CN | 104617031 A | * | 5/2015 | .......... | G02F 1/1333 |
| KR | 10-2003-0003078 A | | 1/2003 | | |

(Continued)

OTHER PUBLICATIONS

Qu, English translation for CN-104617031-A (Year: 2015).*  
Lee, English translation for KR-20180036220-A (Year: 2018).*

*Primary Examiner* — Jonathan Y Jung  
(74) *Attorney, Agent, or Firm* — Womble Bond Dickinson (US) LLP

(57) ABSTRACT

A color conversion substrate includes: a substrate including light emitting areas, and a peripheral area surrounding the light emitting areas; a partition layer on the substrate, and having a plurality of pixel openings defined in the light emitting areas, respectively, and a sub-opening defined in the peripheral area and around the pixel openings; color filter patterns in the pixel openings, respectively; low refractive patterns in the pixel openings, and on the color filter patterns, respectively; and color conversion patterns in the pixel openings, and on the low refractive patterns, respectively.

36 Claims, 44 Drawing Sheets

(56) References Cited

U.S. PATENT DOCUMENTS

| | | | |
|---|---|---|---|
| 2021/0241719 A1* | 8/2021 | Choi | H04N 23/57 |
| 2022/0102433 A1 | 3/2022 | Kim et al. | |
| 2022/0199694 A1* | 6/2022 | Bae | H01L 25/0753 |
| 2022/0231087 A1 | 7/2022 | Jeon et al. | |
| 2024/0061329 A1* | 2/2024 | Noguchi | C08G 77/46 |
| 2024/0268181 A1* | 8/2024 | Zhao | G02B 5/208 |

FOREIGN PATENT DOCUMENTS

| | | | | |
|---|---|---|---|---|
| KR | 20180036220 A | * | 4/2018 | H01L 51/5218 |
| KR | 10-2020-0086413 A | | 7/2020 | |
| KR | 10-2020-0104974 A | | 9/2020 | |
| KR | 10-2021-0008265 A | | 1/2021 | |
| KR | 10-2021-0021216 A | | 2/2021 | |
| KR | 10-2021-0116730 A | | 9/2021 | |
| KR | 10-2022-0043974 A | | 4/2022 | |
| KR | 10-2022-0105253 A | | 7/2022 | |

* cited by examiner

POP:POP1,POP2,POP3

F I G. 5
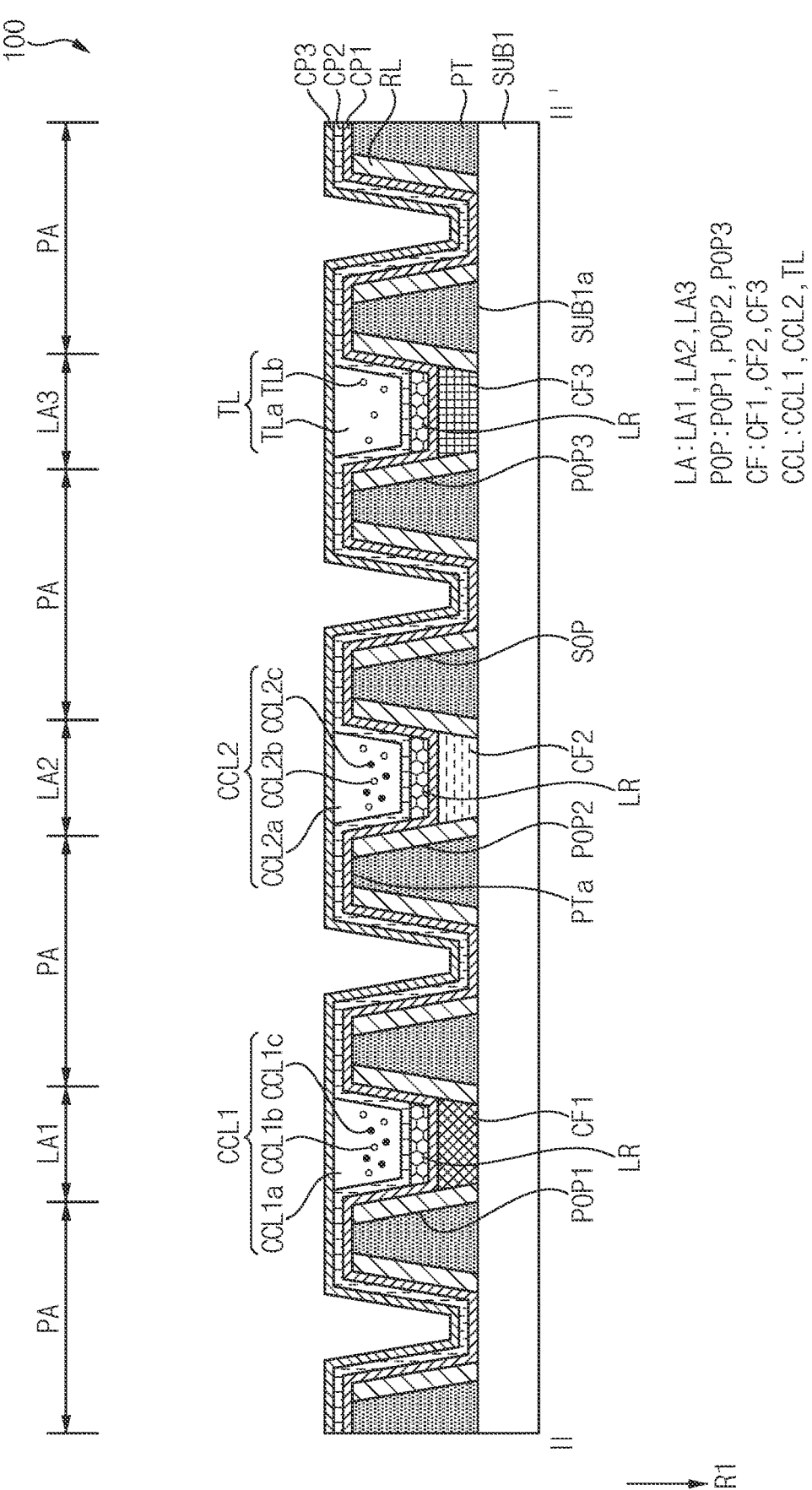

FIG. 8

LA : LA1, LA2, LA3
POP : POP1, POP2, POP3
CF : CF1, CF2, CF3
CCL : CCL1, CCL2, TL

F I G. 1 1
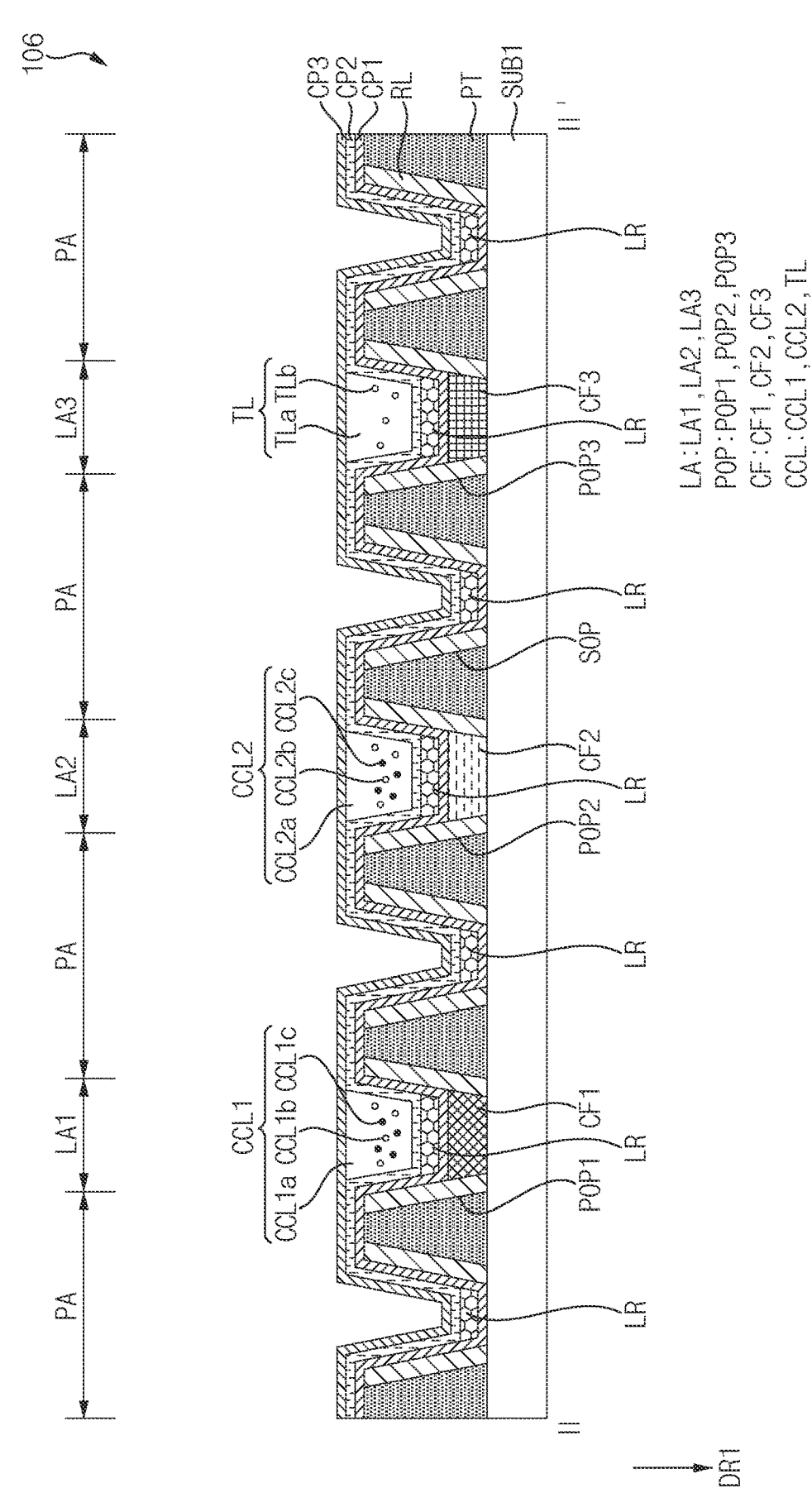

LA:LA1,LA2,LA3
POP:POP1,POP2,POP3
CF:CF1,CF2,CF3
CCL:CCL1,CCL2,TL

FIG. 14
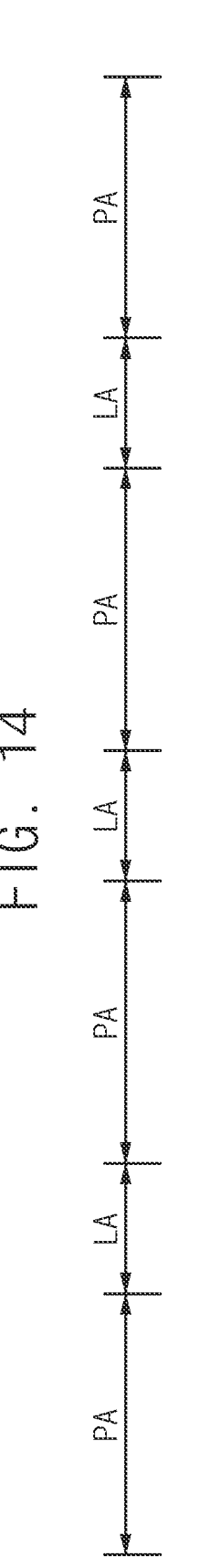
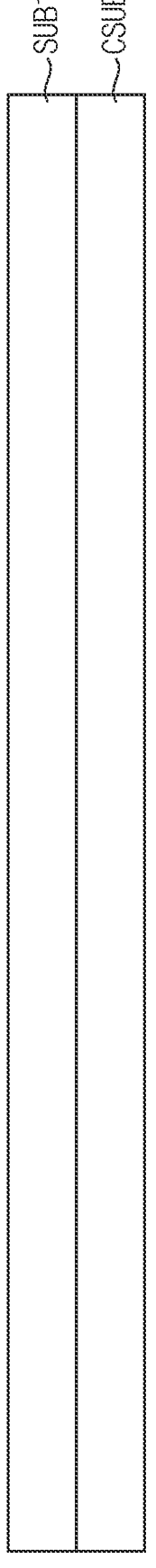

CF:CF1,CF2,CF3

CF:CF1,CF2,CF3

F I G. 24
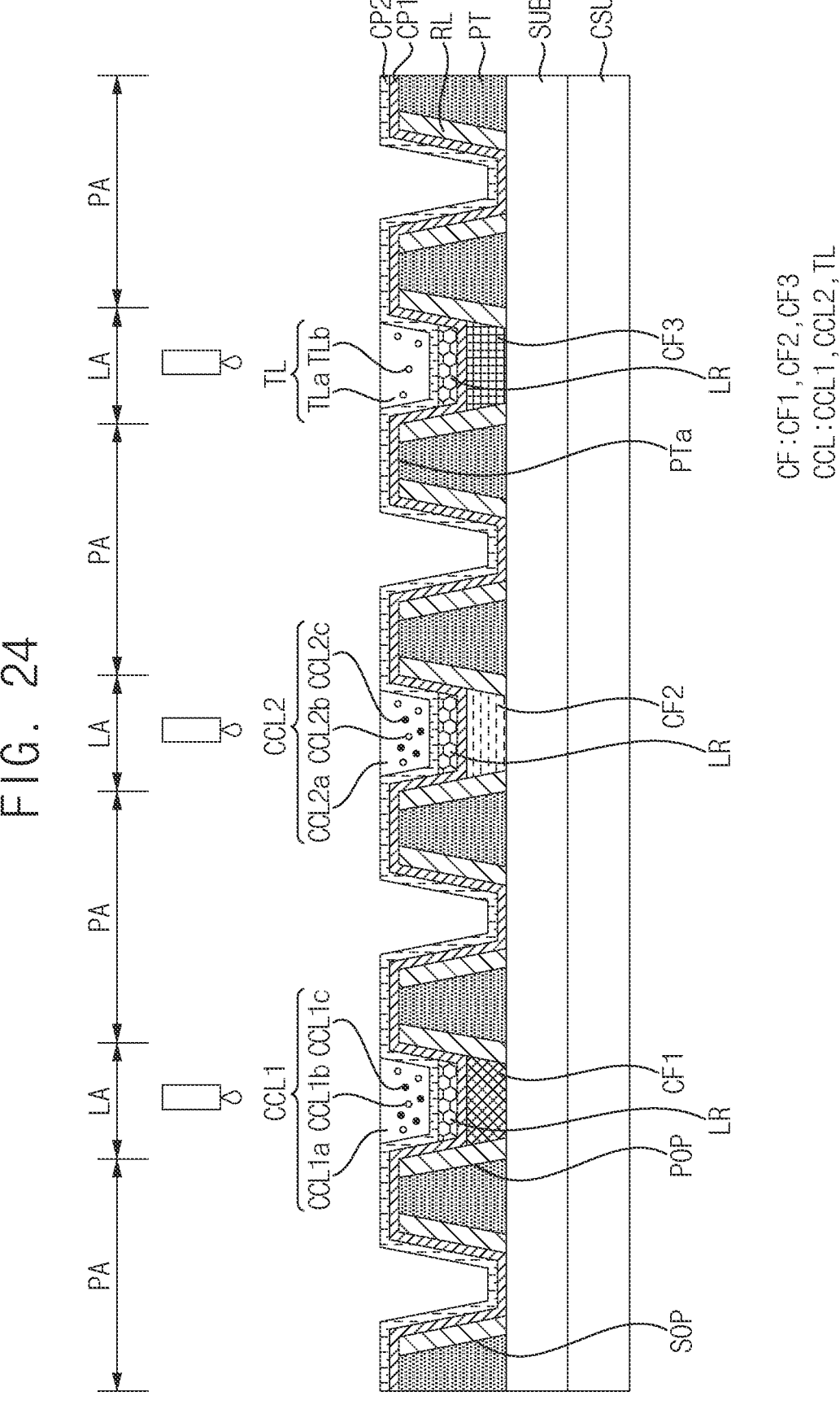

F I G. 25
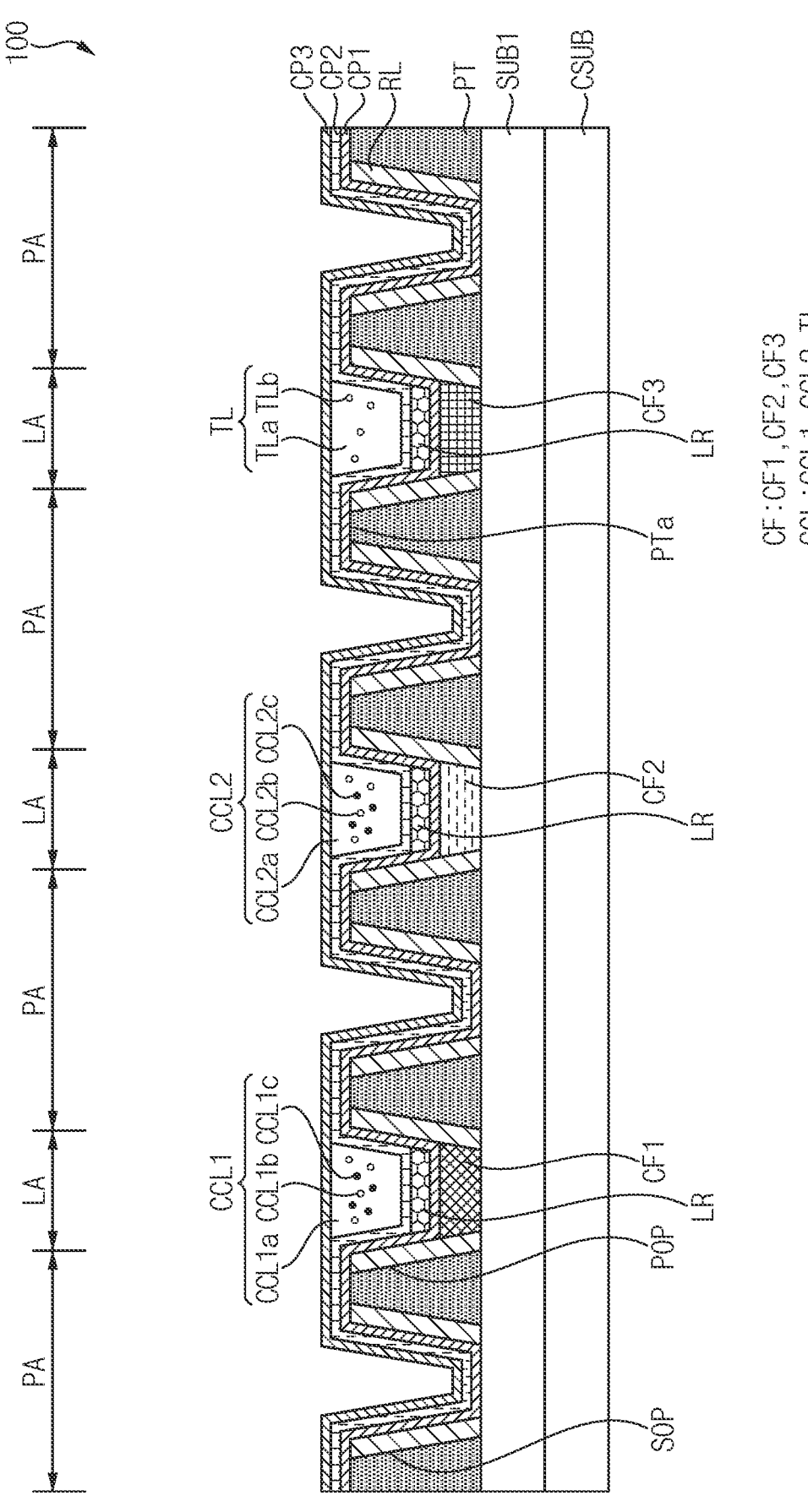
CF: CF1, CF2, CF3
CCL: CCL1, CCL2, TL

CF : CF1, CF2, CF3
CCL : CCL1, CCL2, TL

CF : CF1, CF2, CF3
CCL : CCL1, CCL2, TL

CF : CF1 , CF2 , CF3
CCL : CCL1 , CCL2 , TL

FIG. 33
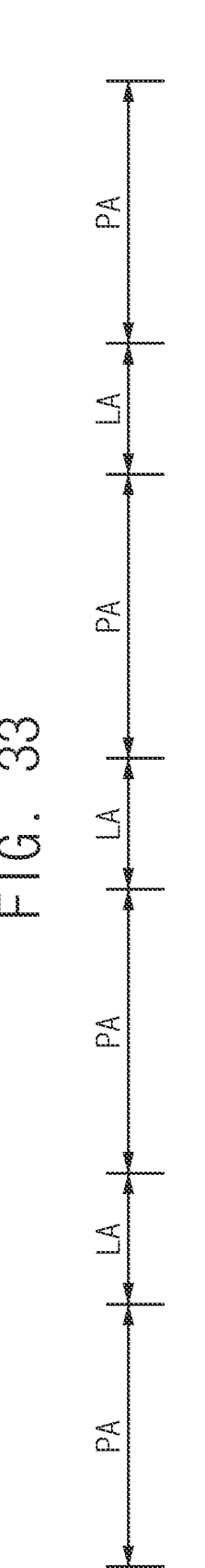
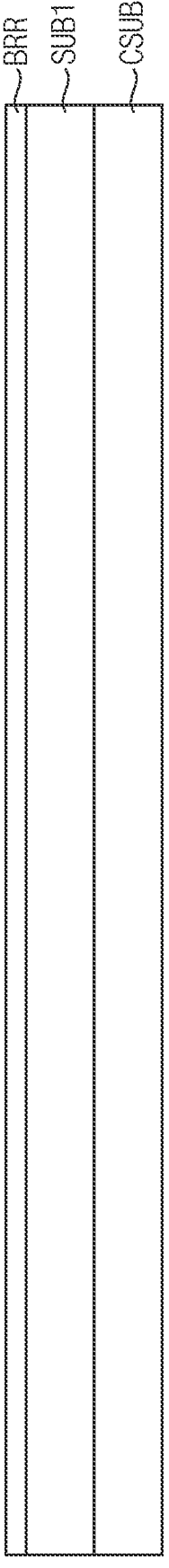

FIG. 34

CF:CF1,CF2,CF3
CCL:CCL1,CCL2,TL

COLOR CONVERSION SUBSTRATE AND METHOD OF MANUFACTURING DISPLAY DEVICE INCLUDING THE SAME

CROSS-REFERENCE TO RELATED APPLICATION(S)

This application claims priority to and the benefit of Korean Patent Application No. 10-2022-0115990, filed on Sep. 15, 2022, in the Korean Intellectual Property Office (KIPO), the entire disclosure of which is incorporated by reference herein.

BACKGROUND

1. Field

Aspects of embodiments of the present disclosure relate to a display device. More particularly, aspects of embodiments of the present disclosure relate to a color conversion substrate, a display device including the color conversion substrate, and a method of manufacturing the display device including the color conversion substrate.

2. Description of the Related Art

A display device is a device that displays images to provide visual information to a user. Representative examples of such a display device include a liquid crystal display device and an organic light emitting display device.

Recently, in order to improve a display quality, a display device has been proposed that includes a display substrate including a plurality of pixels, and a color conversion substrate including a color filter layer and a color conversion layer. The color conversion layer may convert a wavelength of light provided from the display substrate.

The above information disclosed in this Background section is for enhancement of understanding of the background of the present disclosure, and therefore, it may contain information that does not constitute prior art.

SUMMARY

A display device including a color conversion layer may emit light having a color different from that of incident light. For example, the color conversion layer may include wavelength conversion particles, such as quantum dots.

Embodiments of the present disclosure are directed to a color conversion substrate having improved light efficiency.

Embodiments of the present disclosure are directed to a method of manufacturing a display device having improved reliability.

According to one or more embodiments of the present disclosure, a color conversion substrate includes: a substrate including light emitting areas, and a peripheral area surrounding the light emitting areas; a partition layer on the substrate, and having a plurality of pixel openings defined in the light emitting areas, respectively, and a sub-opening defined in the peripheral area and around the pixel openings; color filter patterns in the pixel openings, respectively; low refractive patterns in the pixel openings, and on the color filter patterns, respectively; and color conversion patterns in the pixel openings, and on the low refractive patterns, respectively.

In an embodiment, the low refractive patterns may be spaced from each other.

In an embodiment, in a plan view, the low refractive patterns may be spaced from the sub-opening.

In an embodiment, a low refractive pattern from among the low refractive patterns may be in the sub-opening.

In an embodiment, the color filter patterns may be spaced from each other, and in a plan view, the color filter patterns may be spaced from the sub-opening.

In an embodiment, the pixel openings may expose an upper surface of the substrate.

In an embodiment, the color conversion substrate may further include a reflective layer on the partition layer in the peripheral area.

In an embodiment, the reflective layer may include a metal.

In an embodiment, the reflective layer may be on a side surface of the partition layer adjacent to the pixel openings and the sub-opening, and in a plan view, the reflective layer may be spaced from an upper surface of the partition layer.

In an embodiment, the reflective layer may be on a side surface of the partition layer adjacent to the pixel openings and the sub-opening, and on an upper surface of the partition layer.

In an embodiment, the substrate may include a transparent polyimide or a transparent acrylic resin.

In an embodiment, the partition layer may include polyimide.

In an embodiment, the partition layer may further include a black pigment.

In an embodiment, in a plan view, areas of the pixel openings may be equal to each other, and depths of the pixel openings may be different from each other.

In an embodiment, in a plan view, areas of the pixel openings may be different from each other, and depths of the pixel openings may be equal to each other.

In an embodiment, the color conversion substrate may further include a barrier layer between the substrate and the partition layer.

In an embodiment, the barrier layer may include silicon oxide or indium tin oxide.

In an embodiment, the color conversion substrate may further include a capping layer on the color conversion patterns and the partition layer, and located in the light emitting areas and the peripheral area.

In an embodiment, a length from an upper surface of the substrate to an upper surface of the capping layer overlapping with the light emitting areas may be less than a length from the upper surface of the substrate to the upper surface of the capping layer overlapping with an upper surface of the partition layer.

According to one or more embodiments of the present disclosure, a color conversion substrate includes: a partition layer including: light emitting areas; a peripheral area surrounding the light emitting areas; a plurality of pixel openings defined in the light emitting areas, respectively; and a sub-opening defined in the peripheral area, and around the pixel openings; a reflective layer on the partition layer in the peripheral area; color filter patterns in the pixel openings, respectively; low refractive patterns in the pixel openings on the color filter patterns, respectively; and color conversion patterns in the pixel openings on the low refractive patterns, respectively.

In an embodiment, the color conversion substrate may further include a barrier layer under the partition layer, and including a transparent silicon oxide or a transparent indium tin oxide.

In an embodiment, the pixel openings may expose an upper surface of the barrier layer.

In an embodiment, the partition layer may include polyimide including a black pigment.

According to one or more embodiments of the present disclosure, a method of manufacturing a display device, includes: forming a first substrate on a carrier substrate, the first substrate including light emitting areas, and a peripheral area surrounding the light emitting areas; forming a preliminary partition layer on the first substrate; forming a partition layer having pixel openings overlapping with the light emitting areas, respectively, and a sub-opening overlapping with the peripheral area and disposed around the pixel openings, in the preliminary partition layer; forming color filter patterns in the pixel openings, respectively; forming low refractive patterns in the pixel openings on the color filter patterns, respectively; and forming color conversion patterns in the pixel openings on the low refractive patterns, respectively.

In an embodiment, the preliminary partition layer may be formed of polyimide, and the partition layer may be formed by exposing a portion of the preliminary partition layer, and developing the exposed portion of the preliminary partition layer.

In an embodiment, each of the color filter patterns may be formed by an inkjet process.

In an embodiment, each of the low refractive patterns may be formed by an inkjet process.

In an embodiment, the method may further include forming a reflective layer on the partition layer in the peripheral area.

In an embodiment, the reflective layer may be formed by a dry etching process.

In an embodiment, the reflective layer may be formed on a side surface of the partition layer adjacent to the pixel openings and the sub-opening, and in a plan view, the reflective layer may be formed to be spaced from an upper surface of the partition layer.

In an embodiment, the forming of the reflective layer may include: forming a preliminary reflective layer on the partition layer; forming a photoresist pattern on the preliminary reflective layer in the peripheral area; and patterning the preliminary reflective layer using the photoresist pattern.

In an embodiment, the reflective layer may be formed on a side surface of the partition layer adjacent to the pixel openings and the sub-opening, and on an upper surface of the partition layer.

In an embodiment, the forming of the low refractive patterns may include: forming a preliminary low refractive layer on the partition layer; and scribing the preliminary low refractive layer overlapping with an upper surface of the partition layer overlapping with the peripheral area.

In an embodiment, a low refractive pattern from among the low refractive patterns may be formed in the sub-opening.

In an embodiment, the method may further include: forming a display element layer on a second substrate; bonding the second substrate and the carrier substrate to each other; and detaching the carrier substrate from the first substrate.

In an embodiment, the method may further include forming a barrier layer on the first substrate before the forming of the preliminary partition layer.

In an embodiment, the pixel openings may be formed to expose an upper surface of the barrier layer.

According to one or more embodiments of the present disclosure, a display device may include the partition layer including pixel openings and sub-openings, and thus, the depth of each of the pixel openings may be controlled. In addition, because the color filter patterns, the low refractive patterns, and the color conversion patterns may be disposed in the pixel openings, respectively, materials used for forming each of the color filter patterns and the low refractive patterns may be reduced. In addition, because the low refractive patterns may be spaced apart from each other, penetration of oxygen, moisture, foreign substances, and the like through the low refractive patterns may be prevented or substantially prevented. Accordingly, reliability of the display device may be improved.

According to one or more embodiments of the present disclosure, because the first substrate may be formed of polyimide, the color conversion substrate may have relatively flexible characteristics.

According to one or more embodiments of the present disclosure, because the reflective layer may be disposed on the barrier layer, and may be disposed around the light emitting areas, the light efficiency of the display device may be increased.

BRIEF DESCRIPTION OF THE DRAWINGS

The above and other aspects and features of the present disclosure will be more clearly understood from the following detailed description of the illustrative, non-limiting embodiments with reference to the accompanying drawings.

FIG. 5 is a cross-sectional view taken along the line II-II' of FIG. 4.

FIG. 8 is a cross-sectional view taken along the line II-II' of FIG. 4.

FIG. 11 is a cross-sectional view taken along the line II-II' of FIG. 4.

FIGS. 14-28 are cross-sectional views illustrating a method of manufacturing a display device according to an embodiment.

FIGS. 33-38 are cross-sectional views illustrating a method of manufacturing a color conversion substrate according to an embodiment of the present disclosure.

DETAILED DESCRIPTION

Figure 1:
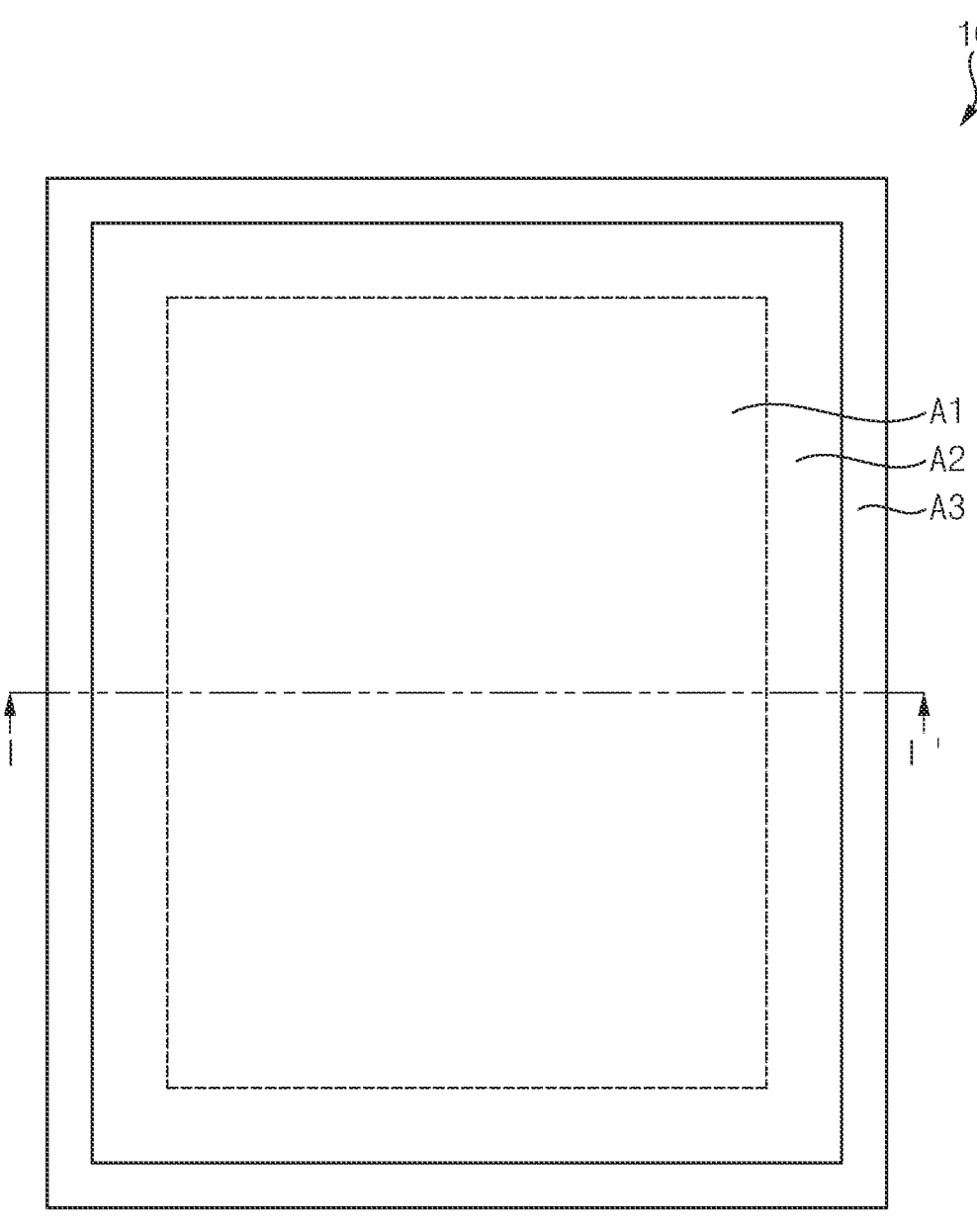
FIG. 1 is a plan view illustrating a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
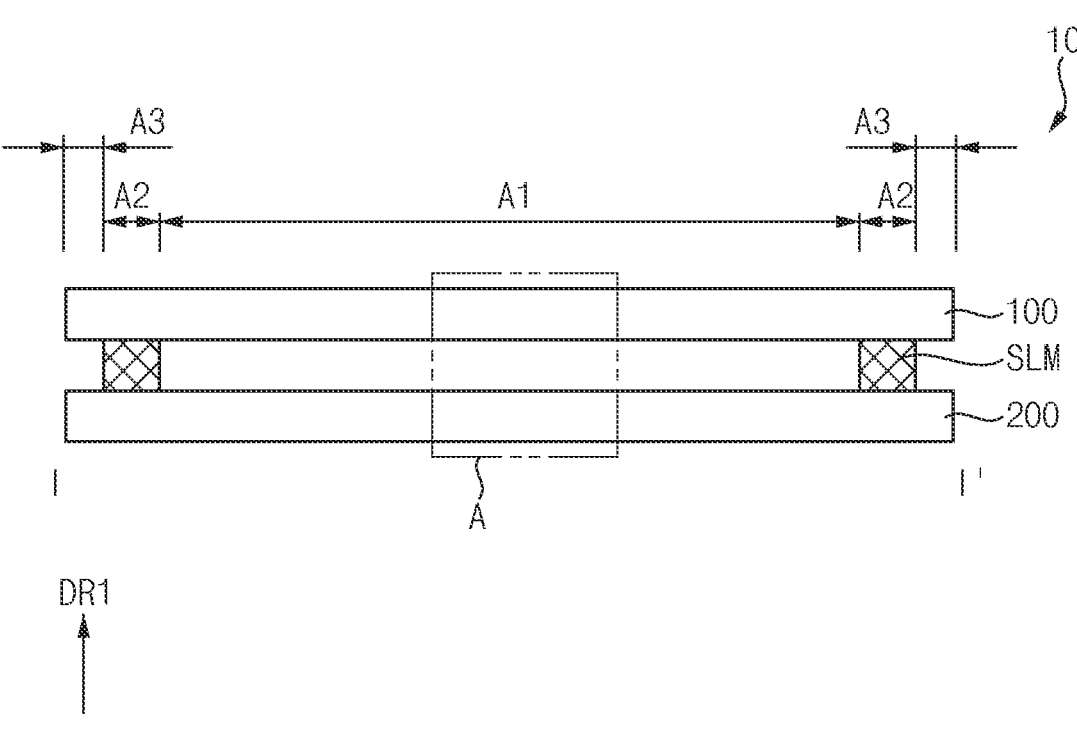
FIG. 2 is a cross-sectional view taken along the line I-I' of FIG. 1.

FIG. 1 is a plan view illustrating a display device according to an embodiment of the present disclosure. FIG. 2 is a cross-sectional view taken along the line I-I' of FIG. 1.

Referring to FIGS. 1 and 2, a display device 10 may include a color conversion substrate 100, a sealing member SLM, and an array substrate 200. The color conversion substrate 100 may face the array substrate 200. The color conversion substrate 100 may be positioned in a first direction DR1 from the array substrate 200. For example, the first direction DR1 may be a front direction of the display device 10 from the array substrate 200.

The sealing member SLM may be disposed between the array substrate 200 and the color conversion substrate 100. The sealing member SLM may connect (e.g., couple or attach) the array substrate 200 and the color conversion substrate 100 to each other.

The display device 10 may include a first area A1 where an image is displayed, a second area A2 surrounding (e.g., around a periphery of) the first area A1, and a third area A3 surrounding (e.g., around a periphery of) the second area A2. For example, the first area A1 may be a display area, and the second area A2 and the third area A3 may be non-display areas. In more detail, the second area A2 may be a sealing area, and the third area A3 may be an outer area.

Figure 3:
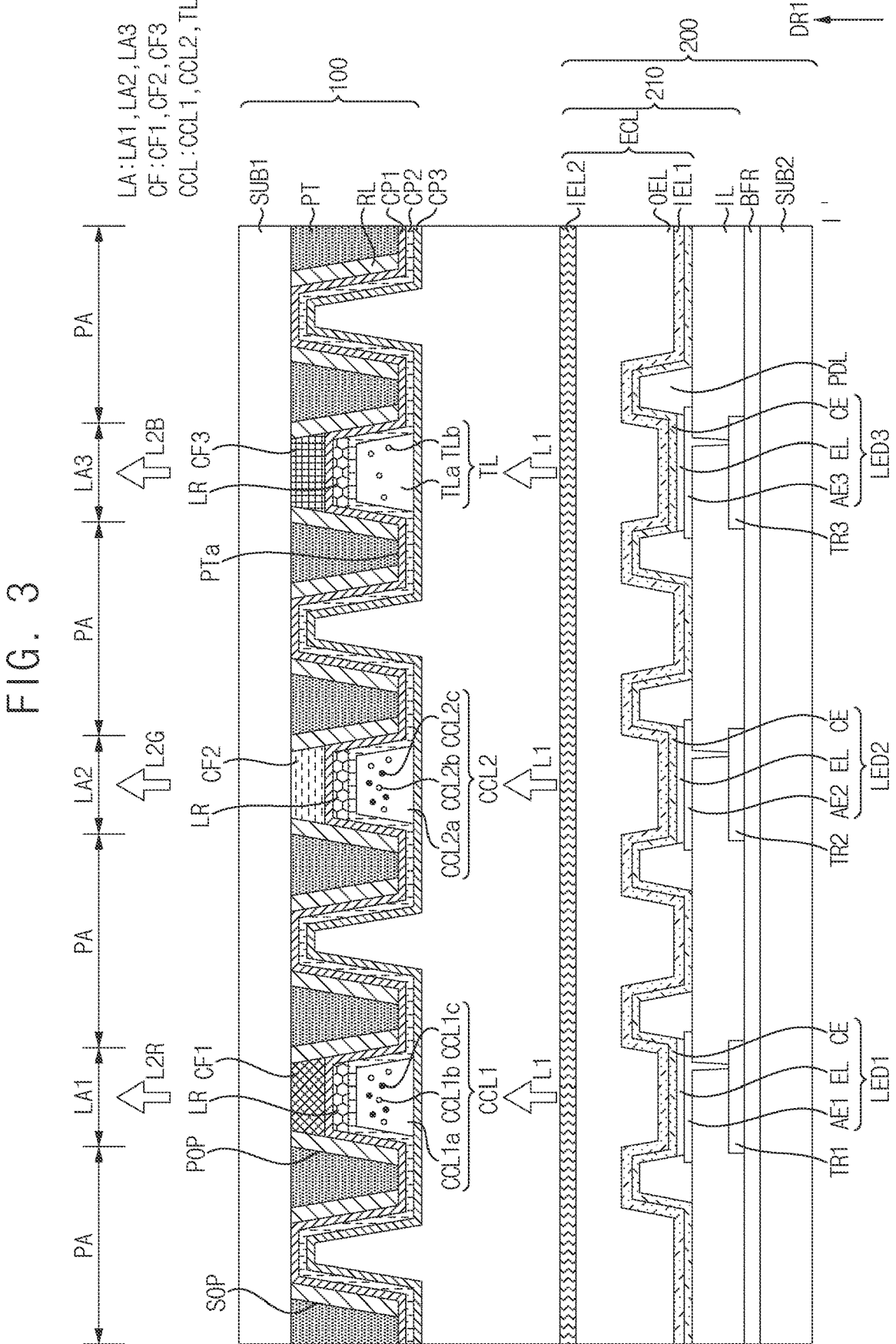
FIG. 3 is an enlarged cross-sectional view of the area A of FIG. 2.

The color conversion substrate 100 may include a color conversion layer (e.g., color conversion patterns CCL of FIG. 3). The color conversion layer may be disposed in the first area A1, and may convert a wavelength of light generated from the light emitting diode of the array substrate 200. The color conversion substrate 100 may further include a color filter layer (e.g., color filter patterns CF of FIG. 3) that transmit light of a desired color (e.g., a specific or predetermined color).

The array substrate 200 may include a plurality of pixels, and be referred to as a display substrate. The pixels may be disposed in the first area A1 of the array substrate 200. Each of the pixels may include a driving element and a light emitting diode. The driving element may include at least one thin film transistor. The light emitting device may generate light according to a driving signal. For example, the light emitting device may be an inorganic light emitting diode or an organic light emitting diode.

The sealing member SLM may be disposed between the array substrate 200 and the color conversion substrate 100, and may be disposed in the second area A2. For example, the sealing member SLM may be disposed in the second area A2 between the array substrate 200 and the color conversion substrate 100, so as to surround (e.g., around a periphery of) the first area A1 in a plan view.

For example, the sealing member SLM may have a hollow rectangular planar shape. However, the present disclosure is not limited thereto, and the sealing member SLM may have various suitable planar shapes depending on a planar shape of the array substrate 200 or the color conversion substrate 100. For example, when the array substrate 200 or the color conversion substrate 100 has a planar shape of a triangle, a rhombus, a polygon, a circle, or an ellipse, the sealing member SLM may have a planar shape of a hollow triangle, a hollow rhombus, a hollow polygon, a hollow circle, or a hollow ellipse.

A filling layer may be disposed between the array substrate 200 and the color conversion substrate 100. For example, the filling layer may act as a buffer against external pressure applied to the display device 10. For example, the filling layer may maintain or substantially maintain a gap between the array substrate 200 and the color conversion substrate 100. However, the present disclosure is not limited thereto.

FIG. 3 is an enlarged cross-sectional view of the area A of FIG. 2.

Referring to FIGS. 1 to 3, the first area A1 may include light emitting areas LA, and a peripheral area PA. Light L1 (hereinafter referred to as incident light) generated from the array substrate 200 and incident to the color conversion substrate 100 may be emitted to the outside through the light emitting area LA. The light emitting areas LA may include first to third light emitting areas LA1, LA2, and LA3 for emitting light of different colors from each other. For example, first transmitted light L2R having a red color may be emitted from the first light emitting area LA1, second transmitted light L2G having a green color may be emitted from the second light emitting area LA2, and third transmitted light L2B having a blue color may be emitted from the third light emitting area LA3.

In an embodiment, the first to third light emitting areas LA1, LA2, and LA3 may be spaced apart from each other in a plan view, and may be arranged to repeat along with each other. The peripheral area PA may surround (e.g., around peripheries of) the first to third light emitting areas LA1, LA2, and LA3 on a plane (e.g., in a plan view). For example, the peripheral area PA may have a grid shape in a plan view.

In an embodiment, the color conversion substrate 100 may include a first base substrate SUB1, a partition layer PT, a reflective layer RL, color filter patterns CF, a first capping layer CP1, low refractive patterns LR, a second capping layer CP2, color conversion patterns CCL, and a third capping layer CP3.

The color conversion substrate 100 will be described in more detail below with reference to FIGS. 4 and 5.

In an embodiment, the array substrate 200 may include a second base substrate SUB2, a buffer layer BFR, first to third driving elements TR1, TR2, and TR3, an insulation layer IL, a pixel defining layer PDL, first to third light emitting diodes LED1, LED2, and LED3, and an encapsulation layer ECL.

The second base substrate SUB2 may face the first base substrate SUB1. The second base substrate SUB2 may include the first area A1, the second area A2, and the third area A3, as the display device 10 includes the first area A1, the second area A2, and the third area A3.

The second base substrate SUB2 may be an insulating substrate formed of a transparent or opaque material. In an embodiment, the second base substrate SUB2 may include glass. In this case, the array substrate 200 may be a rigid display substrate. However, the present disclosure is not limited thereto, and in another embodiment, the second base substrate SUB2 may include plastic. In this case, the array substrate 200 may be a flexible display substrate.

The buffer layer BFR may be disposed on the second base substrate SUB2. The buffer layer BFR may prevent or substantially prevent impurities, such as oxygen and moisture, from diffusing onto the second base substrate SUB2 through the second base substrate SUB2. The buffer layer BFR may include an inorganic material, such as a silicon compound or a metal oxide. The buffer layer BFR may have a single-layer structure, or a multi-layered structure including a plurality of insulation layers.

The first to third driving elements TR1, TR2, and TR3 may be disposed in the first area A1 on the buffer layer BFR. Each of the first to third driving elements TR1, TR2, and TR3 may include at least one thin film transistor. The channel layer of the thin film transistor may include an oxide semiconductor, a silicon semiconductor, or an organic semiconductor. For example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), or zinc (Zn). The silicon semiconductor may include amorphous silicon, polycrystalline silicon, and/or the like.

The insulation layer IL may cover the first to third driving elements TR1, TR2, and TR3. The insulation layer IL may include a combination of an inorganic insulation layer and an organic insulation layer.

The first to third light emitting diodes LED1, LED2, and LED3 may be disposed on the insulation layer IL. For example, first to third pixel electrodes AE1, AE2, and AE3 may be disposed on the insulation layer IL. Each of the first to third pixel electrodes AE1, AE2, and AE3 may include a conductive material, such as a metal, an alloy, a conductive metal nitride, a conductive metal oxide, or a transparent conductive material. Each of the first to third pixel electrodes AE1, AE2, and AE3 may have a single-layer structure, or a multi-layered structure including a plurality of conductive layers.

The first to third pixel electrodes AE1, AE2, and AE3 may be electrically connected to the first to third driving elements TR1, TR2, and TR3 through contact holes formed in (e.g., penetrating) the insulation layer IL, respectively.

The pixel defining layer PDL may be disposed on the first to third pixel electrodes AE1, AE2, and AE3. The pixel defining layer PDL may include an organic material. The pixel defining layer PDL may define an opening exposing at least a portion of each of the first to third pixel electrodes AE1, AE2, and AE3.

The light emitting layer EL may be disposed on the first to third pixel electrodes AE1, AE2, and AE3 that are exposed by the opening of the pixel defining layer PDL. In an embodiment, the light emitting layer EL may continuously or substantially continuously extend over a plurality of pixels on the first area A1. In another embodiment, the light emitting layer EL may be spaced apart (e.g., may be separated) from the light emitting layer of an adjacent pixel.

The light emitting layer EL may include at least one of an organic light emitting material or quantum dots. In an embodiment, the light emitting layer EL may generate blue light. However, the present disclosure is not limited thereto. In another embodiment, the light emitting layer EL may generate red light or green light, or may generate light having different colors according to the pixels.

For example, all of the light emitting layers EL may include an organic material for emitting blue light. In this case, the light emitting layer EL may be formed in multiple layers, and may have a structure in which a plurality of blue organic light emitting layers are stacked. For example, the light emitting layer EL may have a structure in which three blue organic light emitting layers are stacked.

However, the present disclosure is not limited thereto, and the light emitting layer EL may have a structure in which a plurality of blue organic light emitting layers and an organic light emitting layer for emitting light of different colors are stacked. For example, the light emitting layer EL may have a structure in which three blue organic light emitting layers and one green organic light emitting layer are stacked. In an embodiment, various suitable functional layers, such as a hole injection layer, a hole transport layer, an electron transport layer, and/or an electron injection layer, may be disposed above and/or below the light emitting layer EL.

A common electrode CE may be disposed on the light emitting layer EL. The common electrode CE may include a conductive material, such as a metal, an alloy, a conductive metal nitride, a conductive metal oxide, or a transparent conductive material. The common electrode CE may have a single-layer structure, or a multi-layered structure including a plurality of conductive layers. In an embodiment, the common electrode CE may continuously or substantially continuously extend on the first area A1 over a plurality of pixels.

The first pixel electrode AE1, the light emitting layer EL, and the common electrode CE may form the first light emitting diode LED1. The second pixel electrode AE2, the light emitting layer EL, and the common electrode CE may form the second light emitting diode LED2. The third pixel electrode AE3, the light emitting layer EL, and the common electrode CE may form the third light emitting diode LED3.

The encapsulation layer ECL may be disposed on the common electrode CE. The encapsulation layer ECL may include at least one inorganic encapsulation layer, and at least one organic encapsulation layer. In an embodiment, the encapsulation layer ECL may include a first inorganic encapsulation layer IEL1 disposed on the common electrode CE, an organic encapsulation layer OEL disposed on the first inorganic encapsulation layer IEL1, and a second inorganic encapsulation layer IEL2 disposed on the organic encapsulation layer OEL.

Figure 4:
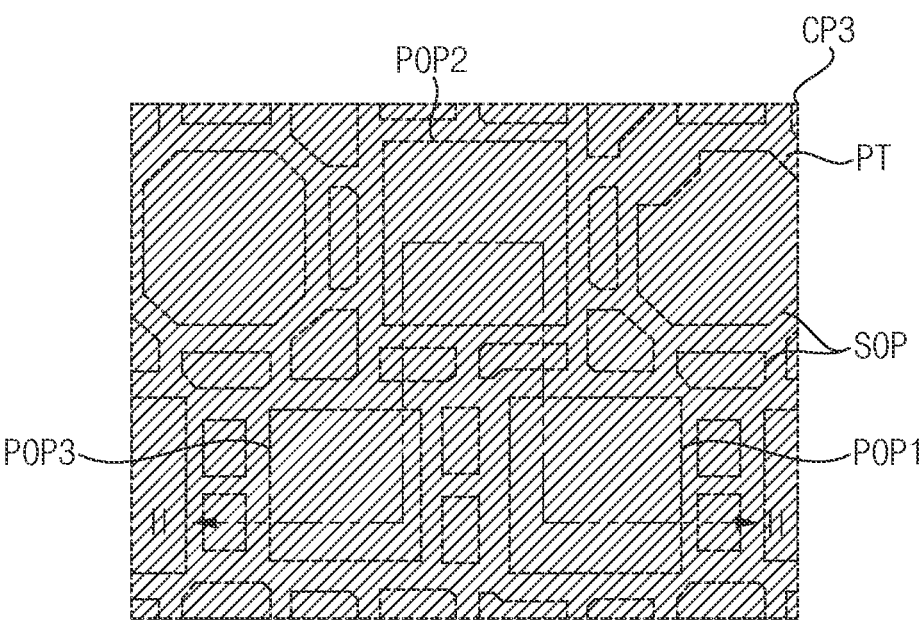
FIG. 4 is a plan view illustrating the color conversion substrate of FIG. 2.

FIG. 4 is a plan view illustrating the color conversion substrate of FIG. 2. FIG. 5 is a cross-sectional view taken along the line II-II' of FIG. 4.

For example, a color conversion substrate 100 of FIG. 5 may be the color conversion substrate 100 of FIG. 3 that is turned over. Accordingly, the first direction DR1 may face downward in FIG. 5.

Referring further to FIGS. 4 and 5, in an embodiment, the color conversion substrate 100 may include a first base substrate SUB1, a partition layer PT, a reflective layer RL, color filter patterns CF, a first capping layer CP1, low refractive patterns LR, a second capping layer CP2, color conversion patterns CCL, and a third capping layer CP3.

The first base substrate SUB1 may include the first area A1, the second area A2, and the third area A3, as the display device 10 includes the first area A1, the second area A2, and the third area A3 as described above. In addition, as the first area A1 includes the light emitting areas LA and the peripheral area PA, the first base substrate SUB1 may include the light emitting areas LA and the peripheral area PA.

In an embodiment, the first base substrate SUB1 may include a transparent material. The first base substrate SUB1 may include a transparent polyimide or a transparent acrylic resin. Accordingly, the first transmitted light L2R, the second transmitted light L2G, and the third transmitted light L2B may be emitted through the first base substrate SUB1.

In an embodiment, the partition layer PT may be disposed on the first base substrate SUB1. The partition layer PT may include pixel openings POP and sub-openings SOP. The pixel openings POP may be defined in the light emitting areas LA, respectively. For example, a first pixel opening POP1 may be defined in the first light emitting area LA1, a second pixel opening POP2 may be defined in the second light emitting area LA2, and a third pixel opening POP3 may be defined in the third light emitting area LA3.

Areas of the pixel openings POP may be different from each other in a plan view. In other words, the area of each of the pixel openings POP may be formed to be different from one another according to a light emitting efficiency of each of the pixel openings POP. For example, the second pixel opening POP2 may be larger than the first pixel opening POP1 and the third pixel opening POP3. An area of the first pixel opening POP1 may be greater than an area of the third pixel opening POP3. Also, in this case, depths of the pixel openings POP may be the same or substantially the same as each other. However, the present disclosure is not limited thereto.

The pixel openings POP may expose an upper surface SUB1a of the first base substrate SUB1. Accordingly, the first transmitted light L2R, the second transmitted light L2G, and the third transmitted light L2B emitted from the light emitting areas LA may be emitted through the pixel openings POP and the first base substrate SUB1.

The sub-openings SOP may be defined in the peripheral area PA. The sub-openings SOP may be disposed around each of the pixel openings POP.

The partition layer PT may entirely overlap with the peripheral area PA, and may have a grid shape in a plan view.

However, the present disclosure is not limited thereto, and the pixel openings POP and the sub-openings SOP may be defined in a groove shape without penetrating through the partition layer PT. Therefore, in this case, the pixel openings POP and the sub-openings SOP may not expose the upper surface SUB1a of the first base substrate SUB1.

In an embodiment, the partition layer PT may include polyimide. The partition layer PT may include a light-blocking material, such as a black pigment, dye, or carbon black. For example, the partition layer PT may include polyimide further including a black pigment. When the partition layer PT further includes a black pigment, the partition layer PT may function as a light blocking member. Accordingly, color mixing between the adjacent first to third light emitting areas LA1, LA2, and LA3 may be prevented or substantially prevented due to the partition layer PT. However, the present disclosure is not limited thereto, and the partition layer PT may include yellow polyimide or a transparent polyimide.

The reflective layer RL may be disposed on the partition layer PT. The reflective layer RL may be partially disposed in the peripheral area PA. For example, the reflective layer RL may be disposed on a side surface of the partition layer PT adjacent to the pixel openings POP and the sub-openings SOP. The reflective layer RL may be spaced apart from the upper surface PTa of the partition layer PT in a plan view. In other words, the reflective layer RL may be disposed only on the side surface of the partition layer PT overlapping with the peripheral area PA.

The reflective layer RL may include a metal. Because the reflective layer RL is disposed on the partition layer PT to reflect light, the light emitting efficiency of the color conversion substrate 100 may be improved. Also, the reflective layer RL may serve as a light blocking member. Accordingly, color mixing between the adjacent first to third light emitting areas LA1, LA2, and LA3 may be prevented or substantially prevented due to the reflective layer RL.

The color filter patterns CF may be disposed on the partition layer PT and the first base substrate SUB1. The color filter patterns CF may include a plurality of color filter patterns CF1, CF2, and CF3. For example, the color filter patterns CF may include a first color filter pattern CF1, a second color filter pattern CF2, and a third color filter pattern CF3.

In an embodiment, the color filter patterns CF may be disposed in the pixel openings POP, respectively. Accordingly, the color filter patterns CF may be spaced apart from each other. In other words, each of the color filter patterns CF may have an island shape. Also, in a plan view, the color filter patterns CF may be spaced apart from the sub-openings SOP.

The first color filter pattern CF1 may overlap with the first light emitting area LA1 to selectively transmit red light. The second color filter pattern CF2 may overlap with the second light emitting area LA2 to selectively transmit green light.

The third color filter pattern CF3 may overlap with the third light emitting area LA3 to selectively transmit blue light. However, the present disclosure is not limited thereto.

The first capping layer CP1 may be disposed on the color filter patterns CF and the reflective layer RL. The first capping layer CP1 may be entirely disposed on the light emitting areas LA and the peripheral area PA. The first capping layer CP1 may cover the color filter patterns CF and the reflective layer RL. For example, the first capping layer CP1 may include an inorganic material. The first capping layer CP1 may protect the color filter patterns CF from oxygen, moisture, foreign substances, and the like.

In an embodiment, the low refractive patterns LR may be disposed in the pixel openings POP, respectively. In other words, the low refractive patterns LR may be formed by an inkjet process. Accordingly, the low refractive patterns LR may be disposed on the first capping layer CP1 and the color filter patterns CF, respectively.

The low refractive patterns LR may be spaced apart from each other. In other words, each of the low refractive patterns LR may have an island shape. Also, in a plan view, the low refractive patterns LR may be spaced apart from the sub-openings SOP.

The low refractive patterns LR may have a refractive index lower than that of the capping layers CP1, CP2, and CP3. The low refractive patterns LR may improve the light emitting efficiency, thereby, increasing the luminance and lifetime of the display device 10.

In an embodiment, the low refractive patterns LR may have a refractive index lower than that of the first capping layer CP1 and the second capping layer CP2. For example, each of the first capping layer CP1 and the second capping layer CP2 may have a refractive index of about 1.5 to about 1.6. The low refractive patterns LR may have a refractive index lower than that of each of the first capping layer CP1 and the second capping layer CP2, and may have a refractive index of about 1.5 or less.

In more detail, the low refractive patterns LR may have a refractive index of about 1.4. In other words, the refractive index of the low refractive patterns LR may be in a range of about 5% to about 15% lower than the refractive index of each of the first capping layer CP1 and the second capping layer CP2. However, the present disclosure is not limited thereto.

By disposing the first capping layer CP1 and the second capping layer CP2 above and below the low refractive pattern LR, a high refractive index-low refractive index-high refractive index structure may be formed. Accordingly, the light emitting efficiency of the display device 10 may be improved.

In an embodiment, the low refractive patterns LR may include an organic material.

The second capping layer CP2 may be disposed on the low refractive patterns LR and the first capping layer CP1. The second capping layer CP2 may be entirely disposed on the light emitting areas LA and the peripheral area PA. For example, the second capping layer CP2 may cover the low refractive patterns LR. For example, the second capping layer CP2 may include an inorganic material. The second capping layer CP2 may protect the low refractive patterns LR from oxygen, moisture, foreign substances, and the like.

The color conversion patterns CCL may be disposed in the pixel openings POP, respectively. The color conversion patterns CCL may be disposed on the second capping layer CP2 and the low refractive patterns LR, respectively. The color conversion patterns CCL may be spaced apart from each other.

In an embodiment, the color conversion patterns CCL may include a first color conversion pattern CCL1, a second color conversion pattern CCL2, and a transmission pattern TL. The first color conversion pattern CCL1, the second color conversion pattern CCL2, and the transmission pattern TL may overlap with the first to third light emitting areas LA1, LA2, and LA3, respectively.

The first color conversion pattern CCL1 may overlap with the first light emitting area LA1. The first color conversion pattern CCL1 may convert the incident light L1 into first transmitted light L2R having a red color. For example, the first color conversion pattern CCL1 may include a resin part CCL1a, a scattering material CCL1b, and a wavelength conversion particle CCL1c.

The scattering material CCL1b may increase an optical path by scattering the incident light L1 without changing or substantially changing the wavelength of the incident light L1 that is incident on the first color conversion pattern CCL1. The scattering material CCL1b may include a metal oxide or an organic material. However, the present disclosure is not limited thereto, and the scattering material CCL1b may be omitted as needed or desired.

In an embodiment, the wavelength conversion particle CCL1c may include a quantum dot. The quantum dot may be defined as a semiconductor material having nanocrystals. The quantum dot may have a suitable band gap (e.g., a specific or predetermined band gap) depending on its composition and size. Accordingly, the quantum dots may absorb the incident light L1, and may emit light having a different wavelength from that of the incident light L1. For example, the quantum dot may have a diameter of about 100 nm or less, and in more detail, may have a diameter of about 1 nm to about 20 nm. For example, the wavelength conversion particles CCL1c of the first color conversion pattern CCL1 may include quantum dots for absorbing the incident light L1, and emitting red light.

The scattering material CCL1b and the wavelength conversion particle CCL1c may be disposed in the resin part CCL1a. For example, the resin part CCL1a may include an epoxy-based resin, an acrylic-based resin, a phenol-based resin, a melamine-based resin, a cardo-based resin, an imide-based resin, and/or the like.

The first color conversion pattern CCL1 may convert the incident light L1 to emit the first transmitted light L2R having the red color. The incident light L1 that is not converted by the first color conversion pattern CCL1 may be blocked by the first color filter pattern CF1. Accordingly, in the first light emitting area LA1, the first transmitted light L2R having the red color may pass through the first base substrate SUB1 to be emitted to the outside e.g., in the first direction DR1).

The second color conversion pattern CCL2 may overlap with the second light emitting area LA2. The second color conversion pattern CCL2 may convert the incident light L1 into the second transmitted light L2G having a green color. For example, the second color conversion pattern CCL2 may include the resin part CCL2a, the scattering material CCL2b, and the wavelength conversion particle CCL2c. The resin part CCL2a and the scattering material CCL2b of the second color conversion pattern CCL2 may be the same or substantially the same as (or similar to) the resin part CCL1a and the scattering material CCL1b of the first color conversion pattern CCL1.

For example, the wavelength conversion particles CCL2c of the second color conversion pattern CCL2 may include quantum dots that absorb the incident light L1, and emit green light. Accordingly, the second color conversion pattern CCL2 may convert the incident light L1 to emit the second transmitted light L2G having a green color. The incident light L1 that is not converted by the second color conversion pattern CCL2 may be blocked by the second color filter pattern CF2. Accordingly, in the second light emitting area LA2, the second transmitted light L2G having a green color may pass through the first base substrate SUB1 to be emitted to the outside (e.g., in the first direction DR1).

The transmission pattern TL may overlap with the third light emitting area LA3. The transmission pattern TL may transmit the incident light L1 to emit the third transmitted light L2B. For example, the transmission pattern TL may include a resin part TLa and a scattering material TLb. The resin part TLa and the scattering material TLb of the transmission pattern TL may be the same or substantially the same as (or similar to) the resin part CCL1a and the scattering material CCL1b of the first color conversion pattern CCL1.

However, the present disclosure is not limited thereto, and the transmission pattern TL may convert the incident light L1 into the third transmitted light L2B having a blue color. In this case, the transmission pattern TL may further include wavelength conversion particles including quantum dots that absorb incident light L1, and emit blue light.

Some of the incident light L1 may be blocked by the third color filter pattern CF3. Accordingly, in the third light emitting area LA3, the third transmitted light L2B having the blue color may pass through the first base substrate SUB1 to be emitted to the outside (e.g., in the first direction DR1).

In the first to third light emitting areas LA1, LA2, and LA3, the first to third transmitted lights L2R, L2G, and L2B emitted to the outside through the first base substrate SUB1 may be combined with each other. Accordingly, an image may be displayed in the first area A1.

The third capping layer CP3 may be disposed on the color conversion patterns CCL and the second capping layer CP2. The third capping layer CP3 may be entirely disposed on the light emitting areas LA and the peripheral area PA. For example, the third capping layer CP3 may cover the low refractive patterns LR. For example, the third capping layer CP3 may include an inorganic material. The third capping layer CP3 may protect the color conversion patterns CCL from oxygen, moisture, foreign substances, and the like.

In an embodiment, as the partition layer PT includes the pixel openings POP and the sub-openings SOP, a depth of each of the pixel openings POP and the sub-openings SOP may be controlled. In addition, as the color filter patterns CF, the low refractive patterns LR, and the color conversion patterns CCL are disposed in the pixel openings POP, respectively, a material of each of the color filter patterns CF and the low refractive patterns LR may be reduced.

In addition, as the low refractive patterns LR are spaced apart from each other, penetration of oxygen, moisture, and foreign substances through the low refractive patterns LR may be prevented or substantially prevented. Accordingly, reliability of the display device may be improved.

Also, as the reflective layer RL is disposed on the partition layer PT, and disposed around the light emitting areas LA, the light efficiency of the display device 10 may be increased.

Figure 6:
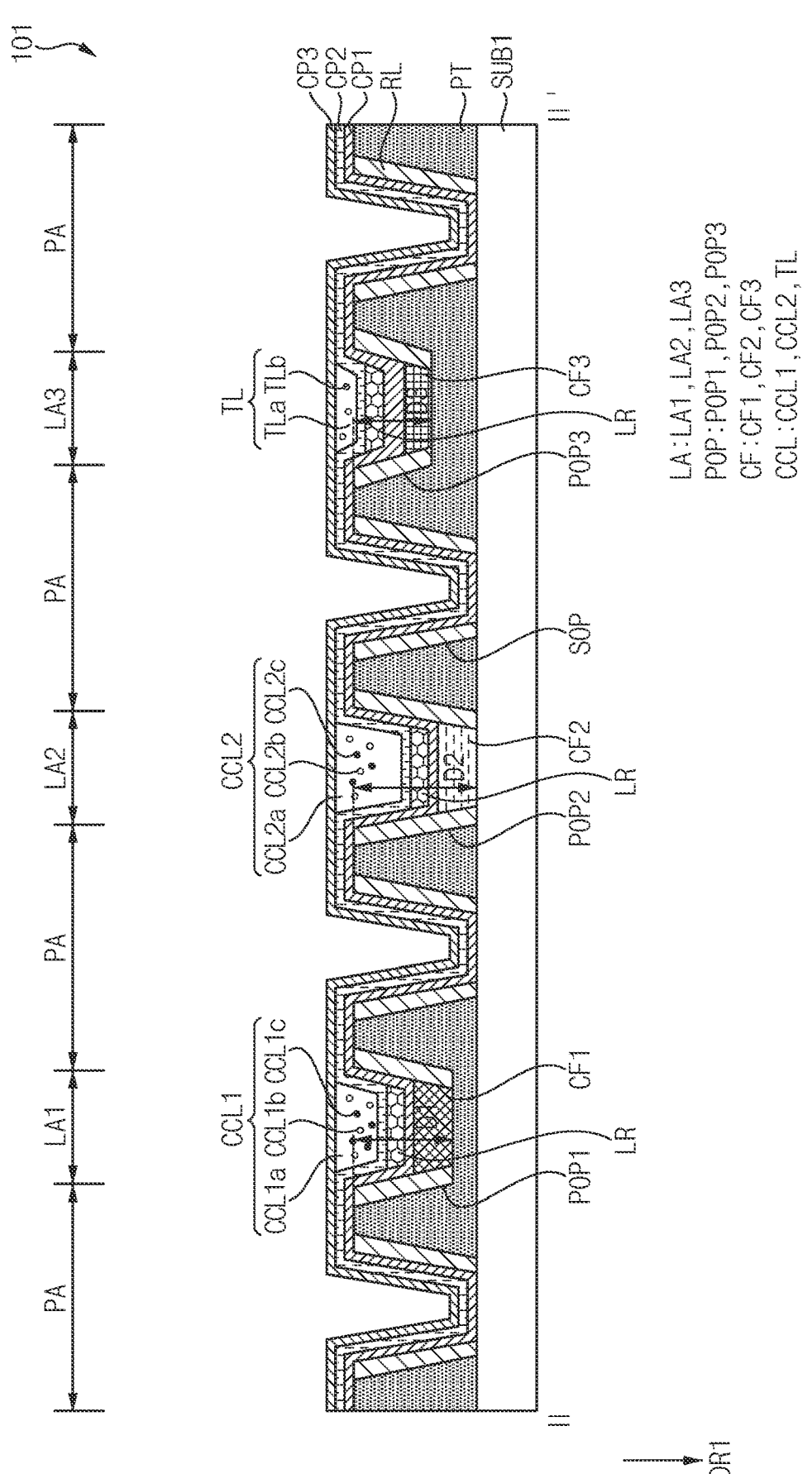
FIG. 6 is a cross-sectional view taken along the line II-II' of FIG. 4.

FIG. 6 is a cross-sectional view taken along the line II-II' of FIG. 4. FIG. 6 illustrates another embodiment of the view illustrated in FIG. 5.

Referring further to FIG. 6, the pixel openings POP may have different depths from one another. In other words, the depths of the pixel openings POP may be formed to be different from each other according to the light emitting efficiency of each of the pixel openings POP. For example, a depth D2 of the second pixel opening POP2 may be greater than a depth D1 of the first pixel opening POP1 and a depth D3 of the third pixel opening POP3. The depth D1 of the first pixel opening POP1 may be greater than the depth D3 of the third pixel opening POP3. Also, in this case, each of the pixel openings POP may have the same or substantially the same area in a plan view. However, the present disclosure is not limited thereto.

Figure 7:
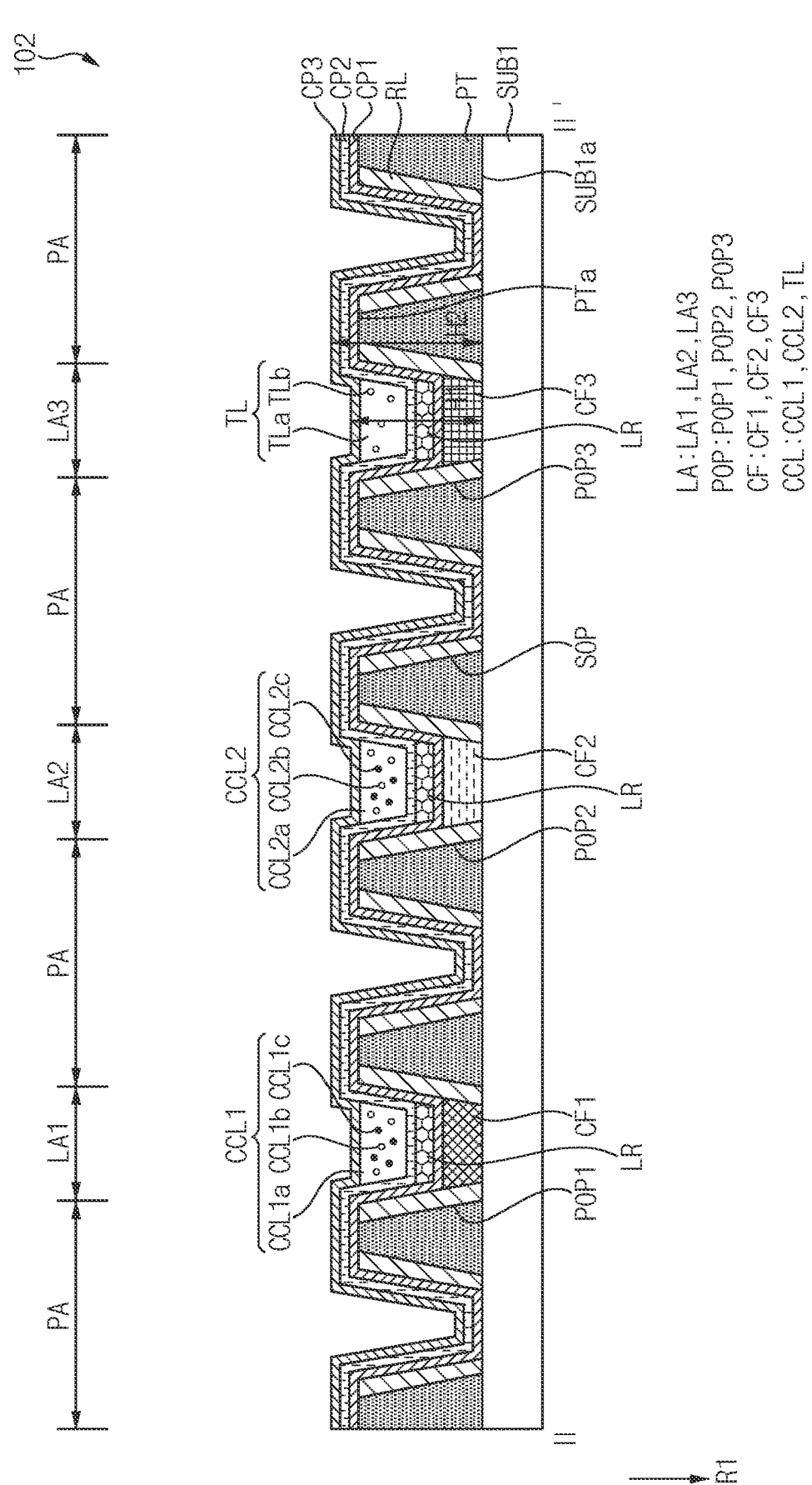
FIG. 7 is a cross-sectional view taken along the line II-II' of FIG. 4.

FIG. 7 is a cross-sectional view taken along the line II-II' of FIG. 4. FIG. 7 illustrate another embodiment of the view illustrated in FIG. 5.

Referring further to FIG. 7, a length H1 from an upper surface SUB1a of the first base substrate SUB1 to an upper surface of the third capping layer CP3 overlapping with the light emitting areas LA may be less than a length H2 from the upper surface SUB1a of the first base substrate SUB1 to the upper surface of the third capping layer CP3 overlapping with an upper surface PTa of the partition layer PT.

In other words, the color conversion patterns CCL may not entirely fill the pixel openings POP. Therefore, the upper surface of the third capping layer CP3 overlapping with the light emitting areas LA may be formed more inside in the first direction DR1 than the upper surface of the third capping layer CP3 overlapping with the upper surface PTa of the partition layer PT.

Accordingly, a first gap from an encapsulation layer (e.g., the encapsulation layer ECL of FIG. 3) included in the array substrate to the upper surface of the third capping layer CP3 overlapping with the light emitting areas LA is greater than a second gap from the encapsulation layer to the upper surface of the third capping layer CP3 overlapping with the upper surface PTa of the partition layer PT.

When the color conversion substrate 102 and the array substrate 200 are bonded together, foreign substances may be introduced between the color conversion substrate 102 and the array substrate 200. In this case, because the first gap is greater than the second gap, damage to structures disposed in the light emitting areas LA may be prevented or substantially prevented, even when the foreign substances are disposed in the light emitting areas LA.

Figure 8:
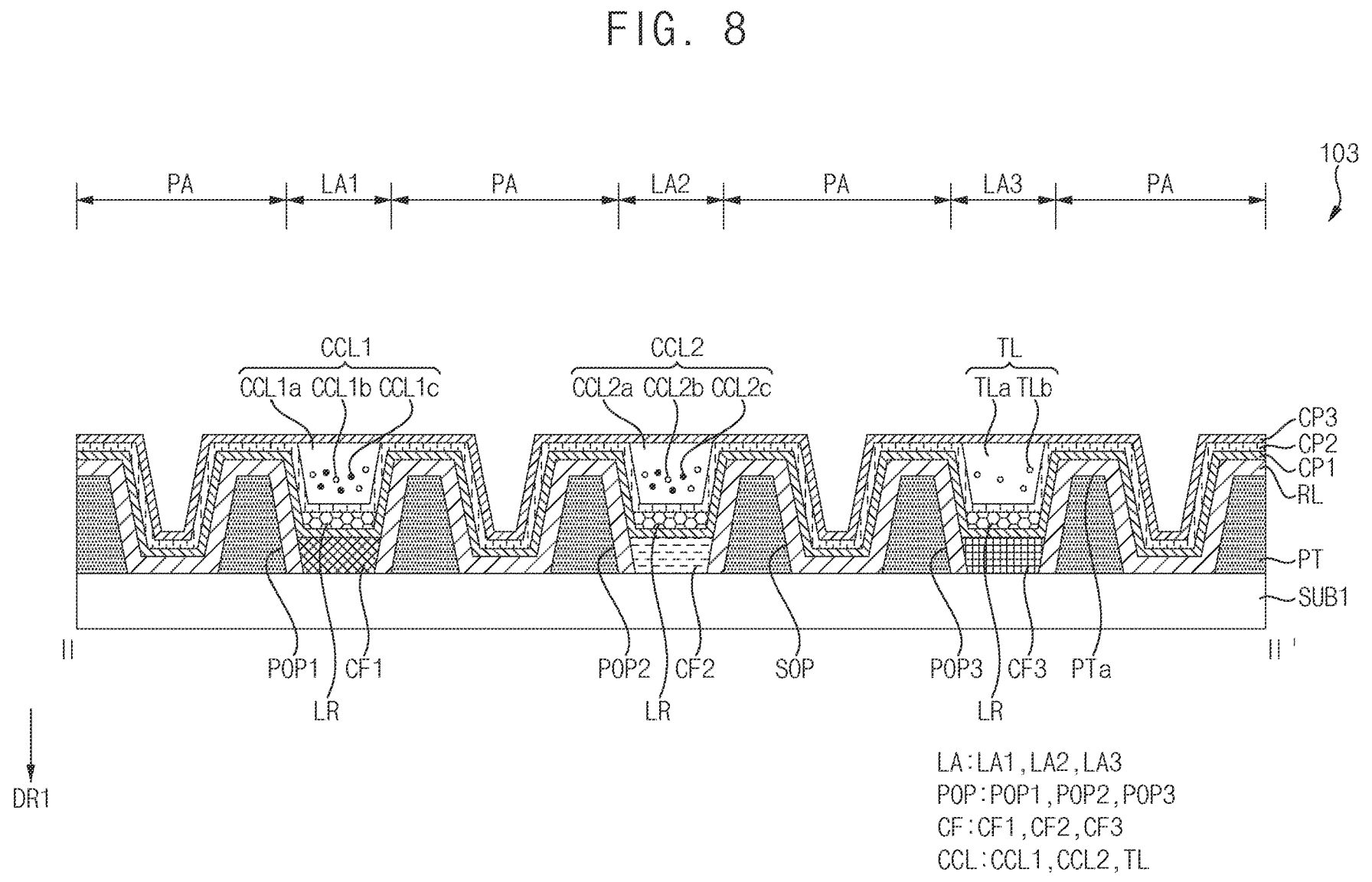

FIG. 8 is a cross-sectional view taken along the line II-II' of FIG. 4. FIG. 8 illustrates another embodiment of the view illustrated in FIG. 5.

Hereinafter, redundant description of a color conversion substrate 103 with reference to FIG. 8 with that of the color conversion substrate 100 described above with reference to FIG. 5 may not be repeated.

Referring to FIG. 8, a reflective layer RL may be disposed on the partition layer PT. The reflective layer RL may be disposed in the peripheral area PA. For example, the reflective layer RL is disposed on a side surface of the partition layer PT adjacent to the pixel openings POP and the sub-openings SOP, and on an upper surface PTa of the partition layer PT. The upper surface PTa of the partition layer PT may be a surface of the partition layer PT that is spaced apart from the first base substrate SUB1. In other words, the reflective layer RL may not be disposed in the light emitting areas LA. Unlike the reflective layer RL of FIG. 5, the reflective layer RL of FIG. 8 may be disposed on the side surface of the partition layer PT, as well as on the upper surface PTa of the partition layer PT.

The reflective layer RL may include a metal. Because the reflective layer RL is disposed on the partition layer PT to reflect light, the light emitting efficiency of the color conversion substrate 103 may be improved.

Figure 9:
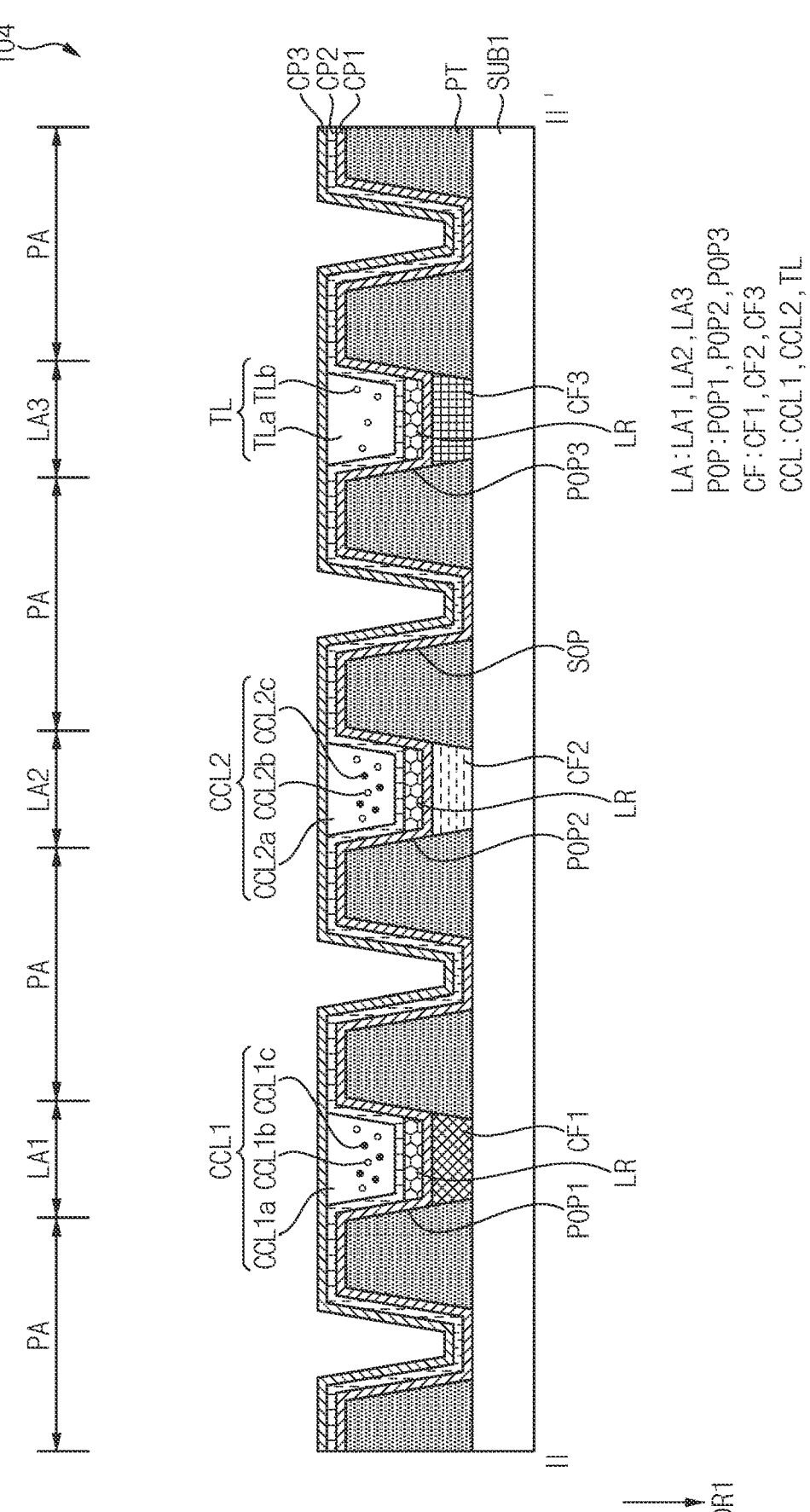
FIG. 9 is a cross-sectional view taken along the line II-II' of FIG. 4.

FIG. 9 is a cross-sectional view taken along the line II-II' of FIG. 4. FIG. 9 illustrates another embodiment of the view illustrated in FIG. 5.

Because the color conversion substrate 104 described hereinafter with reference to FIG. 9 may be different from the color conversion substrate 100 described above with reference to FIG. 5 with respect to the presence or absence of a reflective layer, redundant description thereof may not be repeated.

Referring to FIG. 9, a color conversion substrate 104 may include a first base substrate SUB1, a partition layer PT, color filter patterns CF, a first capping layer CP1, low refractive patterns LR, a second capping layer CP2, color conversion patterns CCL, and a third capping layer CP3.

In an embodiment, the partition layer PT may include polyimide including a light-blocking material, such as a black pigment, dye, or carbon black. For example, the partition layer PT may include polyimide further including a black pigment. When the partition layer PT further includes a black pigment, the partition layer PT may function as a light blocking member. Accordingly, color mixing between the adjacent first to third light emitting areas LA1, LA2, and LA3 may be prevented or substantially prevented, due to the partition layer PT without an additional structure.

Unlike the embodiment illustrated in FIG. 5, in FIG. 9, because the partition layer PT includes polyimide including the light-blocking material, a reflective layer may not be disposed on the partition layer PT. Thus, the manufacturing process of the color conversion substrate 104 may be simplified.

Figure 10:
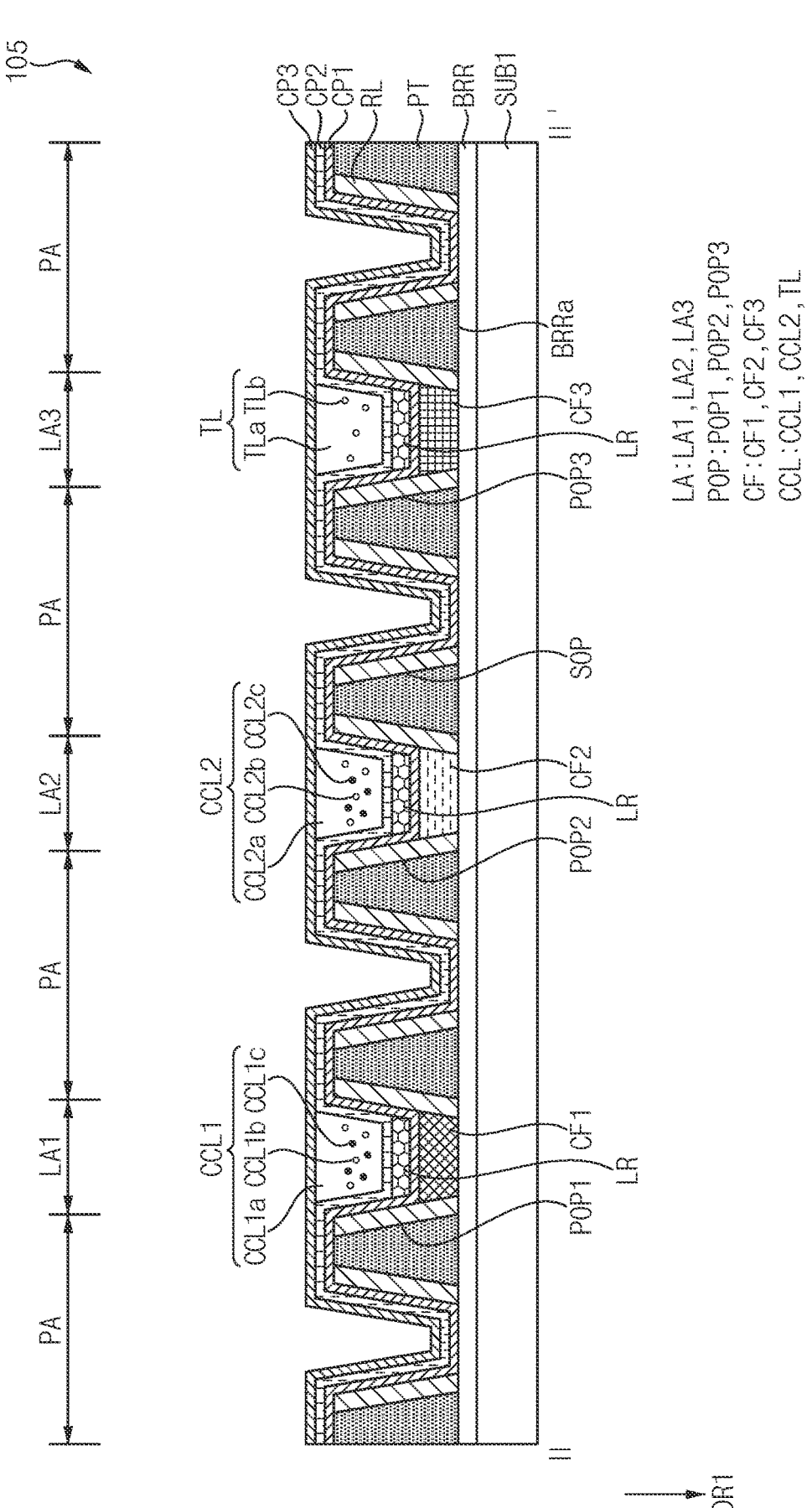
FIG. 10 is a cross-sectional view taken along the line II-II' of FIG. 4.

FIG. 10 is a cross-sectional view taken along the line II-II' of FIG. 4. FIG. 10 illustrates another embodiment of the view illustrated in FIG. 5.

Because a color conversion substrate 105 described hereinafter with reference to FIG. 10 may be different from the color conversion substrate 100 described above with reference to FIG. 5 with respect to the presence or absence of a barrier layer BRR, redundant description thereof may not be repeated.

Referring to FIG. 10, a color conversion substrate 105 may include a first base substrate SUB1, a barrier layer BRR, a partition layer PT, a reflective layer RL, color filter patterns CF, a first capping layer CP1, low refractive patterns LR, a second capping layer CP2, color conversion patterns CCL, and a third capping layer CP3.

The barrier layer BRR may be disposed between the first base substrate SUB1 and the partition layer PT. The pixel openings POP included in the partition layer PT may expose an upper surface BRRa of the barrier layer BRR.

The barrier layer BRR may include a transparent material. The barrier layer BRR may include an inorganic material. For example, the barrier layer BRR may include silicon oxide or indium tin oxide.

In an embodiment, as the barrier layer BRR is disposed between the first base substrate SUB1 and the partition layer PT, the barrier layer BRR may prevent or substantially prevent damage to the first base substrate SUB1 when the reflective layer LR is formed. Also, the barrier layer BRR may protect the color filter patterns CF from oxygen, moisture, foreign substances, and the like.

FIG. 11 is a cross-sectional view taken along the line II-II' of FIG. 4. FIG. 11 illustrates another embodiment of the view illustrated in FIG. 5.

Because a color conversion substrate 106 described hereinafter with reference to FIG. 11 may be different from the color conversion substrate 100 described above with reference to FIG. 5 with respect to an arrangement of the low refractive patterns LR, redundant description thereof may not be repeated.

Referring to FIG. 11, a color conversion substrate 106 may include a first base substrate SUB1, a partition layer PT, a reflective layer RL, color filter patterns CF, a first capping layer CP1, a low refractive patterns LR, a second capping layer CP2, color conversion patterns CCL, and a third capping layer CP3.

In an embodiment, the low refractive patterns LR may be disposed in the pixel openings POP and the sub-openings SOP included in the partition layer PT, respectively. The low refractive patterns LR may be disposed in the pixel openings POP in the light emitting areas LA, and may overlap with the color filter patterns CF, respectively. The low refractive patterns LR may be disposed in the sub-openings SOP, respectively, in the peripheral area PA.

Accordingly, the low refractive patterns LR may be spaced apart from each other. In other words, each of the low refractive patterns LR may have an island shape.

Because the low refractive patterns LR are spaced apart from each other, oxygen, moisture, foreign substances, and/or the like may not penetrate into the array substrate (e.g., the array substrate 200 of FIG. 3) through the low refractive patterns LR. Accordingly, reliability of the display device may be improved.

Figure 12:
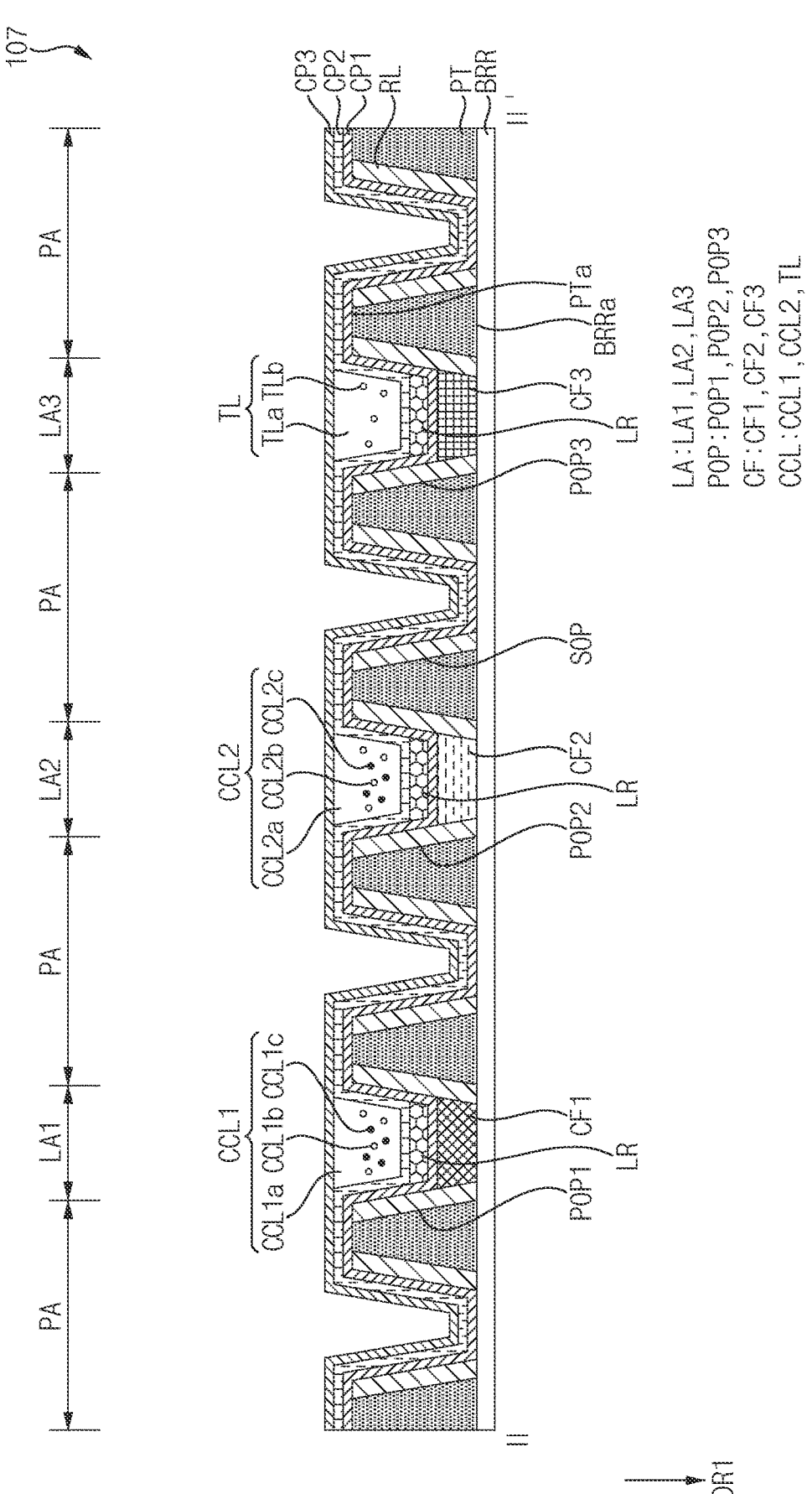
FIG. 12 is a cross-sectional view taken along the line II-II' of FIG. 4.

FIG. 12 is a cross-sectional view taken along the line II-II' of FIG. 4. FIG. 12 illustrates another embodiment of the view illustrated in FIG. 5.

Because a color conversion substrate 107 described hereinafter with reference to FIG. 12 may be different from the color conversion substrate 100 described above with reference to FIG. 5 with respect to the presence or absence of the first base substrate, redundant description thereof may not be repeated.

Referring to FIG. 12, a color conversion substrate 107 may include a barrier layer BRR, a partition layer PT, a reflective layer RL, color filter patterns CF, a first capping layer CP1, low refractive patterns LR, a second capping layer CP2, color conversion patterns CCL, and a third capping layer CP3.

The barrier layer BRR may include a transparent inorganic material. For example, the barrier layer BRR may include a transparent silicon oxide or a transparent indium tin oxide. The barrier layer BRR may protect the color filter patterns CF from oxygen, moisture, foreign substances, and the like.

The partition layer PT may be disposed on the barrier layer BRR. The partition layer PT may include pixel openings POP and sub-openings SOP. The pixel openings POP may be defined in the light emitting areas LA, respectively.

The pixel openings POP may expose the upper surface BRRa of the barrier layer BRR. Accordingly, the first transmitted light L2R, the second transmitted light L2G, and the third transmitted light L2B emitted from the light emitting areas LA may be emitted through the pixel openings POP and the barrier layer BRR.

The sub-openings SOP may be defined in the peripheral area PA. The sub-openings SOP may be disposed around each of the pixel openings POP.

Accordingly, the partition layer PT may entirely overlap with the peripheral area PA, and have a grid shape in a plan view.

However, the present disclosure is not limited thereto, and the pixel openings POP and the sub-openings SOP may be defined in a groove shape without penetrating through the partition layer PT. Therefore, the pixel openings POP and the sub-openings SOP may not expose the upper surface BRRa of the barrier layer BRR.

In an embodiment, the partition layer PT may include polyimide. The partition layer PT may include a light-blocking material, such as a black pigment, dye, or carbon black. For example, the partition layer PT may include polyimide further including a black pigment. When the partition layer PT further includes a black pigment, the partition layer PT may function as a light blocking member. Accordingly, color mixing between the adjacent first to third light emitting areas LA1, LA2, and LA3 may be prevented or substantially prevented due to the partition layer PT. However, the present disclosure is not limited thereto, and the partition layer PT may include yellow polyimide or a transparent polyimide.

The reflective layer RL may be disposed on the partition layer PT. The reflective layer RL may be partially disposed in the peripheral area PA. For example, the reflective layer RL may be disposed on a side surface of the partition layer PT adjacent to the pixel openings POP and the sub-openings SOP. The reflective layer RL may be spaced apart from the upper surface PTa of the partition layer PT in a plan view. In other words, the reflective layer RL may be disposed only on the side surface of the partition layer PT overlapping with the peripheral area PA. However, the present disclosure is not limited thereto.

The color filter patterns CF may be disposed on the partition layer PT and the first base substrate SUB1. The color filter patterns CF may include a plurality of color filter patterns CF1, CF2, and CF3. For example, the color filter patterns CF may include a first color filter pattern CF1, a second color filter pattern CF2, and a third color filter pattern CF3.

In an embodiment, the color filter patterns CF may be disposed in the pixel openings POP, respectively. For example, the color filter patterns CF may be formed by an inkjet process. Accordingly, the color filter patterns CF may be spaced apart from each other. In other words, each of the color filter patterns CF may have an island shape. Also, in a plan view, the color filter patterns CF may be spaced apart from the sub-openings SOP.

The first capping layer CP1 may be disposed on the color filter patterns CF and the reflective layer RL. The first capping layer CP1 may be entirely disposed on the light emitting areas LA and the peripheral area PA. The first capping layer CP1 may cover the color filter patterns CF and the reflective layer RL.

In an embodiment, the low refractive patterns LR may be disposed in the pixel openings POP, respectively. For example, the low refractive patterns LR may be formed by an inkjet process. Accordingly, the low refractive patterns LR may be disposed on the first capping layer CP1 and the color filter patterns CF, respectively.

The low refractive patterns LR may be spaced apart from each other. In other words, each of the low refractive patterns LR may have an island shape. Also, in a plan view, the low refractive patterns LR may be spaced apart from the sub-openings SOP.

The second capping layer CP2 may be disposed on the low refractive patterns LR and the first capping layer CP1. The second capping layer CP2 may be entirely disposed on the light emitting areas LA and the peripheral area PA. The second capping layer CP2 may cover the low refractive patterns LR.

The color conversion patterns CCL may be disposed in the pixel openings POP, respectively. The color conversion patterns CCL may be disposed on the second capping layer CP2 and the low refractive patterns LR, respectively. The color conversion patterns CCL may be spaced apart from each other.

In an embodiment, the color conversion patterns CCL may include a first color conversion pattern CCL1, a second color conversion pattern CCL2, and a transmission pattern TL. The first color conversion pattern CCL1, the second color conversion pattern CCL2, and the transmission pattern TL may overlap with the first to third light emitting areas LA1, LA2, and LA3, respectively.

The third capping layer CP3 may be disposed on the color conversion patterns CCL and the second capping layer CP2. The third capping layer CP3 may be entirely disposed on the light emitting areas LA and the peripheral area PA. The third capping layer CP3 may cover the low refractive patterns LR.

In an embodiment, because the base substrate is not disposed under the barrier layer BRR, the color conversion substrate 107 may be relatively flexible. In addition, when manufacturing the color conversion substrate 107, transmittance of the base substrate may not be considered.

Figure 13:
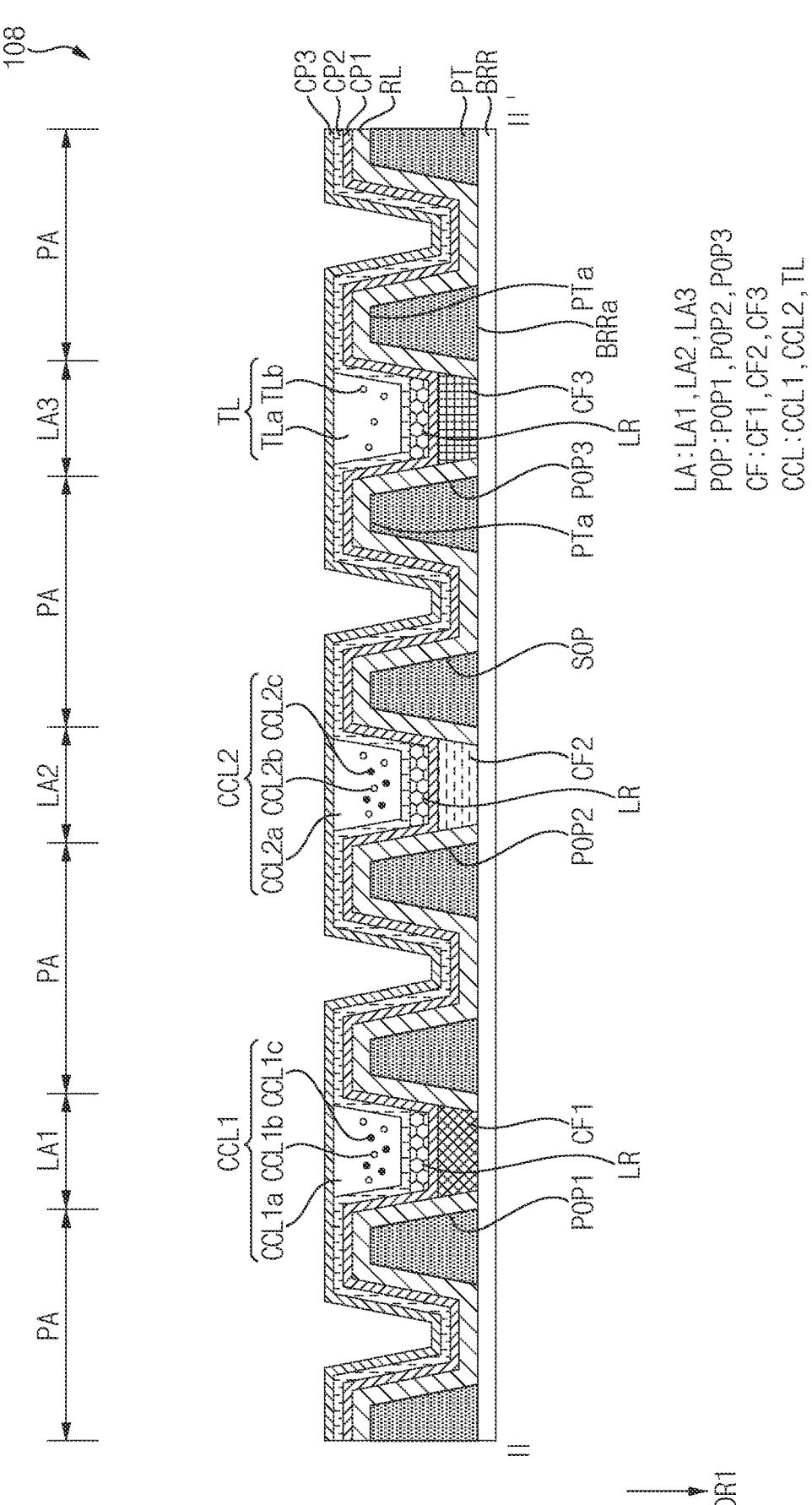
FIG. 13 is a cross-sectional view taken along the line II-II' of FIG. 4.

FIG. 13 is a cross-sectional view taken along the line II-II' of FIG. 4. FIG. 13 illustrates another embodiment of the view illustrated in FIG. 12.

From among a color conversion substrate 108 described hereinafter with reference to FIG. 13, redundant description with that of the color conversion substrate 107 described above with reference to FIG. 12 may not be repeated.

Referring to FIG. 13, a reflective layer RL may be disposed on the partition layer PT. The reflective layer RL may be disposed in the peripheral area PA. For example, the reflective layer RL may be disposed on a side surface of the partition layer PT adjacent to the pixel openings POP and the sub-openings SOP, and on an upper surface PTa of the partition layer PT. However, the present disclosure is not limited thereto.

FIGS. 14 through 28 are cross-sectional views illustrating a method of manufacturing a display device according to an embodiment.

For example, the method of manufacturing a display device described hereinafter with reference to FIGS. 14 to 28 may be a method of manufacturing the display device 10 according to the embodiment illustrated in FIG. 3. Therefore, redundant description thereof may not be repeated.

Referring to FIG. 14, a first base substrate SUB1 may be formed on a carrier substrate CSUB. The carrier substrate CSUB—may be formed of a rigid material. For example, the carrier substrate CSUB—may be formed of glass. The first base substrate SUB1 may be formed of a transparent material. For example, the first base substrate SUB1 may be formed of a transparent polyimide or a transparent acrylic resin.

The first base substrate SUB1 may include light emitting areas LA, and a peripheral area PA. The peripheral area PA may surround (e.g., around peripheries of) the light emitting areas LA.

Figure 15:
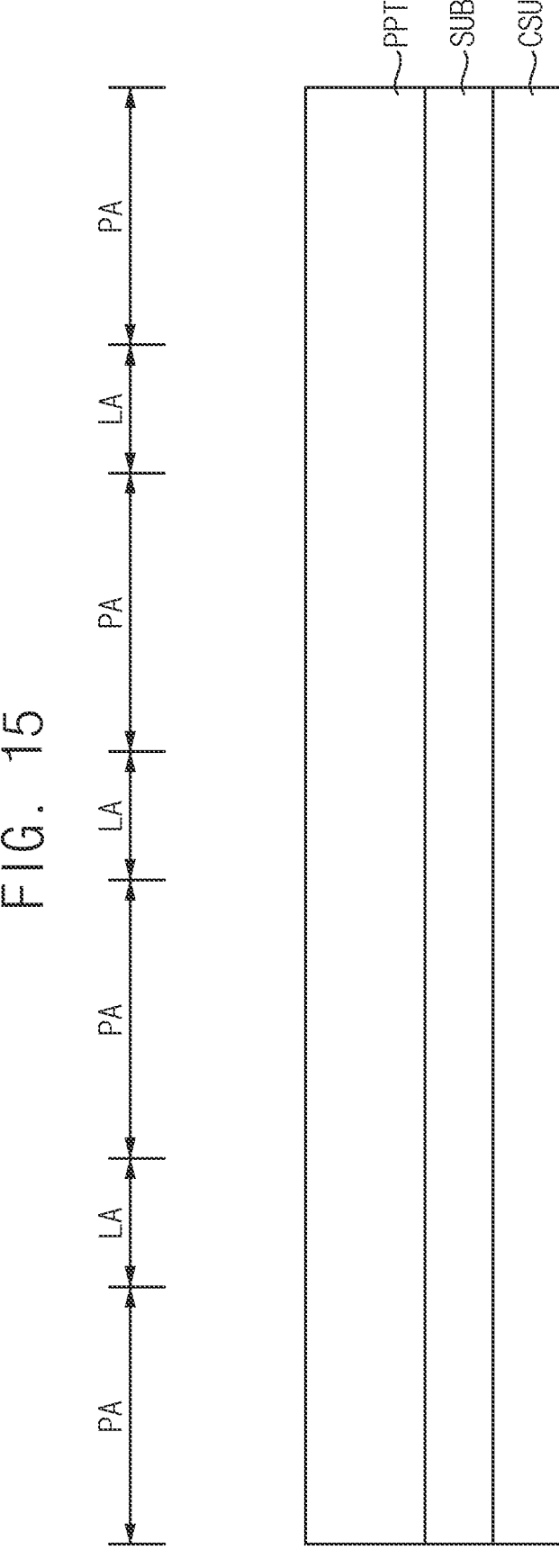

Further referring to FIG. 15, a preliminary partition layer PPT may be formed on the first base substrate SUB1. The preliminary partition layer PPT may be formed of polyimide. Also, the preliminary partition layer PPT may be formed of a light-blocking material, such as a black pigment, dye, or carbon black. For example, the preliminary partition layer PPT may be formed of polyimide further including a black pigment.

Figure 16:
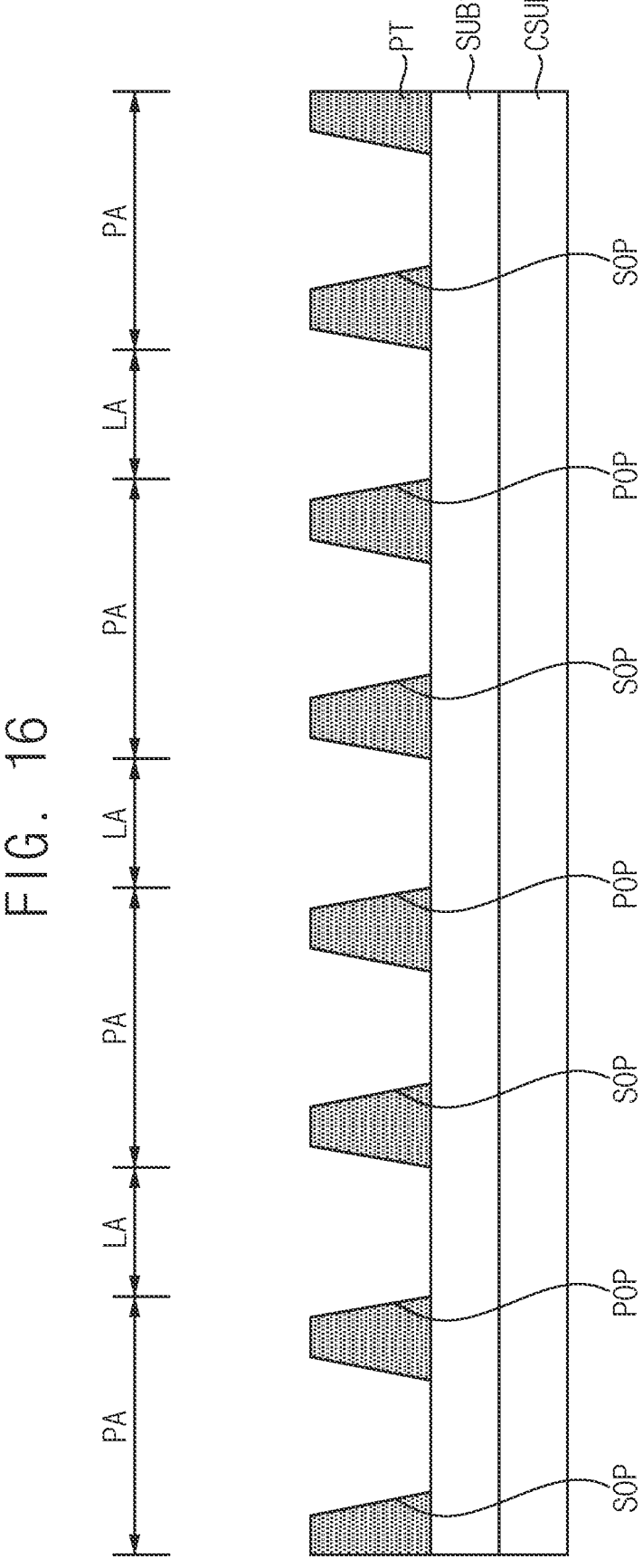

Further referring to FIG. 16, pixel openings POP and sub-openings SOP may be formed in the preliminary partition layer PPT. Accordingly, a partition layer PT including the pixel openings POP and the sub-openings SOP may be formed.

The pixel openings POP may be formed to overlap with the light emitting areas LA, respectively. The sub-openings SOP may be formed to overlap with the peripheral area PA. The sub-openings SOP may be formed around each of the pixel openings POP.

In more detail, a portion of the preliminary partition layer PPT may be exposed. Thereafter, the exposed preliminary partition layer PPT may be developed. For example, the portion of the preliminary partition layer PPT overlapping with the light emitting areas LA may be exposed, and some of the portion overlapping with the peripheral area PA may be exposed. Thereafter, the exposed portions of the preliminary partition layer PPT may be developed. Accordingly, the pixel openings POP and the sub-openings SOP may be formed in the preliminary partition layer PPT. However, the present disclosure is not limited thereto.

A shape of each of the pixel openings POP and the sub-openings SOP may not be limited to an opening shape, and each of the pixel openings POP and the sub-openings SOP formed in the partition layer PT may be formed in the form of a groove. As another example, each of the pixel openings POP may have a different depth from one another.

Figure 17:
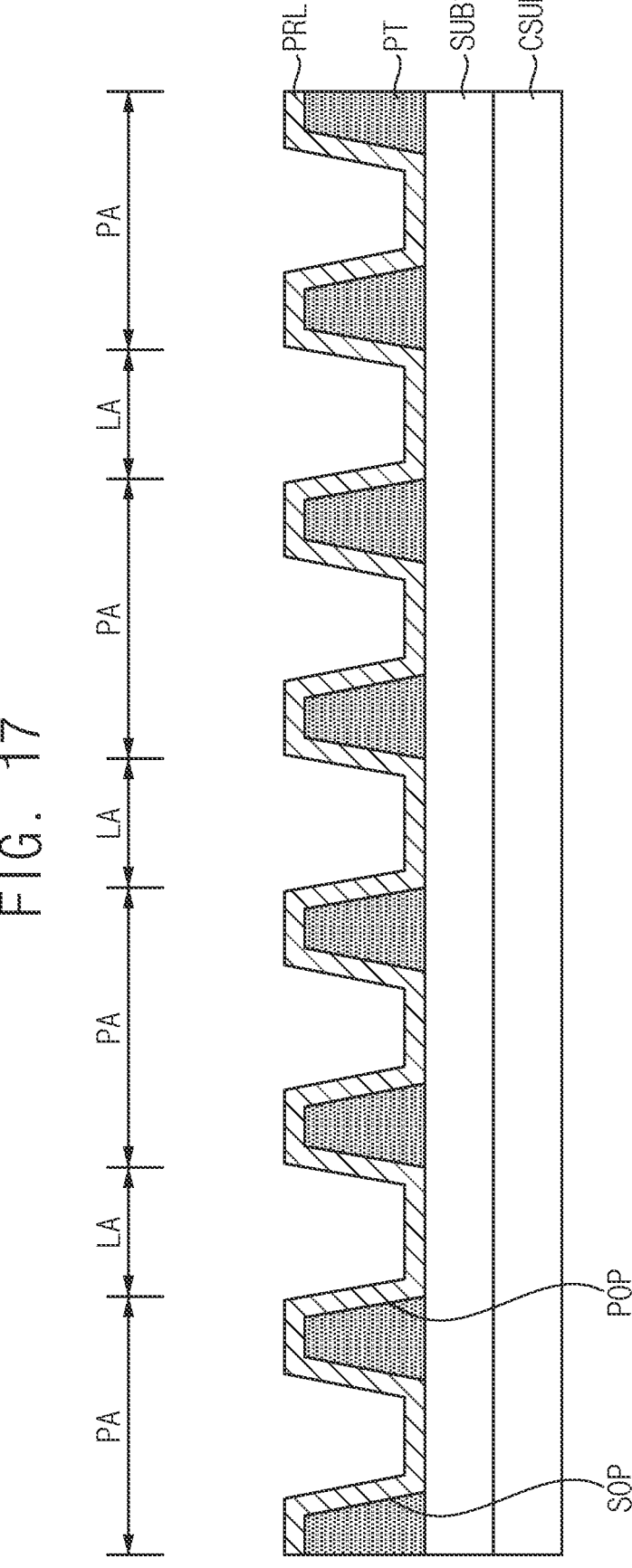
Figure 18:
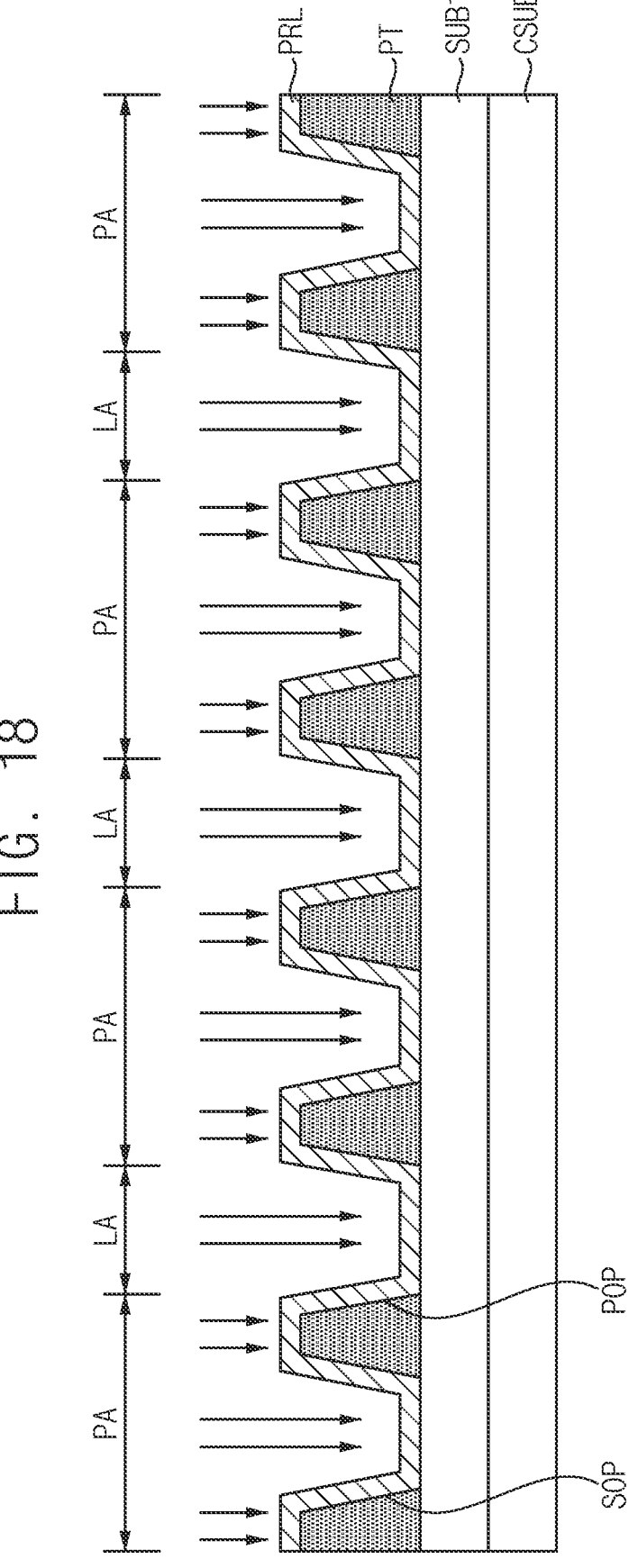
Figure 19:
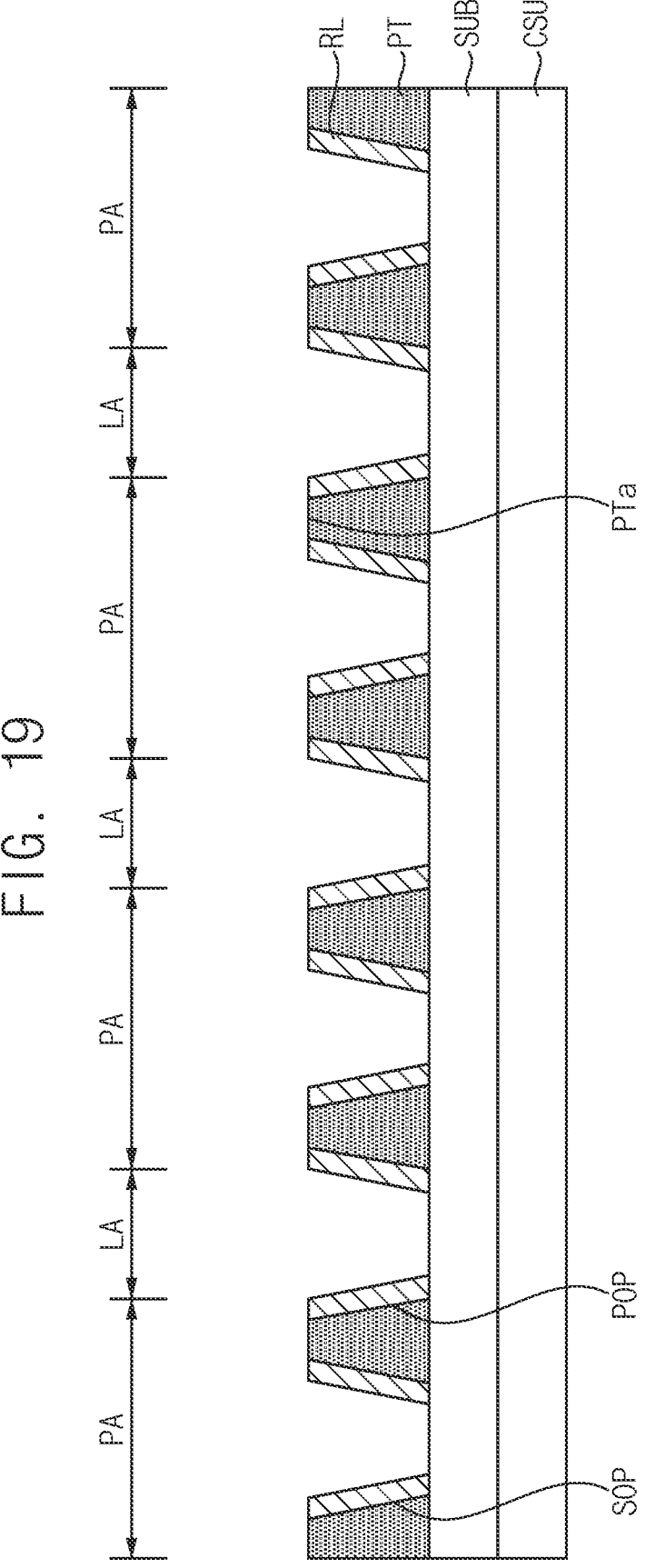

Referring further to FIGS. 17 through 19, a preliminary reflective layer PRL may be formed on the partition layer PT. The preliminary reflective layer PRL may be formed of a metal. The reflective layer RL may be formed by dry etching the preliminary reflective layer PRL. In other words, the reflective layer RL may be formed by a dry etching process.

In the dry etching process, a portion of the preliminary reflective layer PRL overlapping with an upper surface PTa of the partition layer PT may be etched, and portions of the preliminary reflective layer PRL overlapping with the light emitting areas LA may be etched. Accordingly, the reflective layer RL may be formed on a side surface of the partition layer PT adjacent to the pixel openings POP and the sub-openings SOP. In addition, the reflective layer RL may be formed to be spaced apart from the upper surface PTa of the partition layer PT in a plan view.

Figure 20:
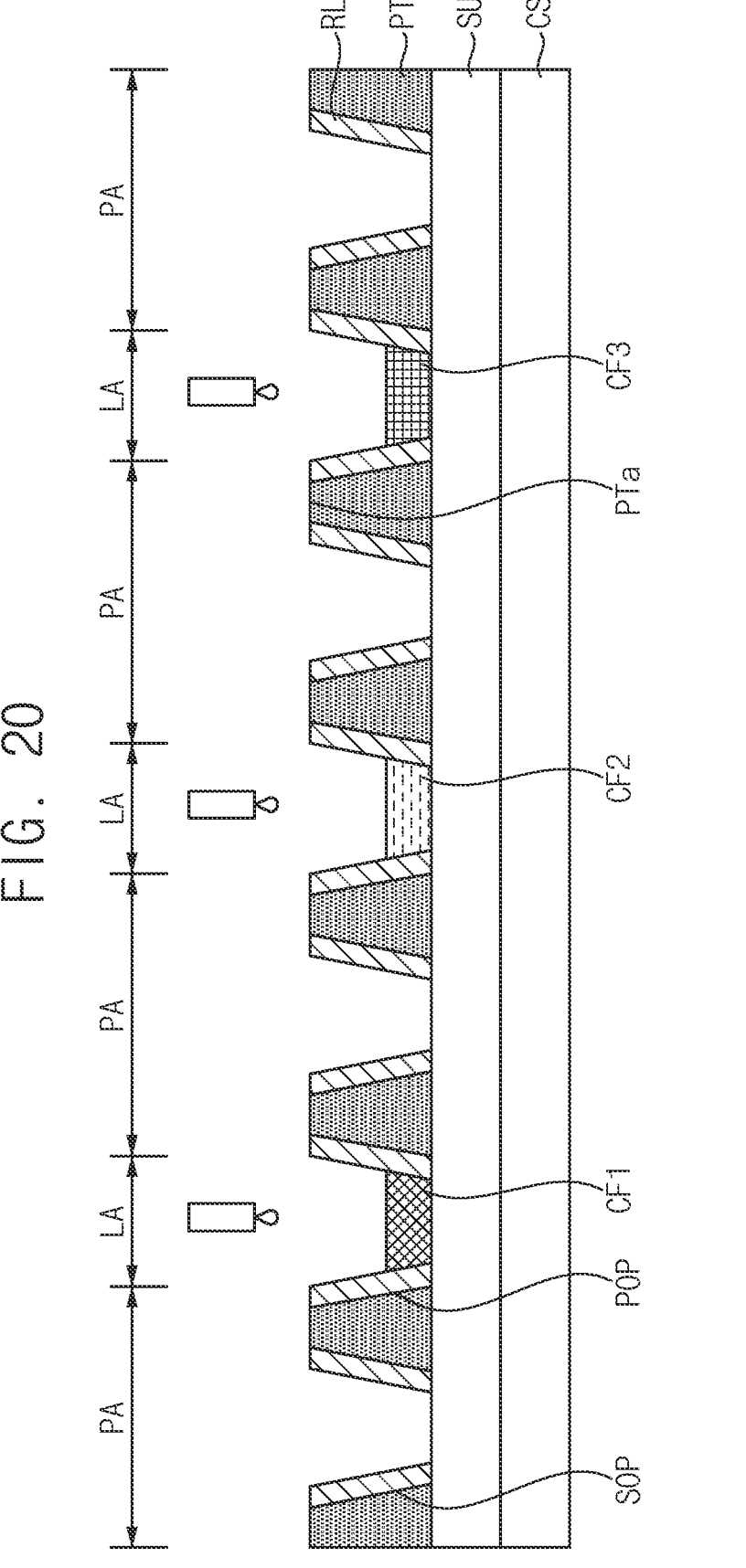

Further referring to FIG. 20, color filter patterns CF may be formed in the pixel openings POP, respectively. The color filter patterns CF may include a first color filter pattern CF1, a second color filter pattern CF2, and a third color filter pattern CF3.

In an embodiment, each of the color filter patterns CF may be formed by an inkjet process. Accordingly, the first color filter pattern CF1, the second color filter pattern CF2, and the third color filter pattern CF2 may be formed in the pixel openings POP, respectively. Also, the first color filter pattern CF1, the second color filter pattern CF2, and the third color filter pattern CF3 may be spaced apart from each other. Each of the color filter patterns CF may have an island shape.

Figure 21:
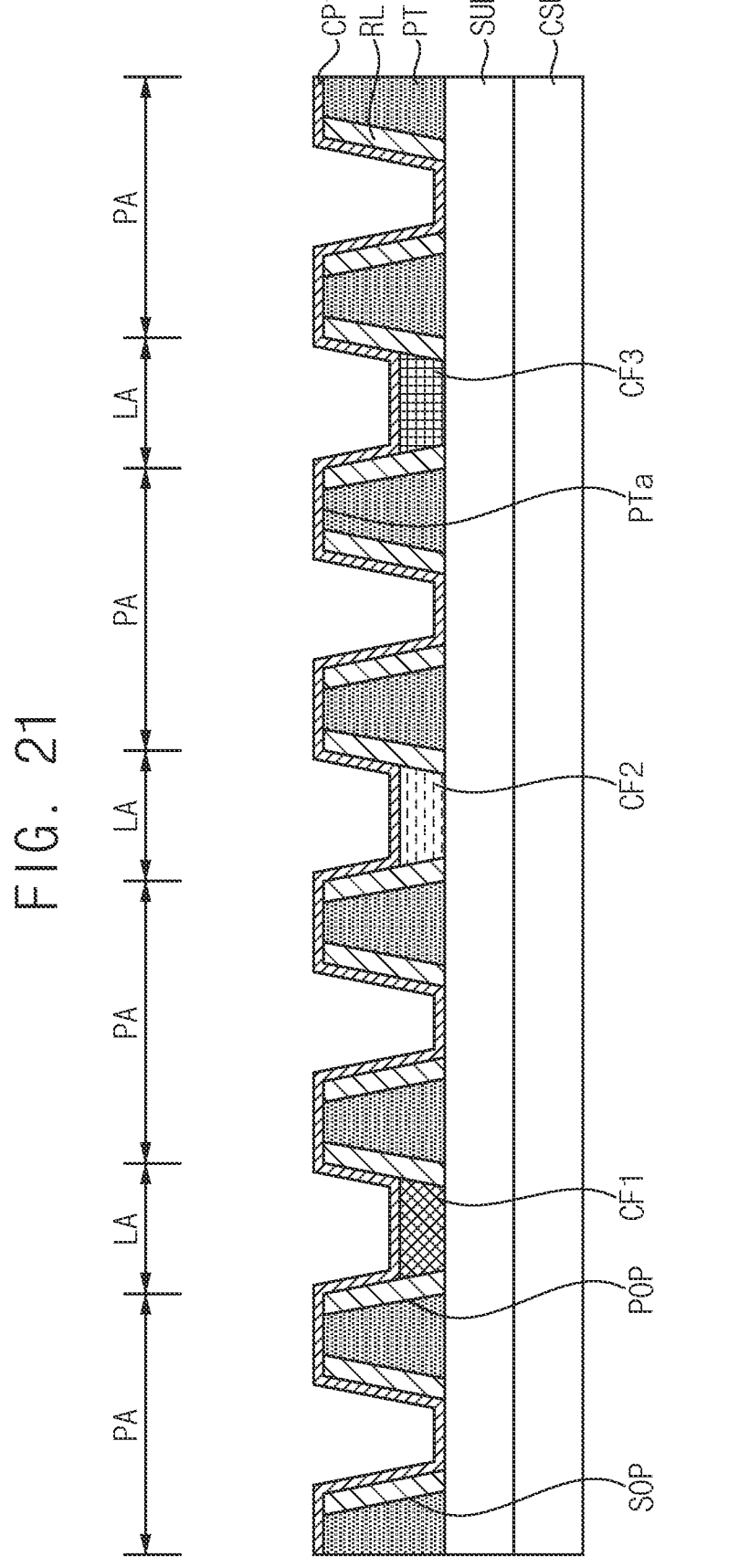

Referring further to FIG. 21, a first capping layer CP1 may be formed on the reflective layer RL and the color filter patterns CF. The first capping layer CP1 may cover the color filter patterns CF. The first capping layer CP1 may be formed of an inorganic material.

Figure 22:
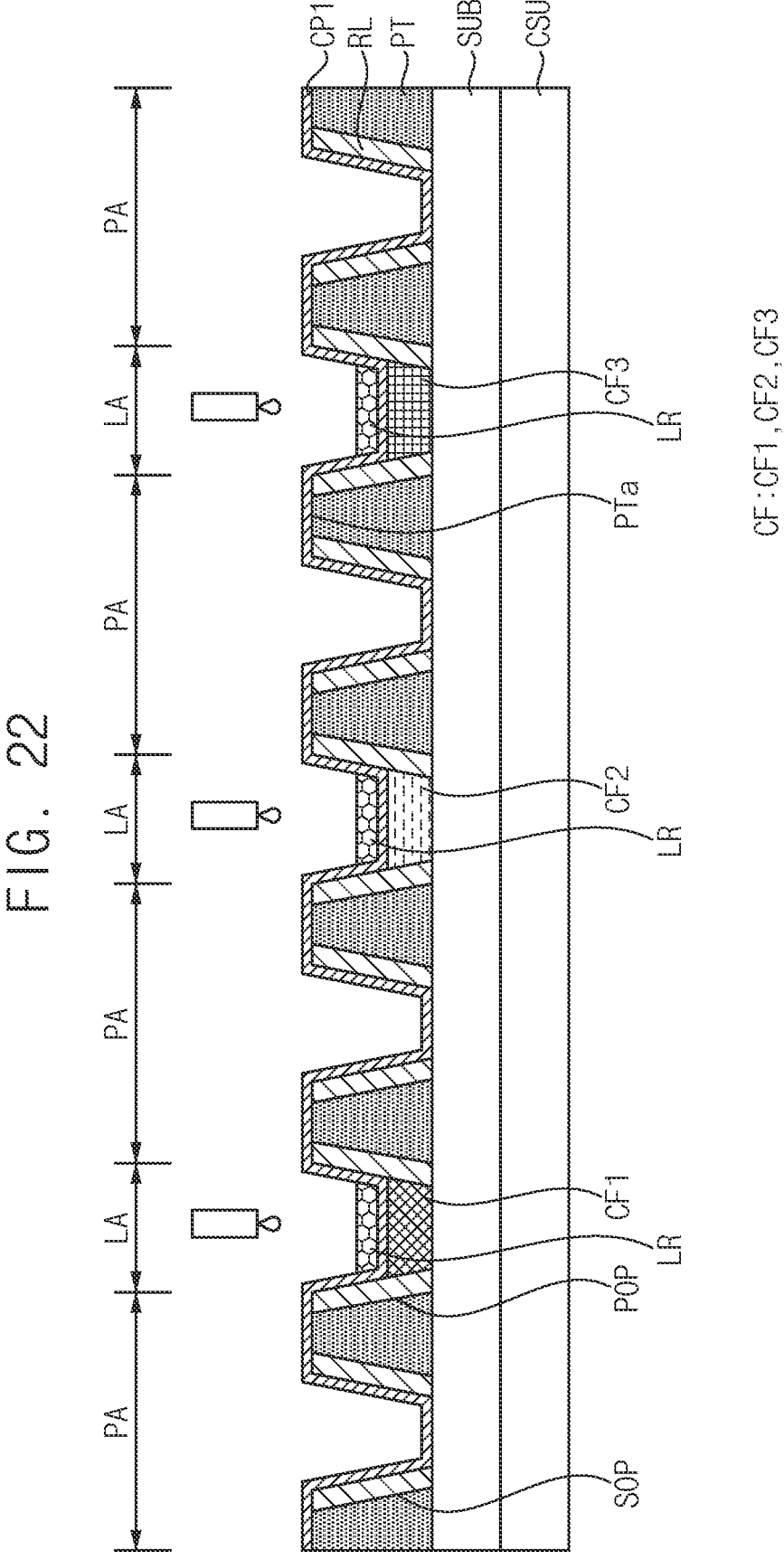

Further referring to FIG. 22, low refractive patterns LR may be formed in the pixel openings POP, respectively. The low refractive patterns LR may be formed on the color filter patterns CF, respectively.

In an embodiment, each of the low refractive patterns LR may be formed by an inkjet process. Accordingly, the low refractive patterns LR may be formed in the pixel openings POP, respectively. Also, the low refractive patterns LR may be spaced apart from each other, and each of the low refractive patterns LR may have an island shape.

Figure 23:
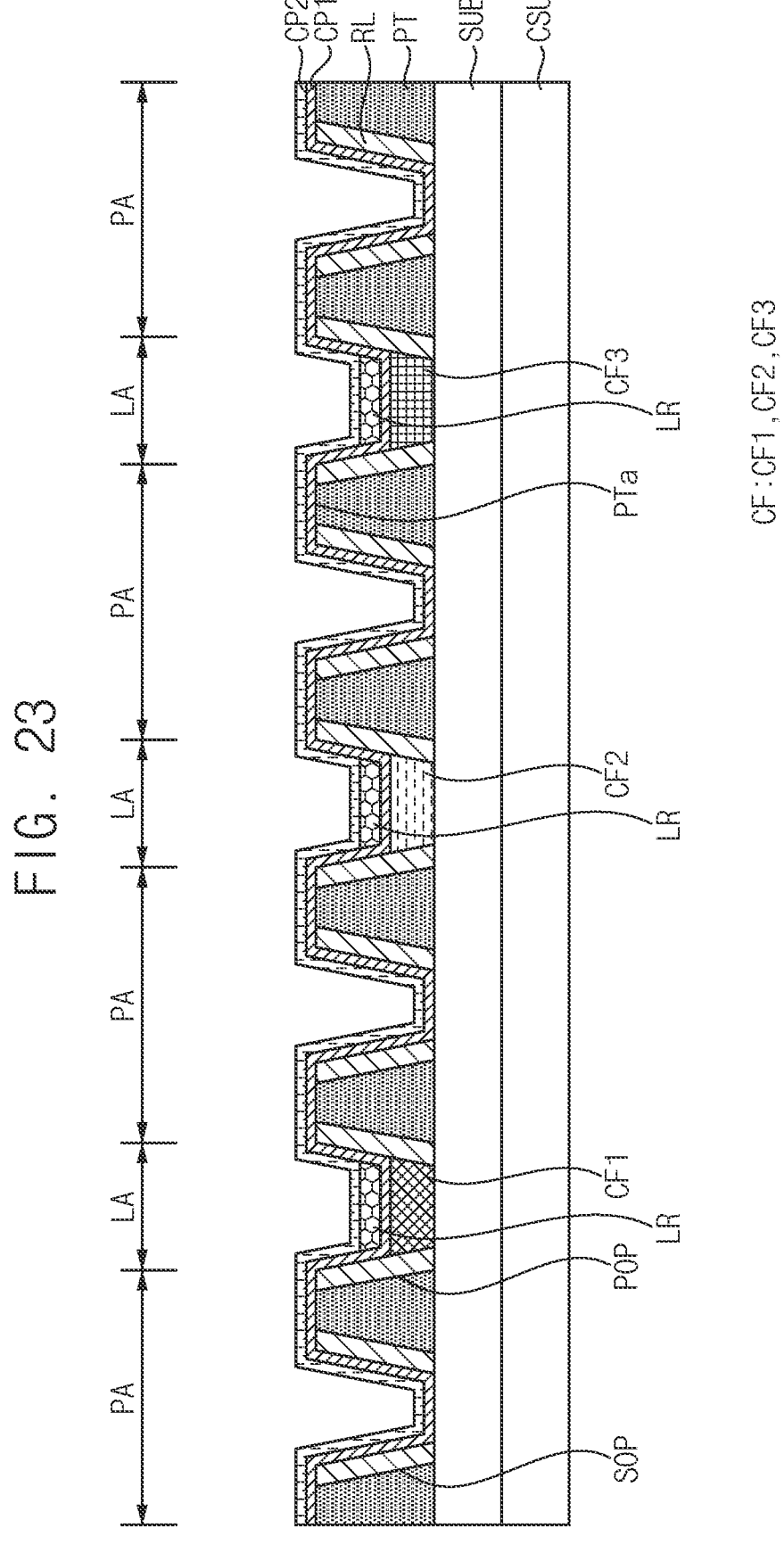

Further referring to FIG. 23, a second capping layer CP2 may be formed on the first capping layer CP1 and the low refractive patterns LR. The second capping layer CP2 may cover the low refractive patterns LR. The second capping layer CP2 may be formed of an inorganic material.

Further referring to FIG. 24, color conversion patterns CCL may be formed in the pixel openings POP, respectively. The color conversion patterns CCL may be formed on the low refractive patterns LR, respectively. For example, the color conversion patterns CCL may include a first color conversion pattern CCL1, a second color conversion pattern CCL2, and a transmission pattern TL.

In an embodiment, each of the color conversion patterns CCL may be formed by an inkjet process. Accordingly, the first color conversion pattern CCL1, the second color conversion pattern CCL2, and the transmission pattern TL may be formed in the pixel openings POP, respectively. Also, the first color conversion pattern CCL1, the second color conversion pattern CCL2, and the transmission pattern TL may be spaced apart from each other. The first color conversion pattern CCL1 may overlap with the first color filter pattern CF1, the second color conversion pattern CCL2 may overlap with the second color filter pattern CF2, and the transmission pattern TL may overlap with the third color filter pattern CF3.

Referring further to FIG. 25, a third capping layer CP3 may be formed on the second capping layer CP2 and the color conversion patterns CCL. The third capping layer CP3 may cover the color conversion patterns CCL. The third capping layer CP3 may be formed of an inorganic material.

Figure 26:
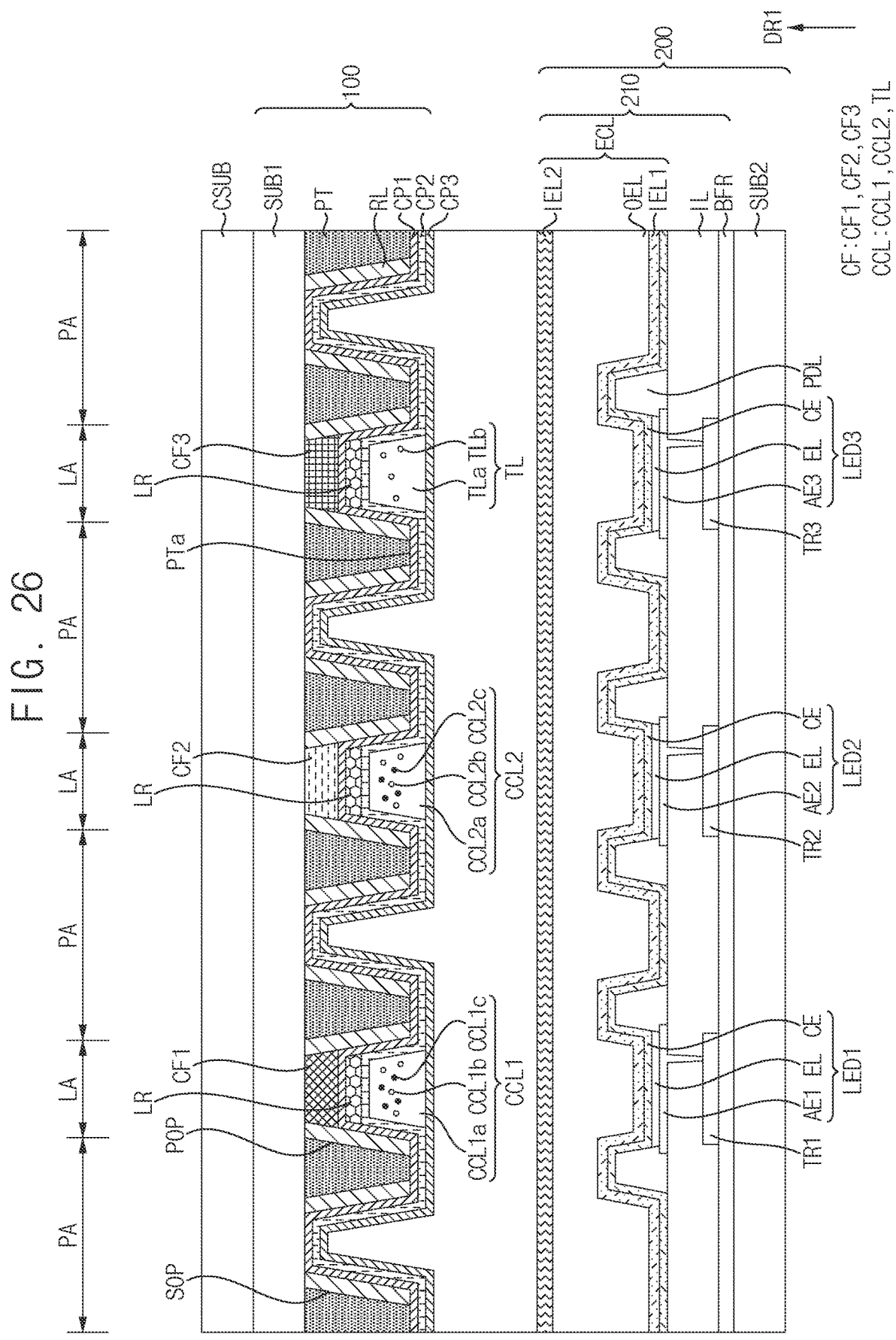

Further referring to FIG. 26, a second base substrate SUB2 may be formed. The second base substrate SUB2 may be formed of glass or plastic. A display element layer 210 may be formed on the second base substrate SUB2. The display element layer 210 may include a buffer layer BFR, first to third driving elements TR1, TR2, TR3, an insulation layer IL, a pixel defining layer PDL, first to third light emitting diodes LED1, LED2, and LED3, and an encapsulation layer ECL. An array substrate 200 may be formed by forming the display element layer 210 on the second base substrate SUB2.

The array substrate 200 and the color conversion substrate 100 may be bonded to each other. A filling layer may be disposed between the array substrate 200 and the color conversion substrate 100.

Figure 27:
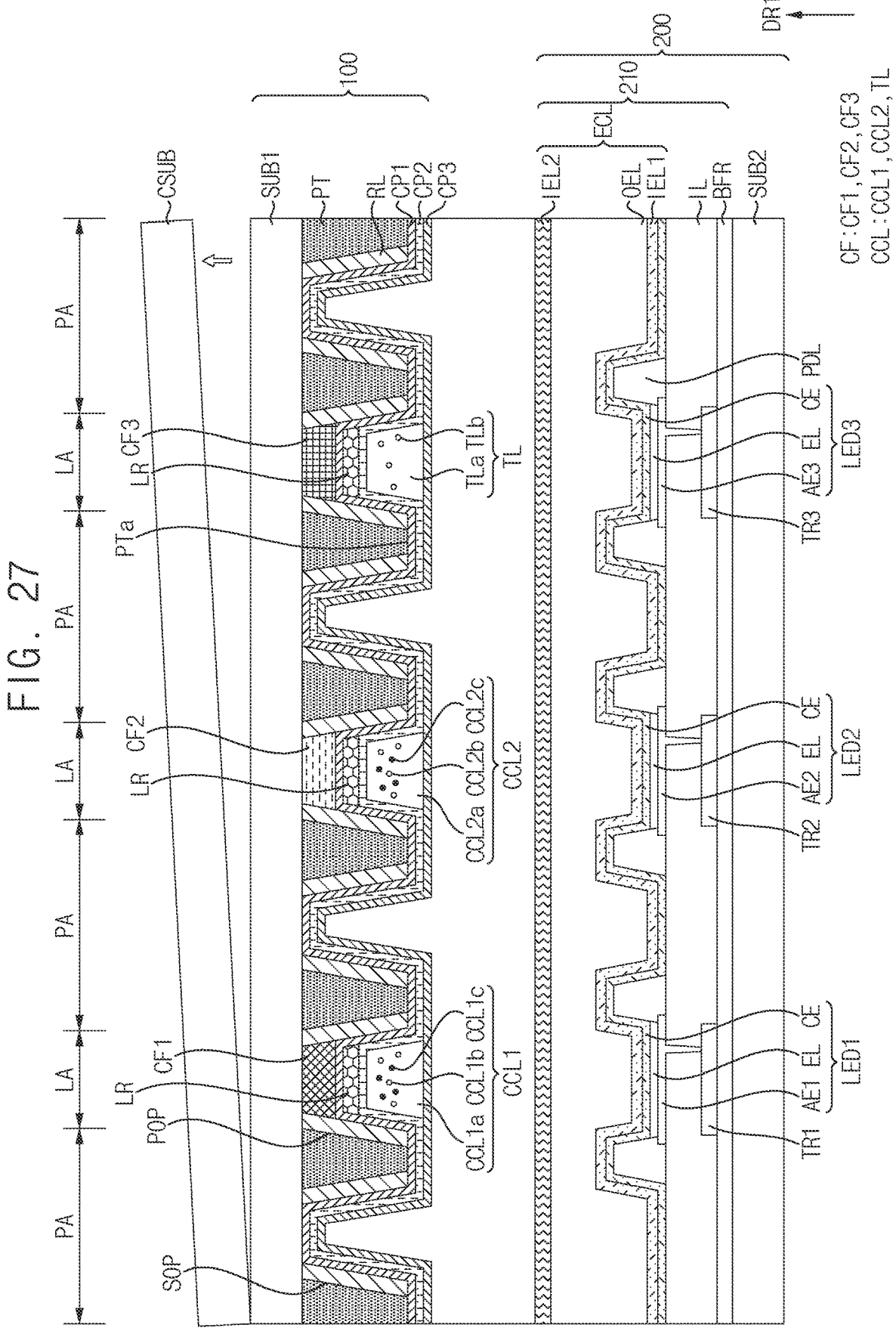
Figure 28:
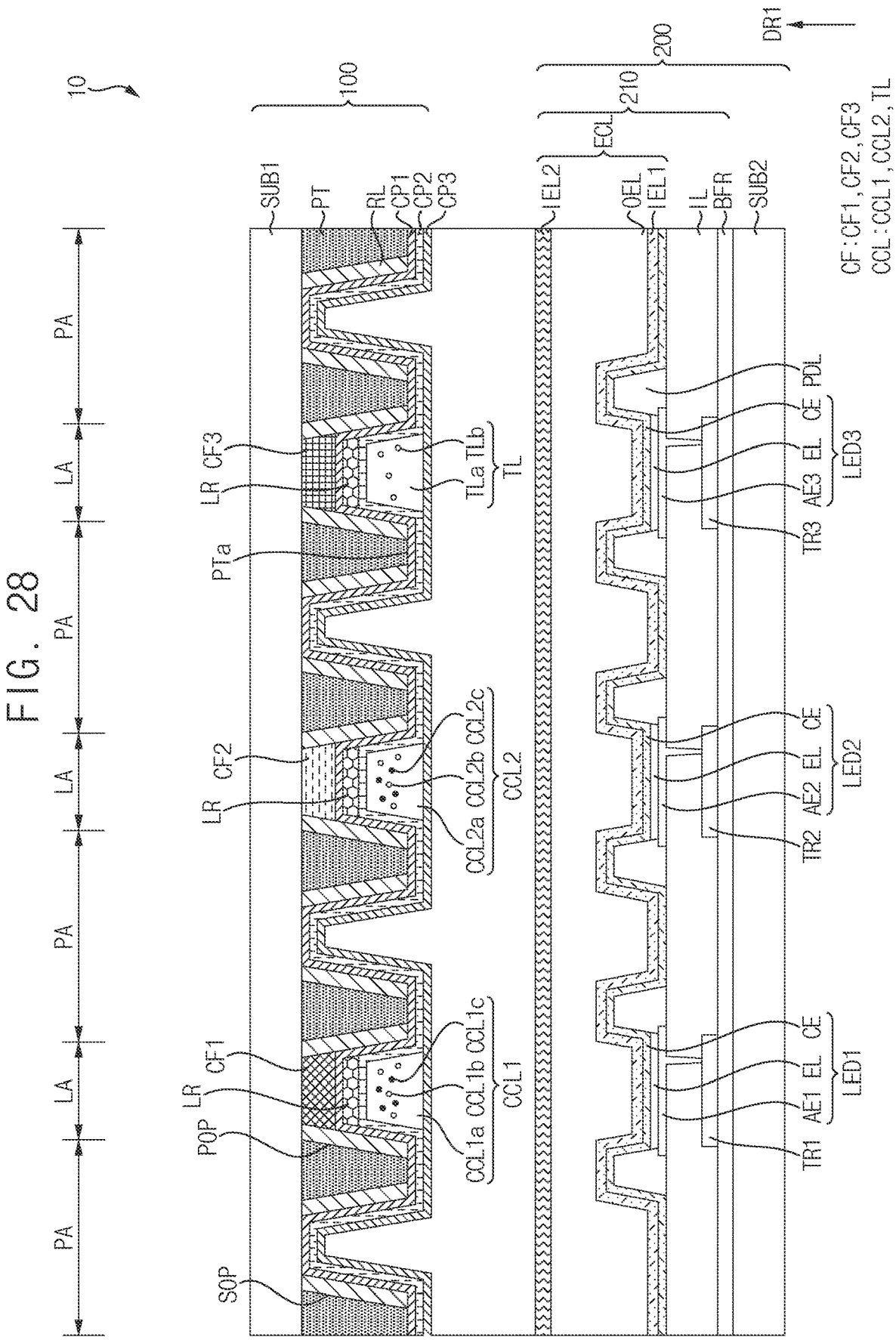
Figure 29:
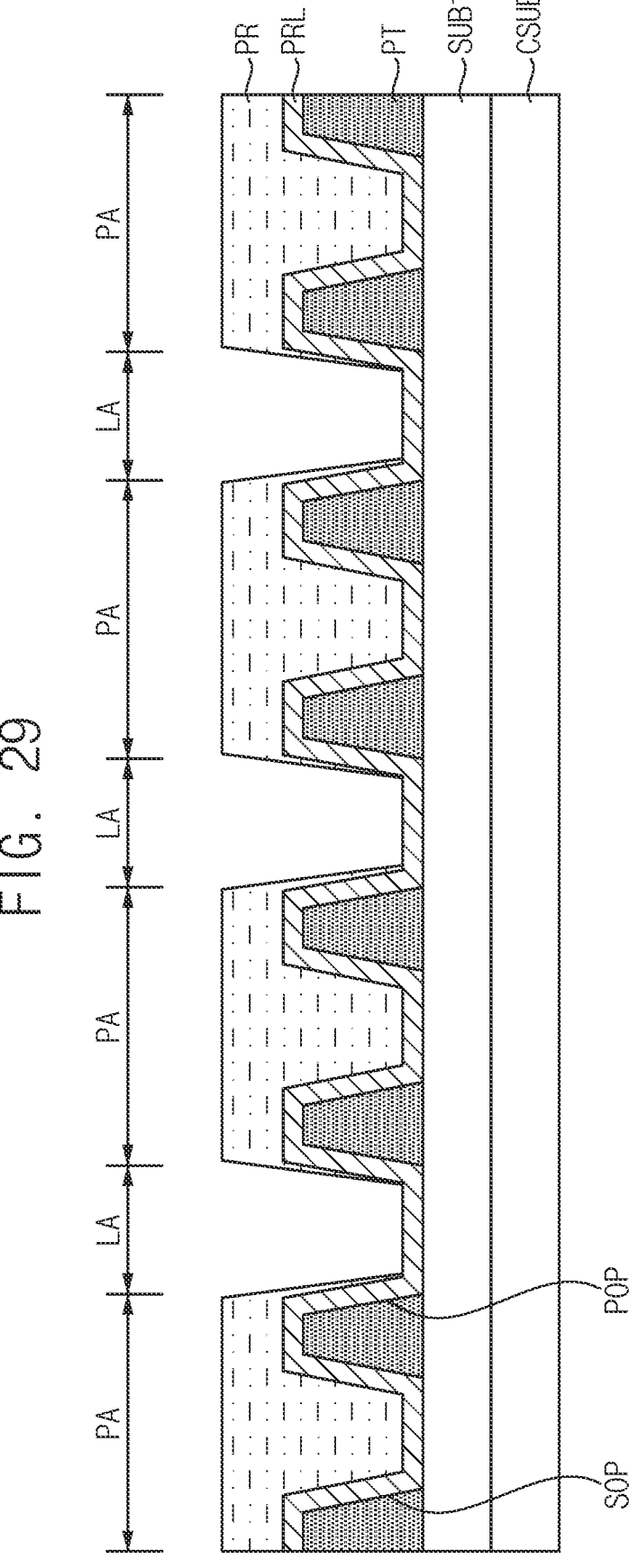
FIGS. 29-32 are cross-sectional views illustrating a method of manufacturing a color conversion substrate according to an embodiment of the present disclosure.
Figure 30:
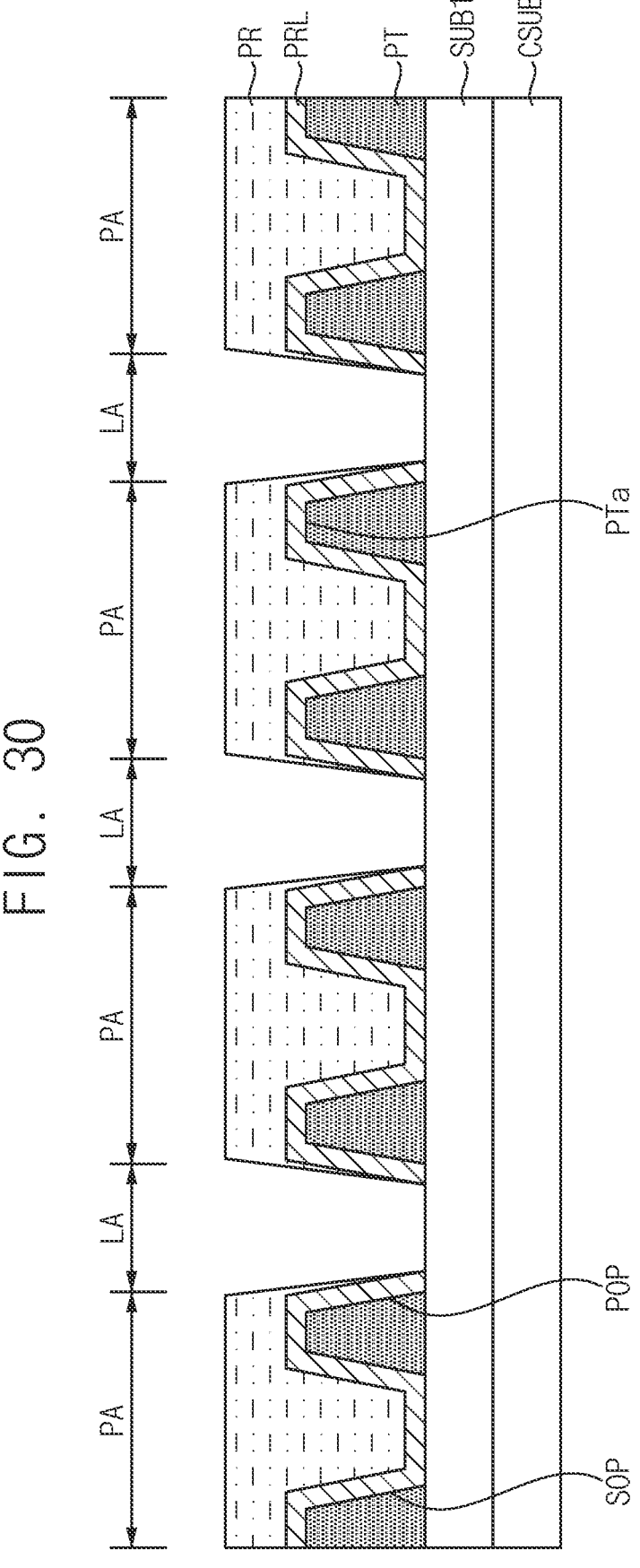
Figure 31:
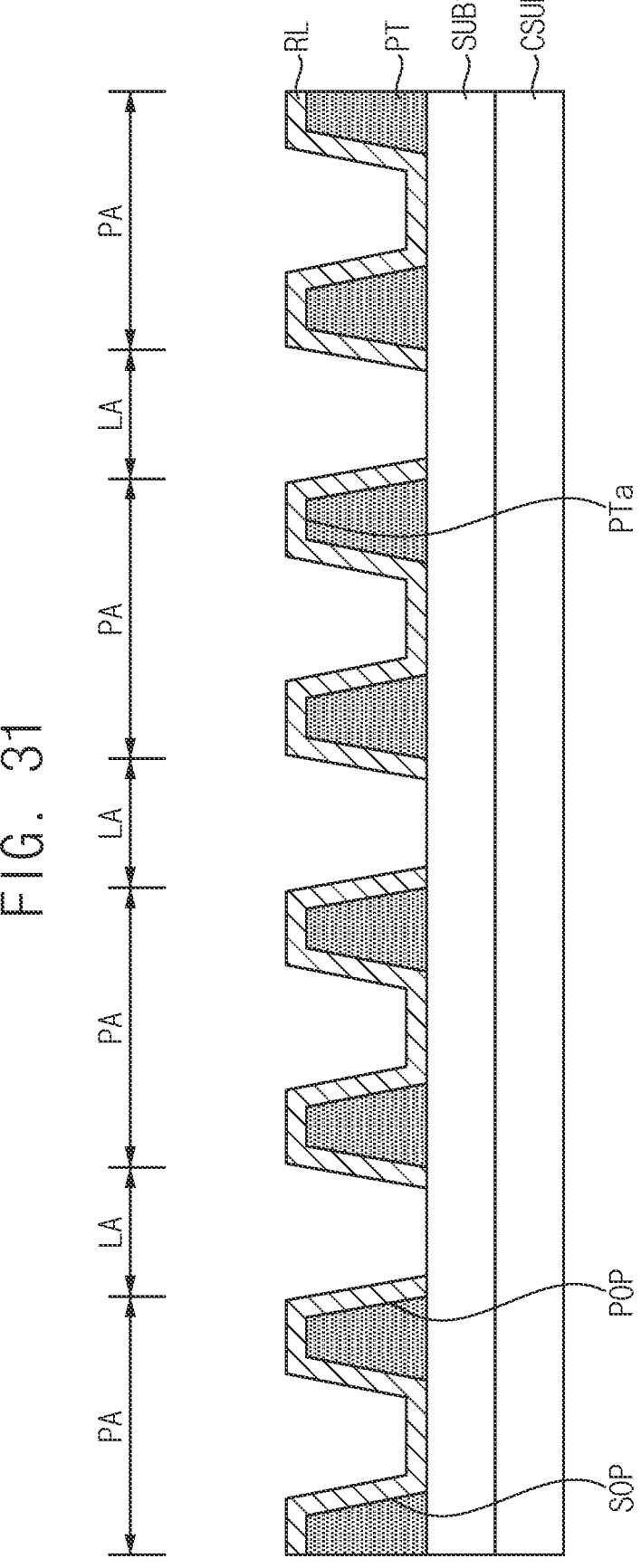
Figure 32:
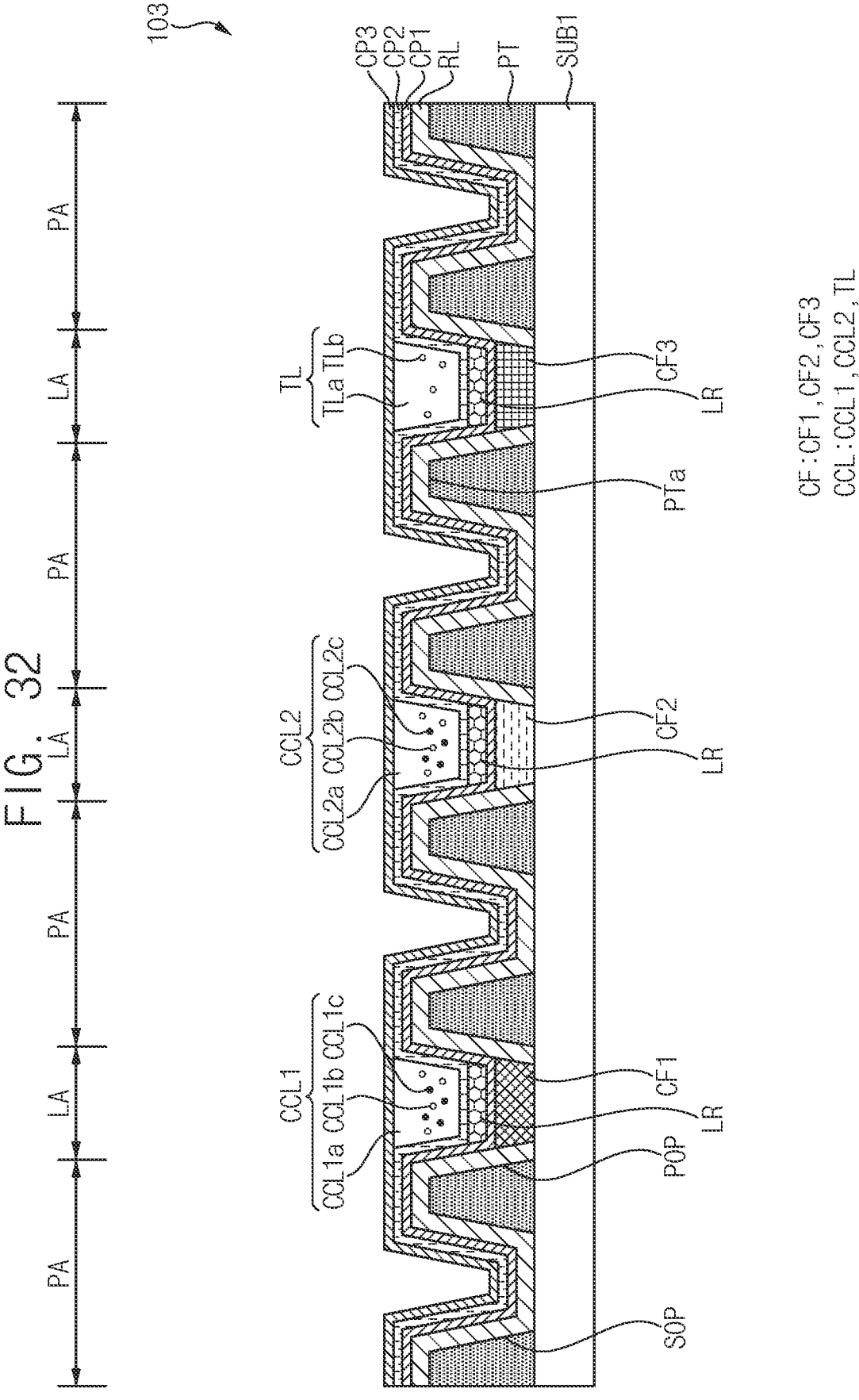

Further referring to FIGS. 27 and 28, the carrier substrate CSUB may be detached from the first base substrate SUB1. When the carrier substrate CSUB is detached from the color conversion substrate 100, a display device 10 including the color conversion substrate 100 and the array substrate 200 may be formed. When the color conversion substrate 100 is detached from the carrier substrate CSUB, which is a glass substrate, the display device 10 may be relatively flexible.

In an embodiment, as the pixel openings POP and the sub-openings SOP are formed by patterning the partition layer PT, depths of the pixel openings POP may be controlled. Accordingly, each of the pixel openings POP may have a different depth from one another. In addition, as the color filter patterns CF, the low refractive patterns LR, and the color conversion patterns CCL are formed in the pixel openings POP by an inkjet process, a material of each of the color filter patterns CF and the low refractive patterns LR may be decreased. In addition, because the low refractive patterns LR are spaced apart from each other, penetration of oxygen, moisture, and foreign substances through the low refractive patterns LR may be prevented or substantially prevented. Accordingly, reliability of the display device 10 may be improved.

FIGS. 29 through 32 are cross-sectional views illustrating a method of manufacturing a color conversion substrate according to an embodiment of the present disclosure.

For example, the method of manufacturing a color conversion substrate described hereinafter with reference to FIGS. 29 to 32 may be a method of manufacturing the color conversion substrate 103 described above with reference to FIG. 8. In addition, because the method of manufacturing the color conversion substrate described hereinafter with reference to FIGS. 29 to 32 may be different from the method of manufacturing the display device described above with reference to FIGS. 14 to 28 with respect to the manufacturing method of the reflective layer RL, redundant description thereof may not be repeated.

Referring to FIGS. 29 through 32, a preliminary reflective layer PRL may be formed on the partition layer PT. The preliminary reflective layer PRL may be formed of a metal. A photoresist pattern PR may be formed on the preliminary reflective layer PRL. The photoresist pattern PR may be formed to overlap with the peripheral area PA through an exposure process and a development process.

Thereafter, the preliminary reflective layer PRL may be patterned using the photoresist pattern PR to form the reflective layer RL. In other words, the reflective layer RL may be formed by etching the preliminary reflective layer PRL.

Accordingly, the reflective layer RL may be formed in the peripheral area PA by the photoresist pattern PR. In other words, as the photoresist pattern PR overlaps with the peripheral area PA, portions of the preliminary reflective layer PRL overlapping with the light emitting areas LA may be removed. Accordingly, the reflective layer RL may not overlap with the light emitting areas LA, and the reflective layer RL may be formed on a side surface of the partition layer PT adjacent to the pixel openings POP and the sub-openings SOP, and on an upper surface PTa of the partition layer PT.

After the reflective layer RL is etched, the photoresist pattern PR may be removed.

FIGS. 33 through 38 are cross-sectional views illustrating a method of manufacturing a color conversion substrate according to an embodiment of the present disclosure.

For example, the method of manufacturing a color conversion substrate described hereinafter with reference to FIGS. 33 to 38 may be a method of manufacturing the color conversion substrate 105 described above with reference to FIG. 10. In addition, because the method of manufacturing the color conversion substrate described hereinafter with reference to FIGS. 33 to 38 may be different from the method of manufacturing the display device described above with reference to FIGS. 14 to 28 with respect to the formation of a barrier layer BRR, redundant description thereof may not be repeated.

Referring to FIG. 33, a barrier layer BRR may be formed on the first base substrate SUB1. The barrier layer BRR may be entirely formed in the light emitting areas LA and the peripheral area PA. The barrier layer BRR may be formed of a transparent material. The barrier layer BRR may be formed of an inorganic material. For example, the barrier layer BRR may be formed of silicon oxide or indium tin oxide.

Figure 34:
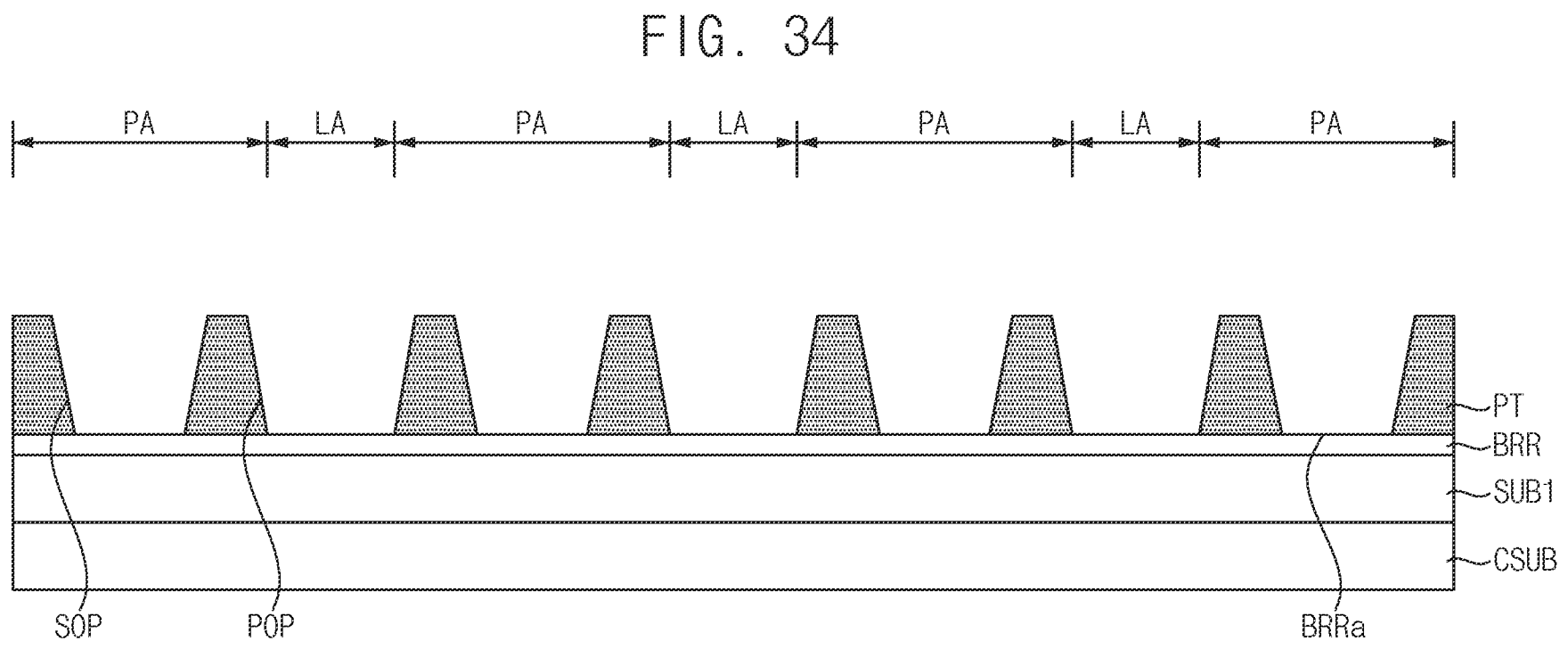

Further referring to FIG. 34, a partition layer PT may be formed on the barrier layer BRR. The partition layer PT may be formed by forming a preliminary partition layer on the barrier layer BRR, and then patterning the preliminary partition layer. The partition layer PT may include pixel openings POP and sub-openings SOP. The pixel openings POP may be formed to expose an upper surface BRRa of the barrier layer BRR.

Figure 35:
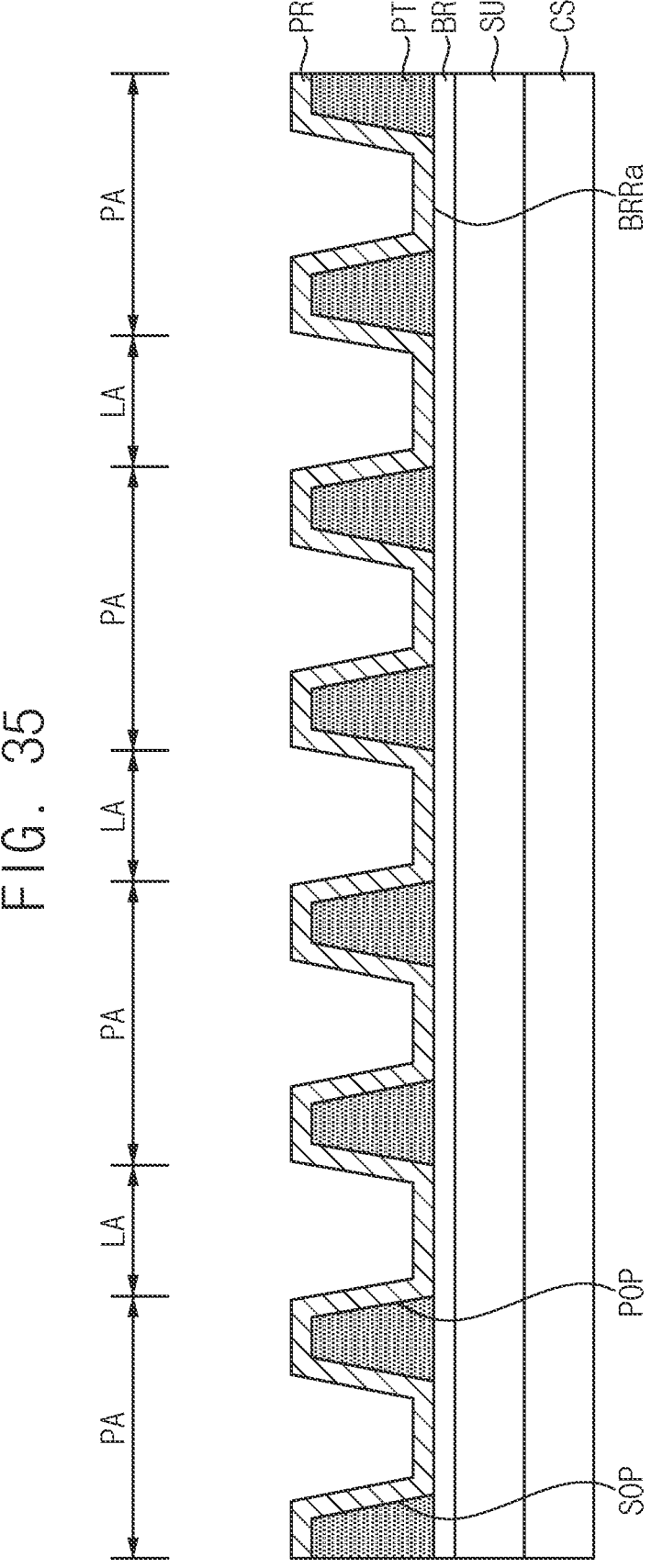
Figure 36:
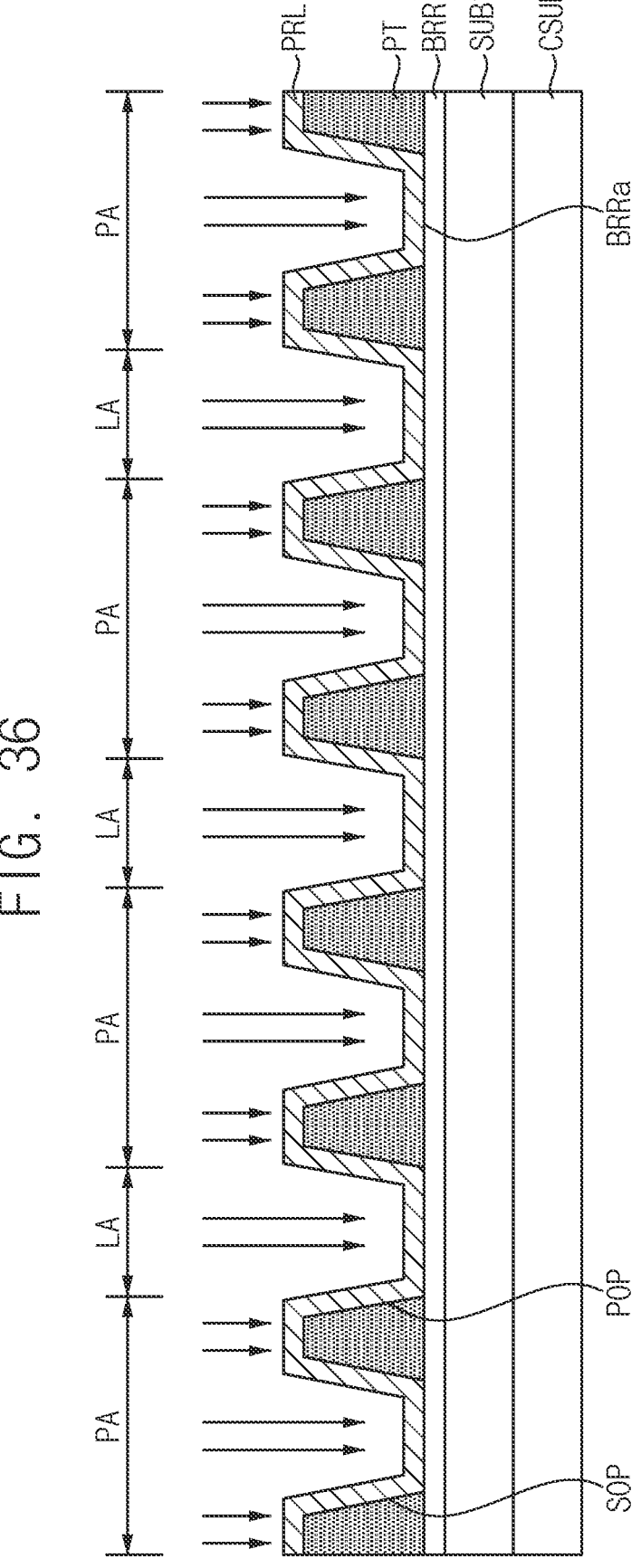
Figure 37:
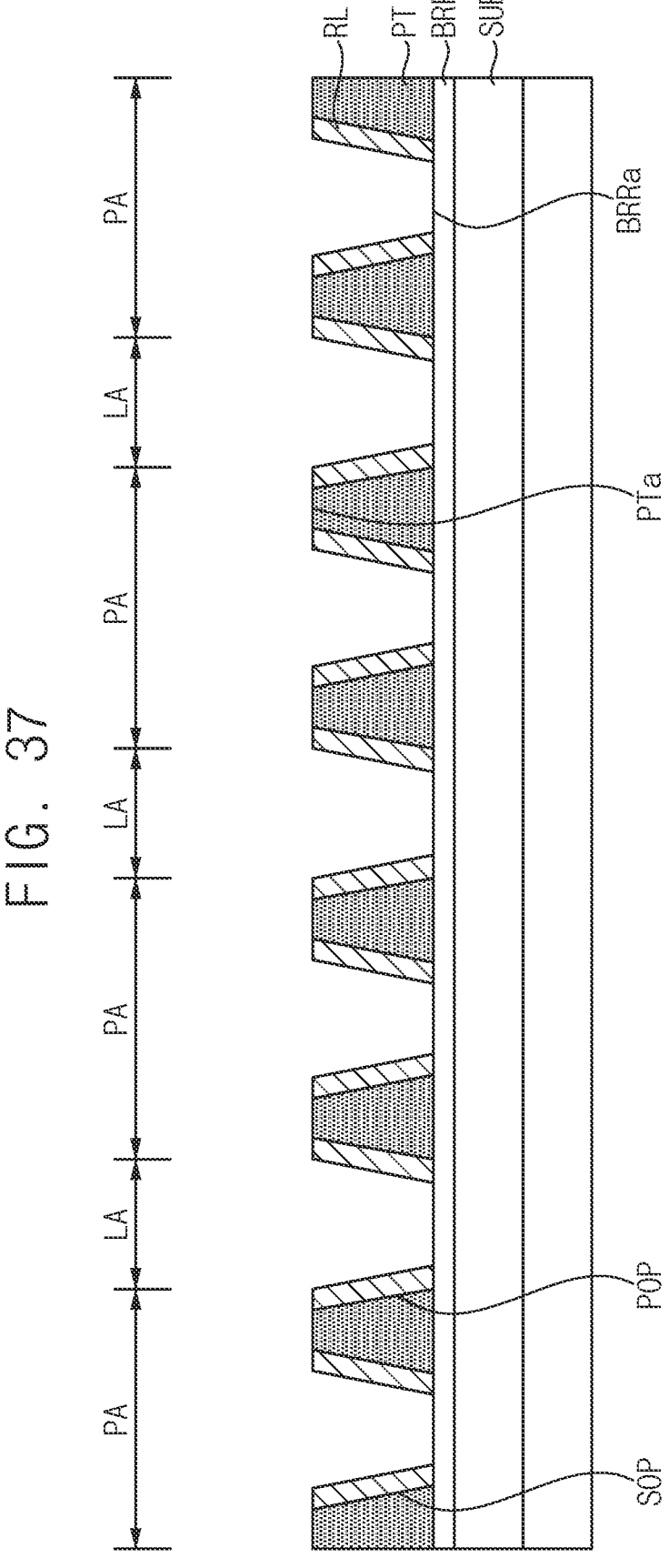

Referring further to FIGS. 35 to 37, a preliminary reflective layer PRL may be formed on the barrier layer BRR and the partition layer PT. The reflective layer RL may be formed by dry etching the preliminary reflective layer PRL. In this case, the barrier layer BRR may function as an etch stopper.

Figure 38:
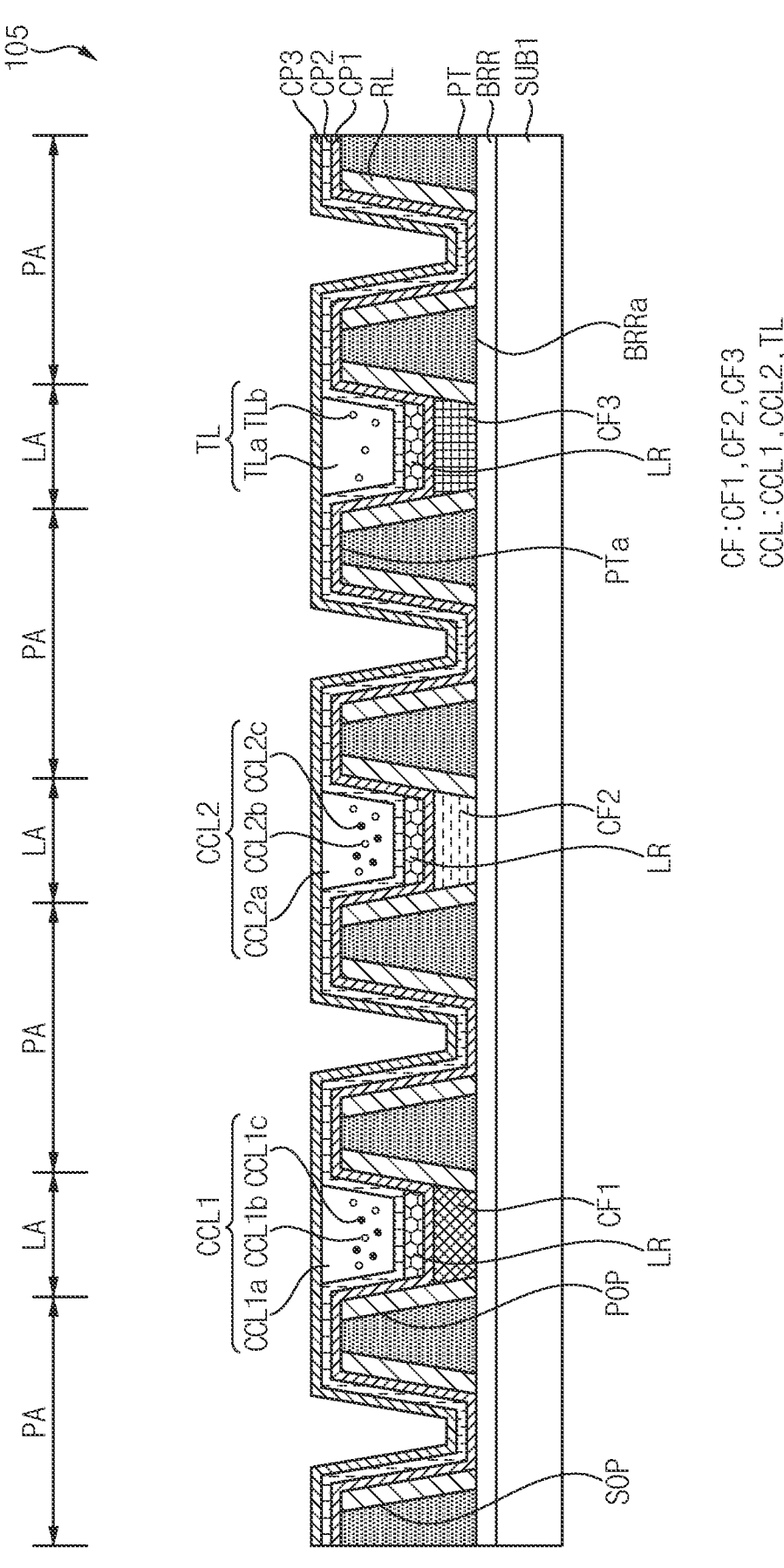

Further referring to FIG. 38, the reflective layer RL may be formed on a side surface of the partition layer PT adjacent to the pixel openings POP and the sub-openings SOP. In addition, the reflective layer RL may be formed to be spaced apart from an upper surface PTa of the partition layer PT in a plan view.

In an embodiment, by further including the barrier layer BRR, damage to the first base substrate SUB1 may be prevented or substantially prevented when forming the reflective layer RL. Accordingly, the reliability of the display device may be improved.

Figure 39:
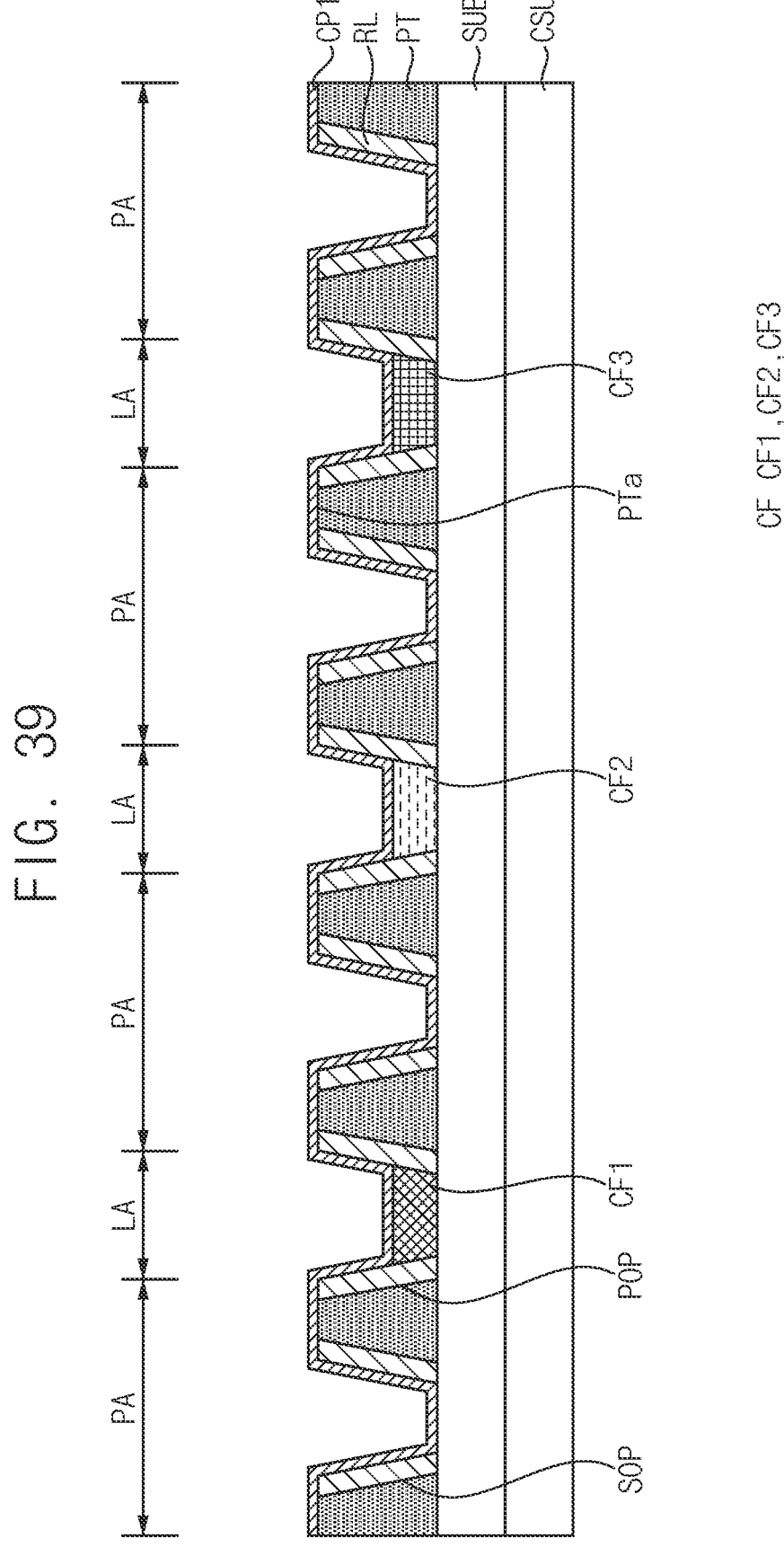
FIGS. 39-41 are cross-sectional views illustrating a method of manufacturing a color conversion substrate according to an embodiment of the present disclosure.
Figure 40:
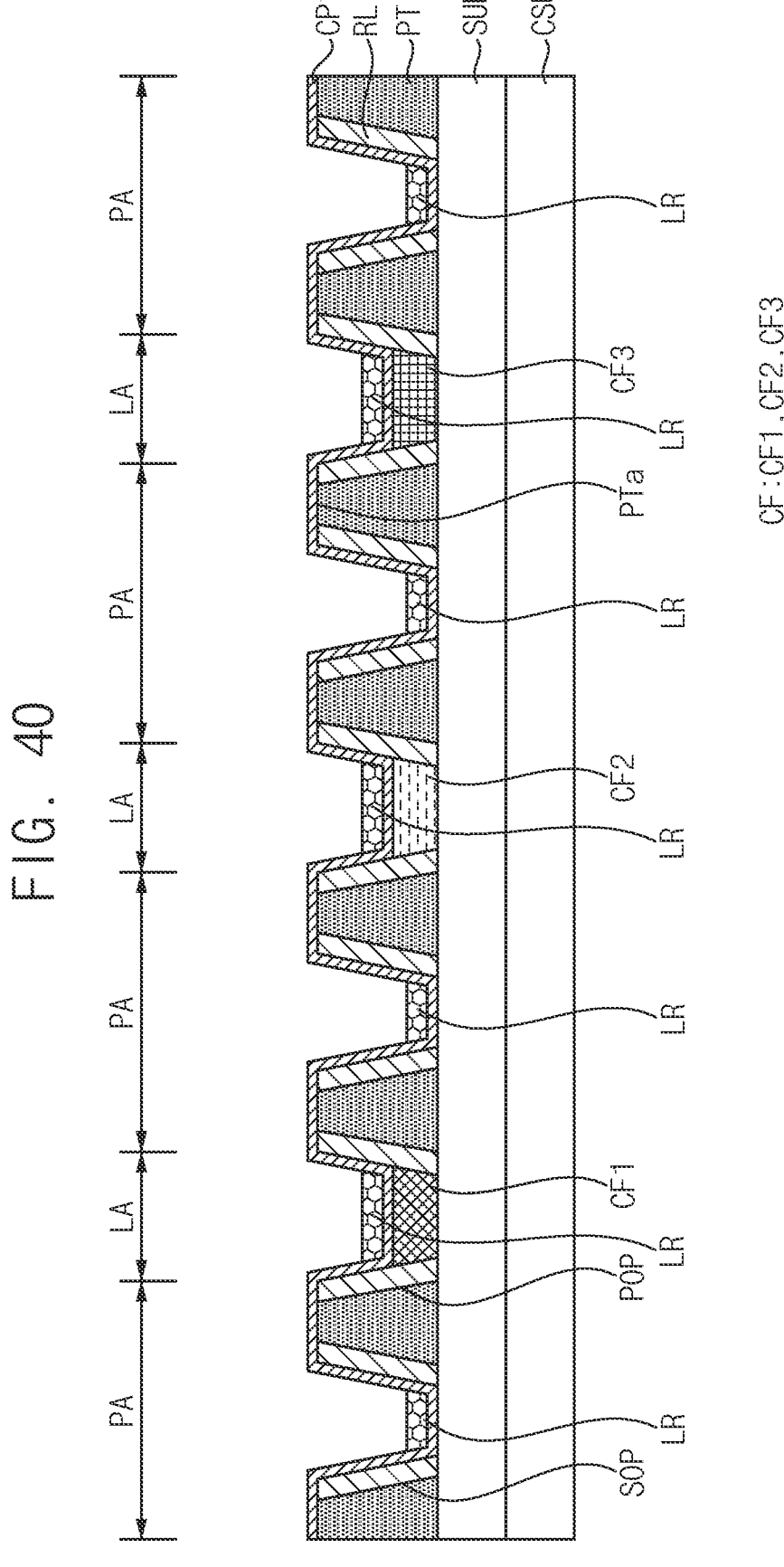
Figure 41:
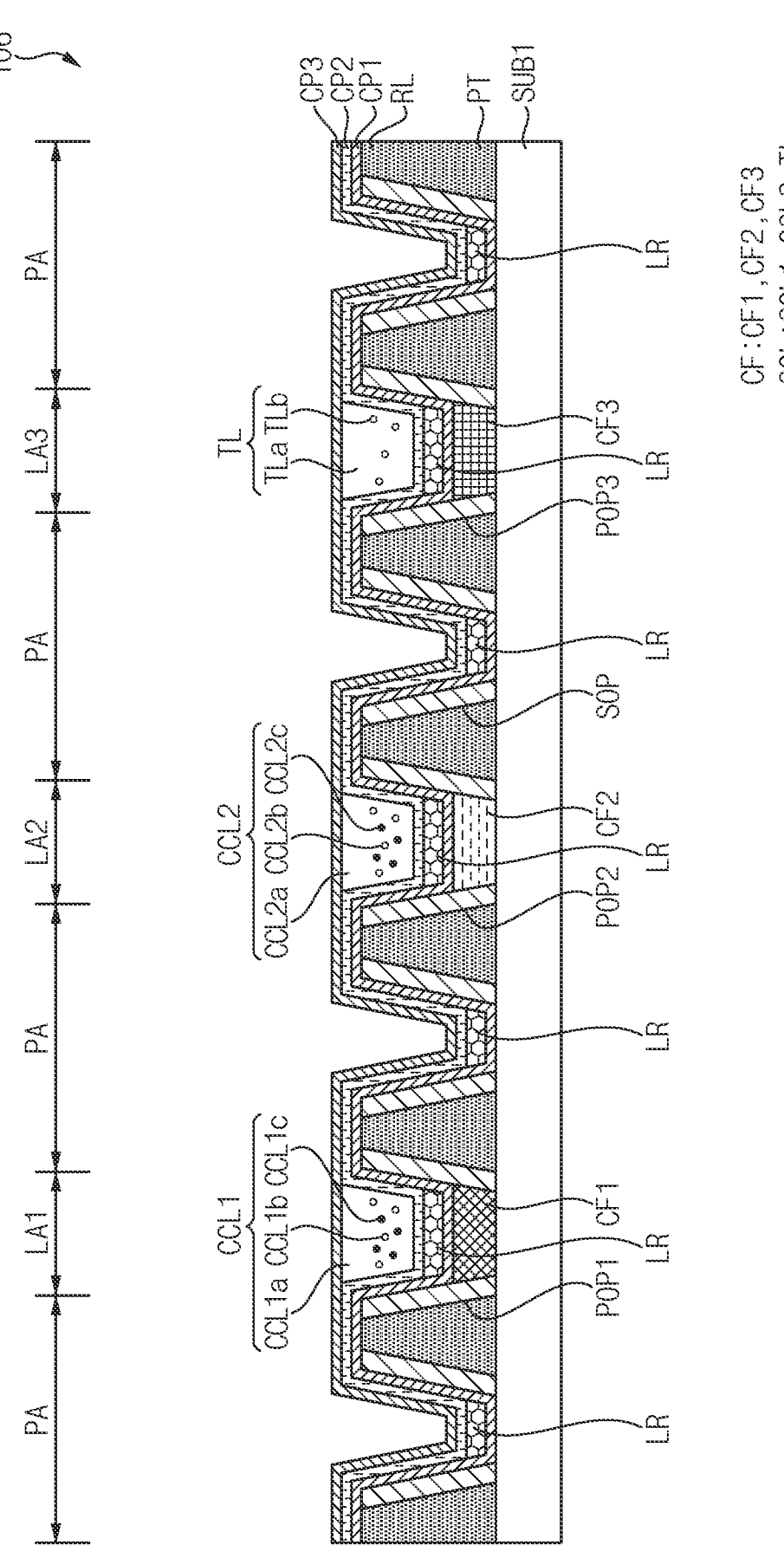

FIGS. 39 through 41 are cross-sectional views illustrating a method of manufacturing a color conversion substrate according to an embodiment of the present disclosure.

For example, the method of manufacturing a color conversion substrate described hereinafter with reference to FIGS. 39 to 41 may be a method of manufacturing the color conversion substrate 106 described above with reference to FIG. 11. In addition, the method of manufacturing the color conversion substrate described hereinafter with reference to FIGS. 39 to 41 may be different from the method of manufacturing the display device described above with reference to FIGS. 14 to 28 with respect to the method of manufacturing the low refractive patterns LR, and thus, redundant description thereof may not be repeated.

Referring to FIGS. 39 and 40, low refractive patterns LR may be formed on the first capping layer CP1.

In more detail, a preliminary low refractive index layer may be applied on the partition layer PT and the first capping layer CP1. The preliminary low refractive index layer PLR may be formed of an organic material. The preliminary low refractive index layer PLR may flow down on the partition layer PT by a leveling phenomenon. Accordingly, the preliminary low refractive index layer PLR may be formed in the pixel openings POP and the sub-openings SOP, respectively.

A portion of the preliminary low refractive index layer PLR may also be applied to the upper surface PTa of the partition layer PT. The portion of the preliminary low refractive index layer PLR overlapping with the upper surface PTa of the partition layer PT may be removed. For example, the portion of the preliminary low refractive index layer PLR remaining on the upper surface PTa of the partition layer PT may be shaved and removed.

Further referring to FIG. 41, the low refractive patterns LR may be formed in the pixel openings POP and the sub-openings SOP. Accordingly, the low refractive patterns LR may be spaced apart from each other, and each of the low refractive patterns LR may have an island shape. Accordingly, penetration of oxygen, moisture, and foreign substances through the low refractive patterns LR may be prevented or substantially prevented.

Figure 42:
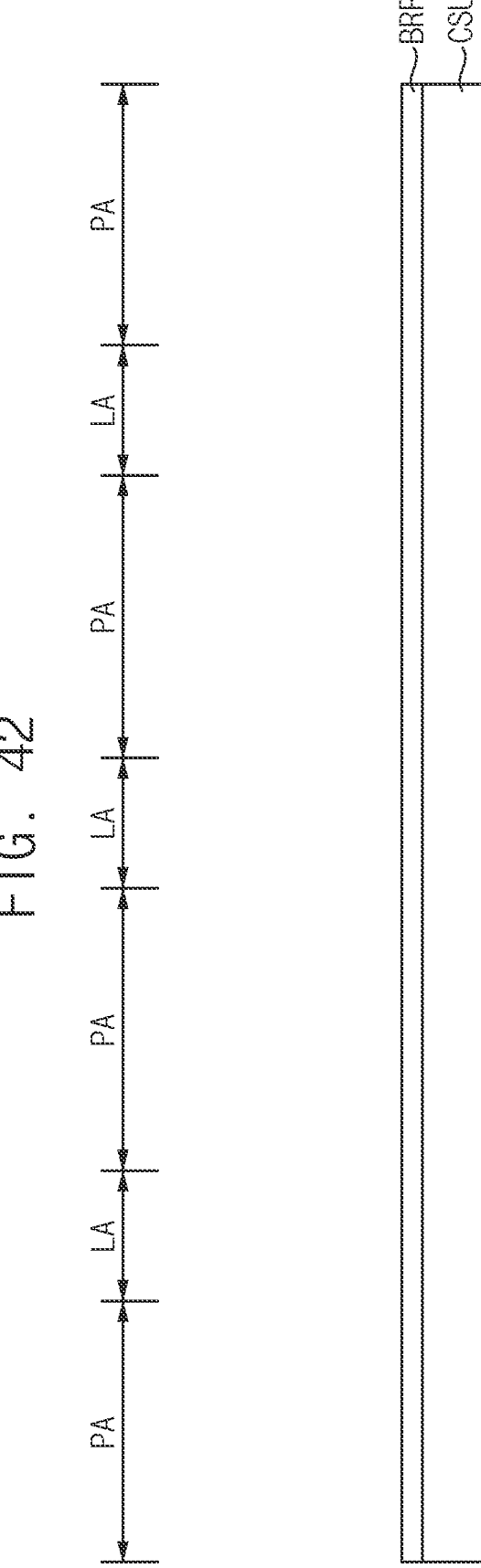
FIGS. 42-44 are cross-sectional views illustrating a method of manufacturing a color conversion substrate according to an embodiment of the present disclosure.
Figure 43:
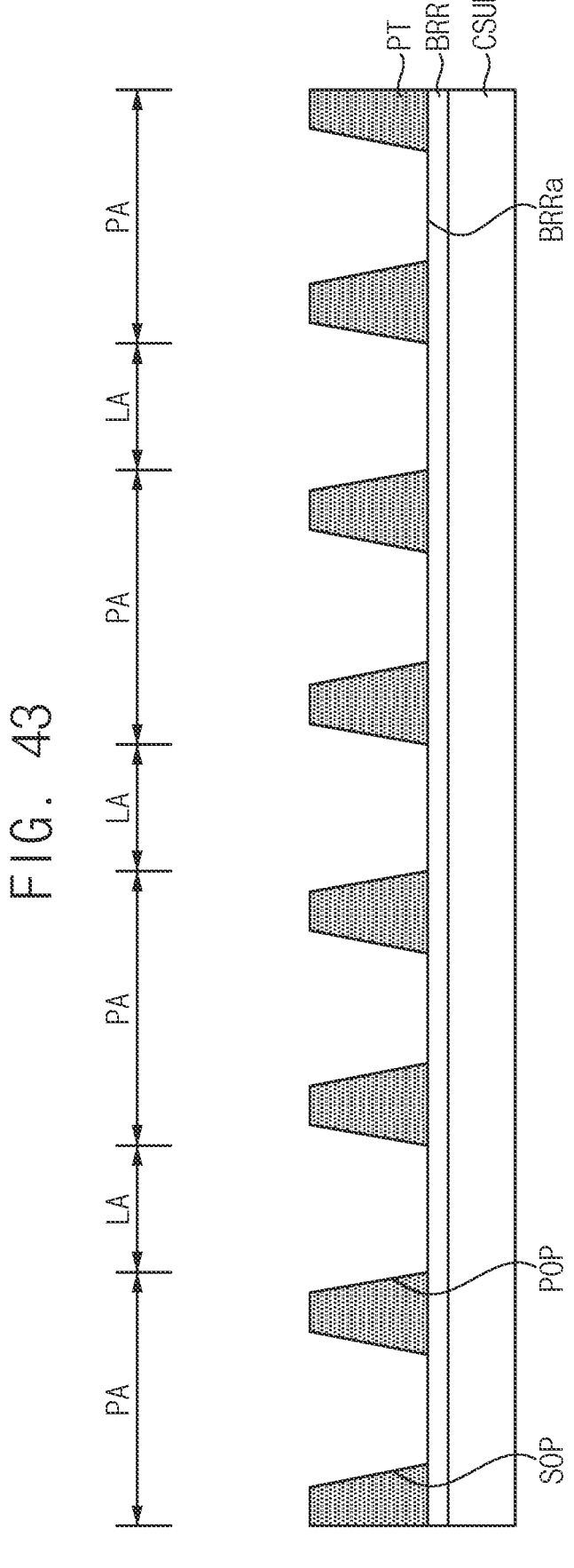
Figure 44:
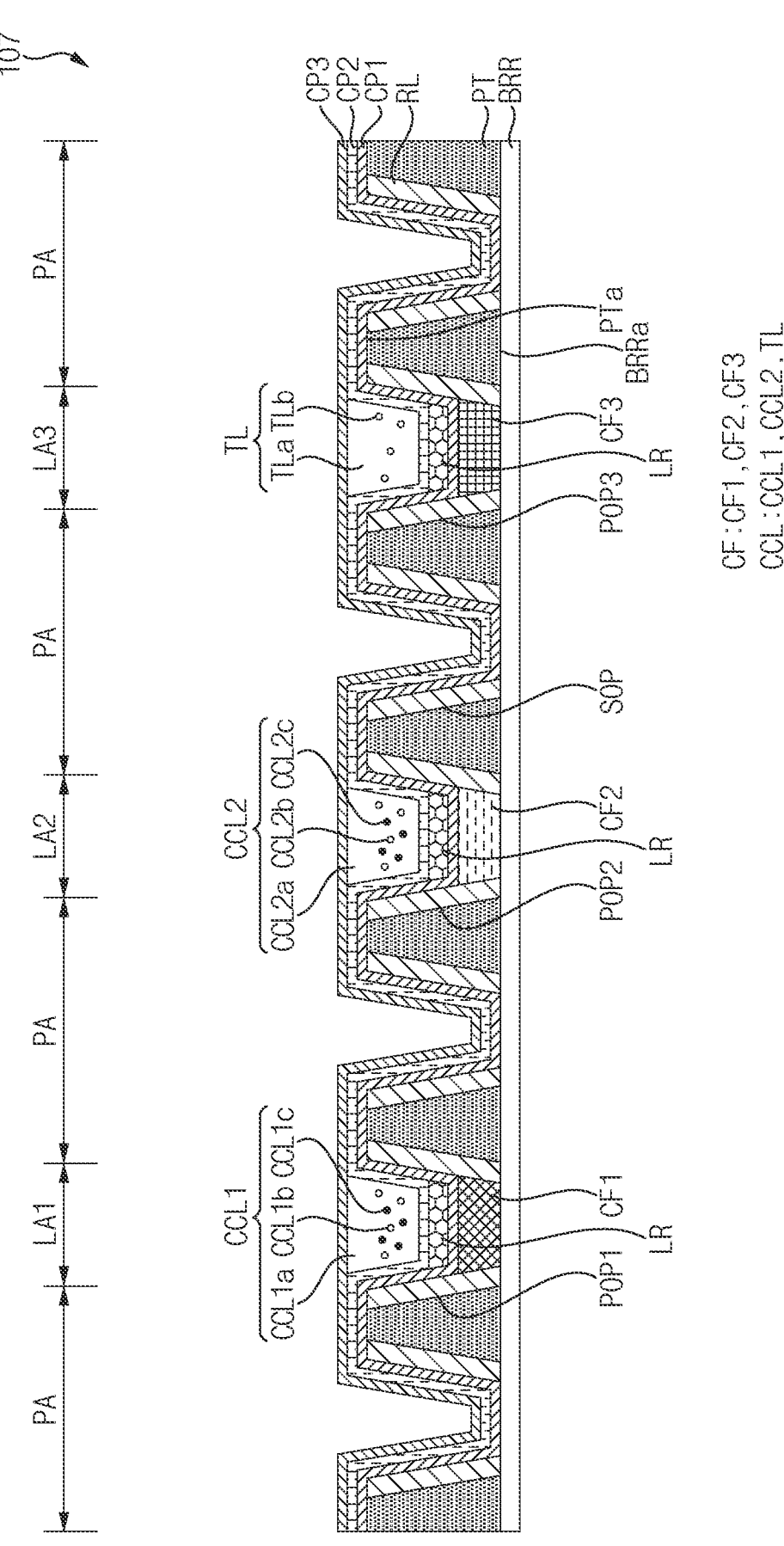

FIGS. 42 through 44 are cross-sectional views illustrating a method of manufacturing a color conversion substrate according to an embodiment of the present disclosure.

For example, the method of manufacturing a color conversion substrate described hereinafter with reference to FIGS. 42 to 44 may be a method of manufacturing the color conversion substrate 107 described above with reference to FIG. 12. In addition, the method of manufacturing the color conversion substrate described hereinafter with reference to FIGS. 42 to 44 may be different from the method of manufacturing the display device described above with reference to FIGS. 14 to 28 with respect to the formation of the barrier layer BRR and the first base substrate SUB1, and thus, redundant description thereof may not be repeated.

Referring to FIG. 42, a barrier layer BRR may be formed on the carrier substrate CSUB. The barrier layer BRR may be formed of a transparent material.

Further referring to FIG. 43, a partition layer PT may be formed on the barrier layer BRR. Pixel openings POP and sub-openings SOP may be formed in the partition layer PT. The pixel openings POP may expose the upper surface BRRa of the barrier layer BRR.

The partition layer PT may be formed of polyimide. For example, the partition layer PT may be formed of polyimide further including a light-blocking material, such as a black pigment, dye, or carbon black. When the partition layer PT further includes a black pigment, the partition layer PT may function as a light blocking member. However, the present disclosure is not limited thereto, and the partition layer PT may be formed of yellow polyimide or a transparent polyimide.

Further referring to FIG. 44, a reflective layer RL may be formed on the barrier layer BRR and the partition layer PT. The reflective layer RL may be formed on a side surface of the partition layer PT adjacent to the pixel openings POP and the sub-openings SOP. However, the present disclosure is not limited thereto, and the reflective layer RL may be formed not only on the side surface of the partition layer PT, but also on the upper surface PTa of the partition layer PT.

Color filter patterns CF, low refractive patterns LR, and color conversion patterns CCL may be formed on the barrier layer BRR in the pixel openings POP, respectively, by an inkjet process. The first capping layer CP1 may cover the color filter patterns CF, the second capping layer CP2 may cover the low refractive patterns LR, and the third capping layer CP3 may cover the color conversion patterns CCL.

In an embodiment, as the base substrate may be omitted under the barrier layer BRR, the display device may be formed regardless of a transmittance of the base substrate. Also, a manufacturing process of the display device may be simplified.

According to various embodiments of the present disclosure, the color conversion substrates and the methods of manufacturing the display devices including the color conversion substrates may be applied to a display device included in a computer, a notebook, a mobile phone, a smartphone, a smart pad, a PMP, a PDA, an MP3 player, or the like.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A color conversion substrate comprising:
a substrate comprising light emitting areas, and a peripheral area surrounding the light emitting areas;
a partition layer on the substrate, and having a plurality of pixel openings defined in the light emitting areas, respectively, and a sub-opening defined in the peripheral area and around the pixel openings;
color filter patterns in the pixel openings, respectively;
low refractive patterns in the pixel openings, and on the color filter patterns, respectively; and
color conversion patterns in the pixel openings, and on the low refractive patterns, respectively,
wherein the low refractive patterns are spaced from each other.

2. The color conversion substrate of claim 1, wherein, in a plan view, the low refractive patterns are spaced from the sub-opening.

3. The color conversion substrate of claim 1, a low refractive pattern from among the low refractive patterns is in the sub-opening.

4. The color conversion substrate of claim 1, wherein the color filter patterns are spaced from each other, and
wherein, in a plan view, the color filter patterns are spaced from the sub-opening.

5. The color conversion substrate of claim 1, wherein the pixel openings expose an upper surface of the substrate.

6. The color conversion substrate of claim 1, further comprising a reflective layer on the partition layer in the peripheral area.

7. The color conversion substrate of claim 6, wherein the reflective layer comprises a metal.

8. The color conversion substrate of claim 6, wherein the reflective layer is on a side surface of the partition layer adjacent to the pixel openings and the sub-opening, and in a plan view, the reflective layer is spaced from an upper surface of the partition layer.

9. The color conversion substrate of claim 6, wherein the reflective layer is on a side surface of the partition layer adjacent to the pixel openings and the sub-opening, and on an upper surface of the partition layer.

10. The color conversion substrate of claim 1, wherein the substrate comprises a transparent polyimide or a transparent acrylic resin.

11. The color conversion substrate of claim 1, wherein the partition layer comprises polyimide.

12. The color conversion substrate of claim 11, wherein the partition layer further comprises a black pigment.

13. The color conversion substrate of claim 1, wherein in a plan view, areas of the pixel openings are equal to each other, and depths of the pixel openings are different from each other.

14. The color conversion substrate of claim 1, wherein in a plan view, areas of the pixel openings are different from each other, and depths of the pixel openings are equal to each other.

15. The color conversion substrate of claim 1, further comprising:
a barrier layer between the substrate and the partition layer.

16. The color conversion substrate of claim 15, wherein the barrier layer comprises silicon oxide or indium tin oxide.

17. The color conversion substrate of claim 1, further comprising a capping layer on the color conversion patterns and the partition layer, and located in the light emitting areas and the peripheral area.

18. The color conversion substrate of claim 17, wherein a length from an upper surface of the substrate to an upper surface of the capping layer overlapping with the light emitting areas is less than a length from the upper surface of the substrate to the upper surface of the capping layer overlapping with an upper surface of the partition layer.

19. A color conversion substrate comprising:
a partition layer comprising:
light emitting areas;
a peripheral area surrounding the light emitting areas;
a plurality of pixel openings defined in the light emitting areas, respectively; and
a sub-opening defined in the peripheral area, and around the pixel openings;
a reflective layer on the partition layer in the peripheral area;
color filter patterns in the pixel openings, respectively;
low refractive patterns in the pixel openings on the color filter patterns, respectively; and
color conversion patterns in the pixel openings on the low refractive patterns, respectively;
wherein the low refractive patterns are spaced apart from each other.

20. The color conversion substrate of claim 19, further comprising a barrier layer under the partition layer, and comprising a transparent silicon oxide or a transparent indium tin oxide.

21. The color conversion substrate of claim 20, wherein the pixel openings expose an upper surface of the barrier layer.

22. The color conversion substrate of claim 21, wherein the partition layer comprises polyimide including a black pigment.

23. A method of manufacturing a display device, the method comprising:
forming a first substrate on a carrier substrate, the first substrate comprising light emitting areas, and a peripheral area surrounding the light emitting areas;
forming a preliminary partition layer on the first substrate;
forming a partition layer having pixel openings overlapping with the light emitting areas, respectively, and a sub-opening overlapping with the peripheral area and disposed around the pixel openings, in the preliminary partition layer;
forming color filter patterns in the pixel openings, respectively;
forming low refractive patterns in the pixel openings on the color filter patterns, respectively; and
forming color conversion patterns in the pixel openings on the low refractive patterns, respectively,
wherein the low refractive patterns are spaced apart from each other.

24. The method of claim 23, wherein the preliminary partition layer is formed of polyimide, and
wherein the partition layer is formed by exposing a portion of the preliminary partition layer, and developing the exposed portion of the preliminary partition layer.

25. The method of claim 23, wherein each of the color filter patterns is formed by an inkjet process.

26. The method of claim 23, wherein each of the low refractive patterns is formed by an inkjet process.

27. The method of claim 23, further comprising forming a reflective layer on the partition layer in the peripheral area.

28. The method of claim 27, wherein the reflective layer is formed by a dry etching process.

29. The method of claim 28, wherein the reflective layer is formed on a side surface of the partition layer adjacent to the pixel openings and the sub-opening, and in a plan view, the reflective layer is formed to be spaced from an upper surface of the partition layer.

30. The method of claim 27, wherein the forming of the reflective layer comprises:

forming a preliminary reflective layer on the partition layer;

forming a photoresist pattern on the preliminary reflective layer in the peripheral area; and patterning the preliminary reflective layer using the photoresist pattern.

31. The method of claim 30, wherein the reflective layer is formed on a side surface of the partition layer adjacent to the pixel openings and the sub-opening, and on an upper surface of the partition layer.

32. The method of claim 23, wherein the forming of the low refractive patterns comprises:

forming a preliminary low refractive layer on the partition layer; and scribing the preliminary low refractive layer overlapping with an upper surface of the partition layer overlapping with the peripheral area.

33. The method of claim 32, wherein a low refractive pattern from among the low refractive patterns is formed in the sub-opening.

34. The method of claim 23, further comprising:

forming a display element layer on a second substrate;

bonding the second substrate and the carrier substrate to each other; and detaching the carrier substrate from the first substrate.

35. The method of claim 23, further comprising forming a barrier layer on the first substrate before the forming of the preliminary partition layer.

36. The method of claim 35, wherein the pixel openings are formed to expose an upper surface of the barrier layer.

\* \* \* \* \*